United States Patent
Yamazaki et al.

(10) Patent No.: US 12,550,395 B2
(45) Date of Patent: Feb. 10, 2026

(54) METAL OXIDE, METHOD FOR FORMING METAL OXIDE, AND SEMICONDUCTOR DEVICE

(71) Applicant: Semiconductor Energy Laboratory Co., Ltd., Atsugi (JP)

(72) Inventors: Shunpei Yamazaki, Setagaya (JP); Tomonori Nakayama, Atsugi (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 732 days.

(21) Appl. No.: 17/797,189

(22) PCT Filed: Feb. 9, 2021

(86) PCT No.: PCT/IB2021/051019
§ 371 (c)(1),
(2) Date: Aug. 3, 2022

(87) PCT Pub. No.: WO2021/165783
PCT Pub. Date: Aug. 26, 2021

(65) Prior Publication Data
US 2023/0069109 A1 Mar. 2, 2023

(30) Foreign Application Priority Data
Feb. 20, 2020 (JP) ................. 2020-027415

(51) Int. Cl.
*H10D 62/40* (2025.01)
*H10B 12/00* (2023.01)
(Continued)

(52) U.S. Cl.
CPC ......... *H10D 62/405* (2025.01); *H10D 30/031* (2025.01); *H10D 30/6756* (2025.01); *H10D 30/6757* (2025.01); *H10B 12/01* (2023.02)

(58) Field of Classification Search
CPC ............ H10D 62/405; H10D 30/031; H10D 30/6756; H10D 30/6757; H10D 30/021;
(Continued)

(56) References Cited

U.S. PATENT DOCUMENTS 8,492,758 B2   7/2013   Yamazaki et al.
8,633,480 B2   1/2014   Yamazaki et al.
(Continued)

FOREIGN PATENT DOCUMENTS

CN   103229304 A   7/2013
CN   107484435 A   12/2017
(Continued)

OTHER PUBLICATIONS

International Search Report (Application No. PCT/IB2021/051019) Dated May 11, 2021.
(Continued)

*Primary Examiner* — Thanh T Nguyen
(74) *Attorney, Agent, or Firm* — Eric J. Robinson; Robinson Intellectual Property Law Office, P.C.

(57) ABSTRACT

A novel metal oxide and a formation method thereof are provided. The metal oxide includes a first crystal, a second crystal, and a region positioned between the first crystal and the second crystal. The c-axis of the first crystal is substantially parallel to the c-axis of the second crystal. The crystallinity of the region is lower than those of the first crystal and the second crystal. The width of the region in the direction perpendicular to the c-axis of the first crystal is greater than 0 nm and less than 1.5 nm. The first crystal and the second crystal each have a layered crystal structure.

18 Claims, 38 Drawing Sheets

(51) Int. Cl.
*H10D 30/01* (2025.01)
*H10D 30/67* (2025.01)

(58) Field of Classification Search
CPC .......... H10D 30/6734; H10D 30/6755; H10D 62/80; H10D 84/00; H10D 84/0126; H10D 84/038; H10D 99/00; H10B 12/01; H01L 21/02565; H01L 21/0262
See application file for complete search history.

(56) References Cited

U.S. PATENT DOCUMENTS

| | | | |
|---|---|---|---|
| 8,728,883 B2 | 5/2014 | Yamazaki et al. | |
| 8,748,215 B2 | 6/2014 | Yamazaki | |
| 9,087,700 B2 | 7/2015 | Yamazaki et al. | |
| 9,153,649 B2 | 10/2015 | Sasaki et al. | |
| 9,281,358 B2 | 3/2016 | Yamazaki et al. | |
| 9,478,603 B2 | 10/2016 | Yamazaki et al. | |
| 9,496,138 B2 | 11/2016 | Koyama et al. | |
| 9,634,082 B2 | 4/2017 | Yamazaki et al. | |
| 9,824,888 B2 | 11/2017 | Yamazaki | |
| 2011/0062436 A1 | 3/2011 | Yamazaki et al. | |
| 2012/0132903 A1* | 5/2012 | Yamazaki | H01L 21/02502 257/E29.296 |
| 2014/0097428 A1* | 4/2014 | Yamazaki | H10D 30/6755 257/43 |
| 2014/0152336 A1 | 6/2014 | Sasaki et al. | |
| 2016/0027924 A1 | 1/2016 | Sasaki et al. | |
| 2016/0268127 A1 | 9/2016 | Yamazaki | |
| 2016/0284857 A1* | 9/2016 | Yamazaki | H10D 30/6755 |

FOREIGN PATENT DOCUMENTS

| | | | |
|---|---|---|---|
| JP | 2012-134467 A | 7/2012 | |
| JP | 2013-219342 A | 10/2013 | |
| JP | 2014-131024 A | 7/2014 | |
| JP | 2016-180178 A | 10/2016 | |
| JP | 2016-189463 A | 11/2016 | |
| KR | 2013-0105390 A | 9/2013 | |
| KR | 2013-0140802 A | 12/2013 | |
| TW | 201236155 | 9/2012 | |
| TW | 201705472 | 2/2017 | |
| WO | WO-2012/073918 | 6/2012 | |
| WO | WO-2016/139556 | 9/2016 | |
| WO | WO-2016139556 A1 * | 9/2016 | ............. C23C 14/08 |
| WO | WO-2016/157016 | 10/2016 | |

OTHER PUBLICATIONS

Written Opinion (Application No. PCT/IB2021/051019) Dated May 11, 2021.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

* cited by examiner

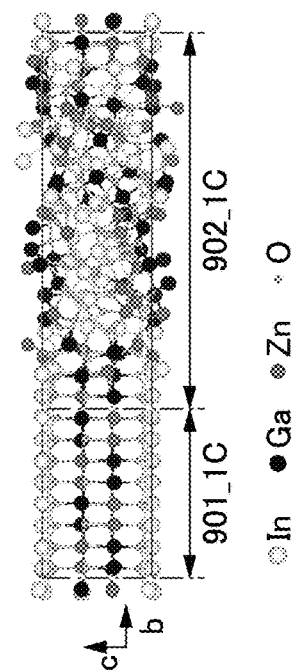
FIG. 3A
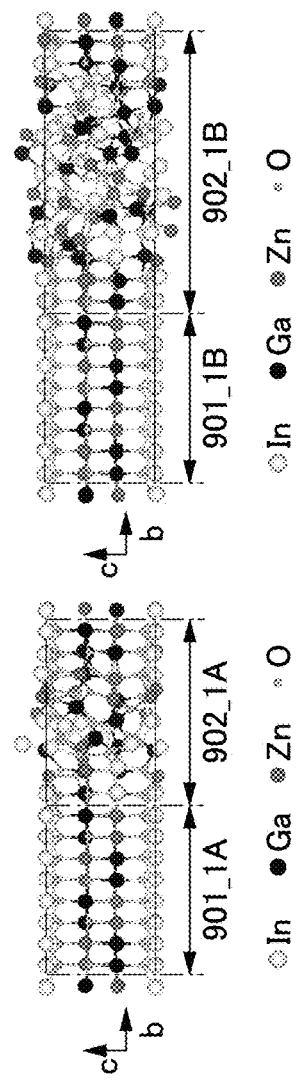
FIG. 3B
FIG. 3C
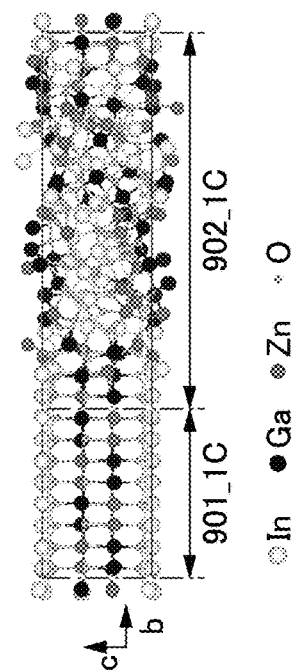
FIG. 3D
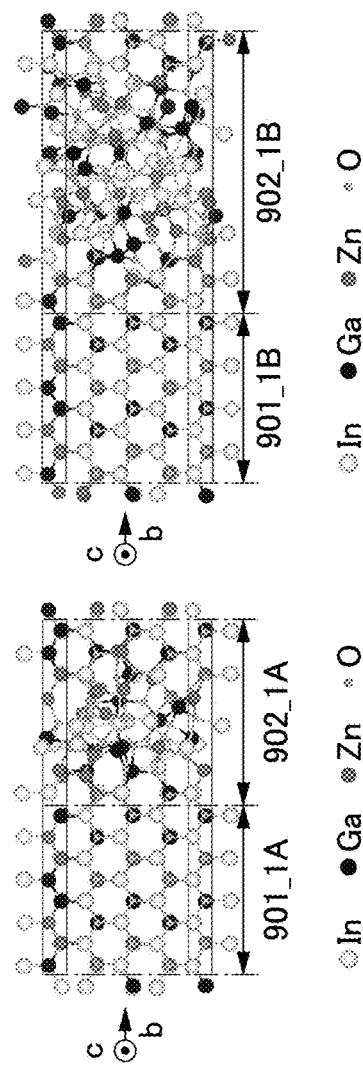
FIG. 3E
FIG. 3F FIG. 13A
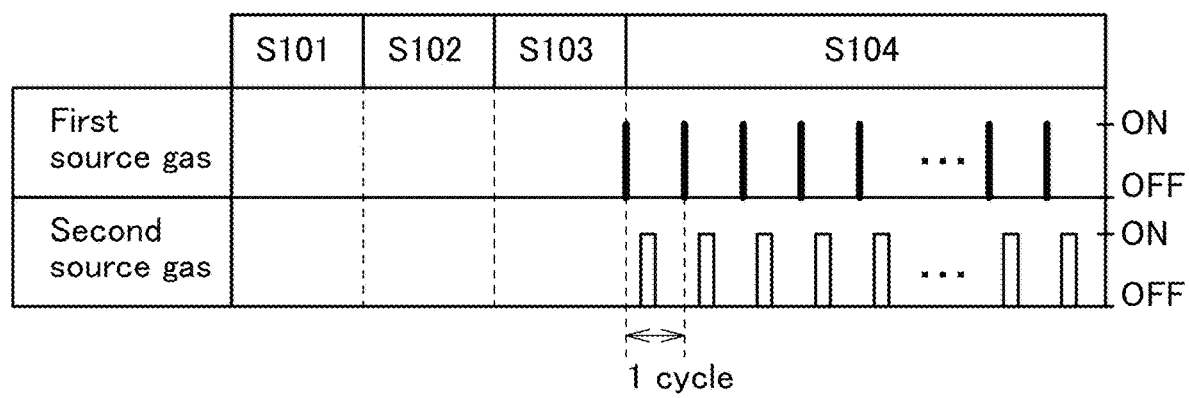
FIG. 13B
FIG. 13C
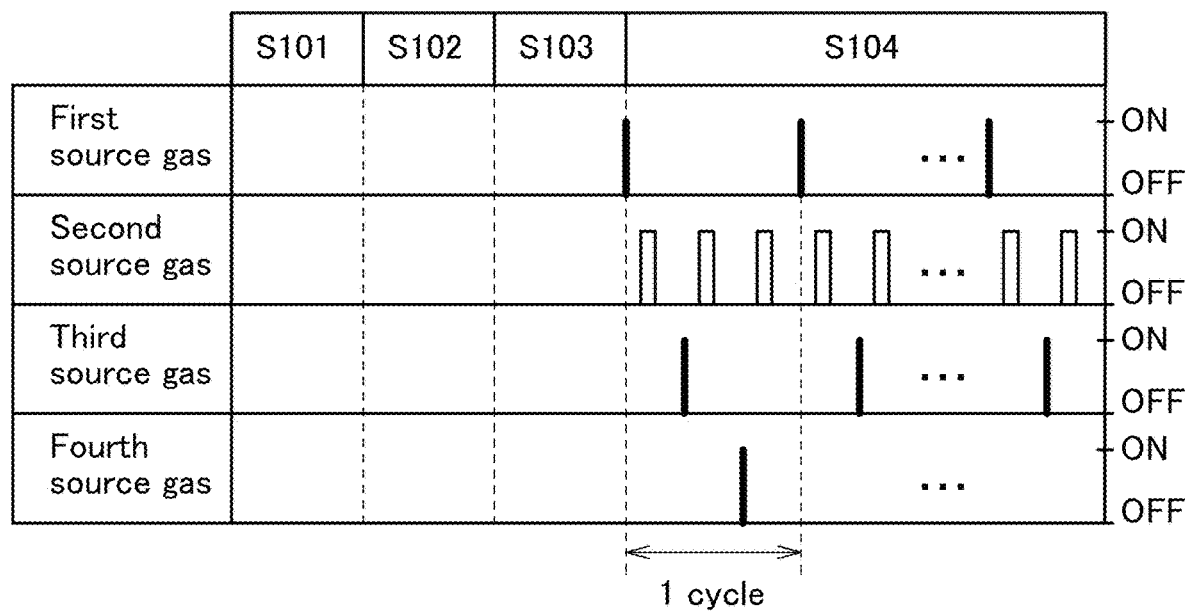

FIG. 14A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 14B
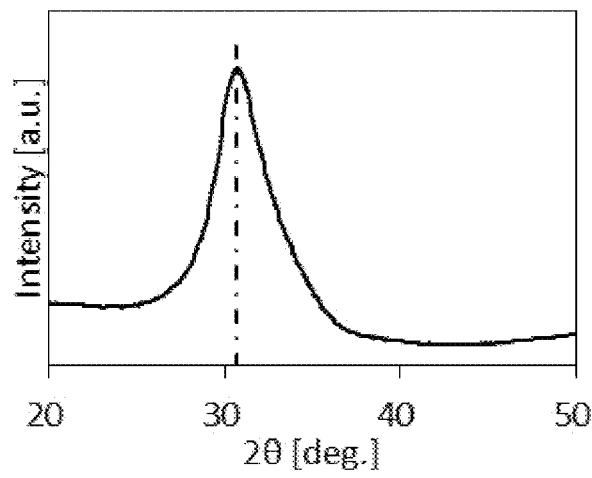
FIG. 14C
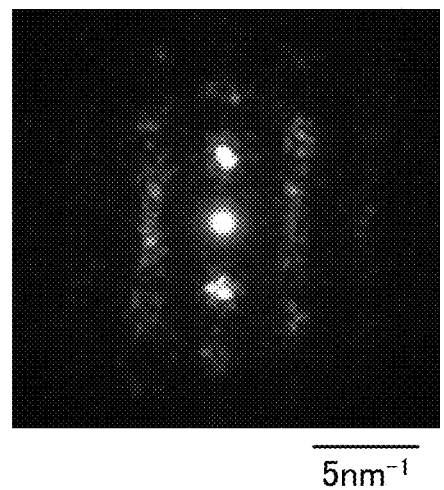

1471

1472

1473

1474

1475

1476

1477

1478

FIG. 37A
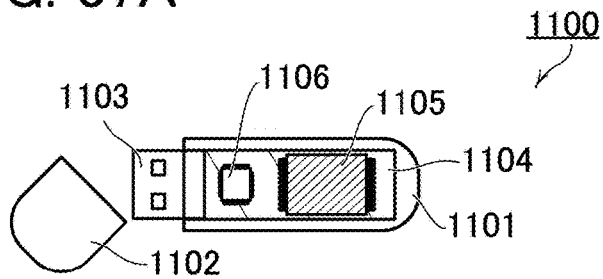
FIG. 37B  FIG. 37C
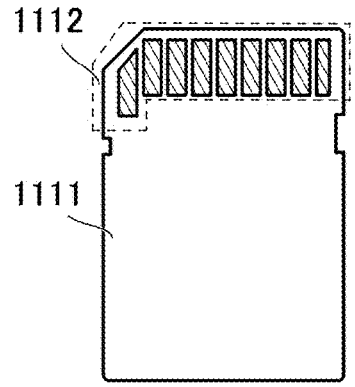 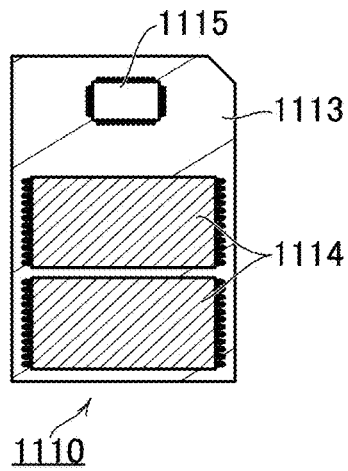
FIG. 37D  FIG. 37E
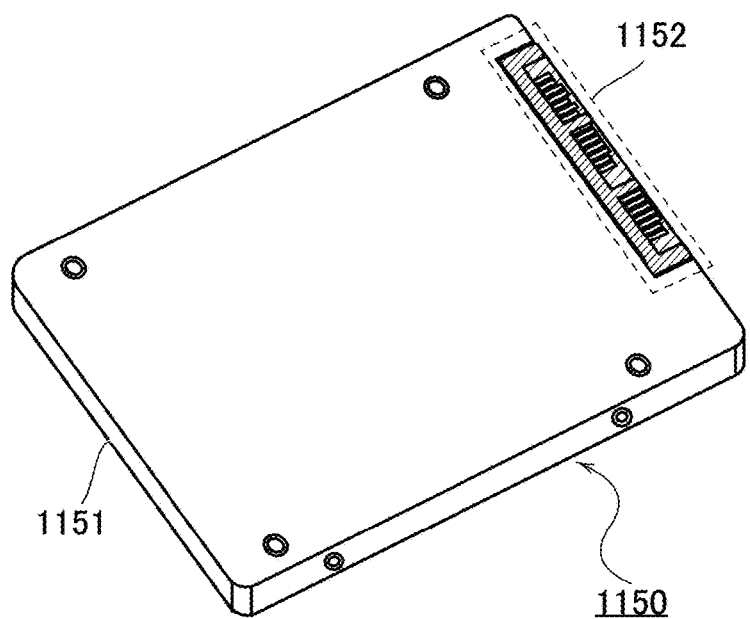 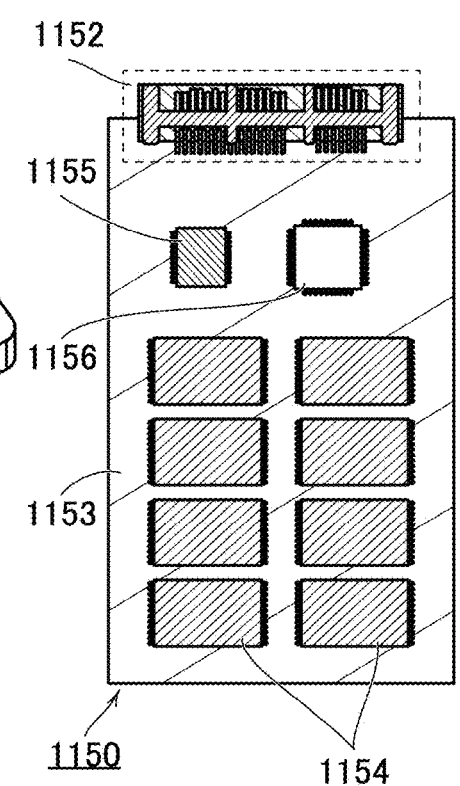

METAL OXIDE, METHOD FOR FORMING METAL OXIDE, AND SEMICONDUCTOR DEVICE

TECHNICAL FIELD

One embodiment of the present invention relates to a metal oxide, a method for forming the metal oxide, and a transistor including the metal oxide. Another embodiment of the present invention relates to a semiconductor device and a method for manufacturing the semiconductor device. One embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has attracted attention. The transistor is used in a wide range of electronic devices such as an integrated circuit (IC) or an image display device (also simply referred to as a display device). A silicon-based semiconductor material is widely known as a semiconductor thin film applicable to the transistor; in addition, an oxide semiconductor has attracted attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2). Non-Patent Document 1 and Non-Patent Document 2 disclose a technique for manufacturing a transistor using an oxide semiconductor having a CAAC structure.

REFERENCES

Non-Patent Documents

[Non-Patent Document 1] S. Yamazaki et al., "SID Symposium Digest of Technical Papers", 2012, volume 43, issue 1, p. 183-186.
[Non-Patent Document 2] S. Yamazaki et al., "Japanese Journal of Applied Physics", 2014, volume 53, Number 4S, p. 04ED18-1-04ED18-10.

SUMMARY OF THE INVENTION

Problems to be Solved by the Invention

An object of one embodiment of the present invention is to provide a novel metal oxide and a formation method thereof. Another object of one embodiment of the present invention is to provide a novel transistor and a manufacturing method thereof. Another object of one embodiment of the present invention is to provide a semiconductor device with a high on-state current. Another object of one embodiment of the present invention is to provide a semiconductor device with a high field-effect mobility. Another object of one embodiment of the present invention is to provide a highly reliable semiconductor device. Another object of one embodiment of the present invention is to provide a semiconductor device with favorable electrical characteristics. Another object of one embodiment of the present invention is to provide a semiconductor device that can be miniaturized or highly integrated.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a metal oxide including a first crystal, a second crystal, and a region positioned between the first crystal and the second crystal, in which a c-axis of the first crystal is substantially parallel to a c-axis of the second crystal, the crystallinity of the region is lower than those of the first crystal and the second crystal, and the width of the region in the direction perpendicular to the c-axis of the first crystal is greater than 0 nm and less than 1.5 nm.

One embodiment of the present invention is a metal oxide including a first crystal, a second crystal, and a region positioned between the first crystal and the second crystal, in which a c-axis of the first crystal is substantially parallel to a c-axis of the second crystal, the crystallinity of the region is lower than those of the first crystal and the second crystal, and the shortest distance between a side surface of the first crystal that faces the region and a side surface of the second crystal that faces the region is greater than 0 nm and less than 1.5 nm.

One embodiment of the present invention is a metal oxide including a first crystal, a second crystal, and a region positioned between the first crystal and the second crystal, in which a c-axis of the first crystal is substantially parallel to a c-axis of the second crystal, the crystallinity of the region is lower than those of the first crystal and the second crystal, and the size of the first crystal in the direction perpendicular to the c-axis of the first crystal is greater than the width of the region.

One embodiment of the present invention is a metal oxide including a first crystal, a second crystal, and a region positioned between the first crystal and the second crystal, in which a c-axis of the first crystal is substantially parallel to a c-axis of the second crystal, the density of the region is lower than those of the first crystal and the second crystal, and the width of the region in the direction perpendicular to the c-axis of the first crystal is greater than 0 nm and less than 1.5 nm.

One embodiment of the present invention is a metal oxide including a crystal; the metal oxide includes a first crystal, a second crystal, and a region positioned between the first crystal and the second crystal; a c-axis of the first crystal and a c-axis of the second crystal are substantially perpendicular to a top surface of a surface where the metal oxide is formed;

the c-axis of the first crystal is substantially parallel to the c-axis of the second crystal; the crystallinity of the region is lower than those of the first crystal and the second crystal; and the width of the region in the direction perpendicular to the c-axis of the first crystal is greater than 0 nm and less than 1.5 nm.

One embodiment of the present invention is a metal oxide including a crystal; the metal oxide includes a first crystal, a second crystal, and a region positioned between the first crystal and the second crystal; a c-axis of the first crystal and a c-axis of the second crystal are substantially perpendicular to a top surface of a surface where the metal oxide is formed; the c-axis of the first crystal is substantially parallel to the c-axis of the second crystal; the crystallinity of the region is lower than those of the first crystal and the second crystal; and the shortest distance between a side surface of the first crystal that faces the region and a side surface of the second crystal that faces the region is greater than 0 nm and less than 1.5 nm.

In the above metal oxide, the average of the size of the first crystal in the direction perpendicular to the c-axis of the first crystal and the size of the second crystal in the direction perpendicular to the c-axis of the second crystal is preferably greater than or equal to 5 nm and less than or equal to 10 nm.

In the above metal oxide, the first crystal and the second crystal each preferably have a layered crystal structure.

In the above metal oxide, the first crystal and the second crystal each preferably have a YbFe$_2$O$_4$ type structure, a Yb$_2$Fe$_3$O$_7$ type structure, or a variation of these structures.

Another embodiment of the present invention is a metal oxide including a crystal; in a TEM image of the metal oxide obtained in a plane perpendicular to a surface where the metal oxide is formed, a first region and a second region in each of which an image corresponding to a lattice of the crystal is observed and a third region in which the image corresponding to the lattice of the crystal is not clearly observed are observed. The third region is positioned between the first region and the second region, a layer formed by bright spots observed in the first region is substantially parallel to a layer formed by bright spots observed in the second region, the width of the third region is greater than 0 nm and less than 1.5 nm, and the average of the width of the layer formed by the bright spots observed in the first region and the width of the layer formed by the bright spots observed in the second region is greater than the width of the third region.

Another embodiment of the present invention is a metal oxide including a crystal; in a TEM image of the metal oxide obtained in a plane parallel to a surface where the metal oxide is formed, a first region and a second region in each of which bright spots arranged in a hexagonal or triangular manner are observed and a third region in which the bright spots arranged in a hexagonal or triangular manner are not clearly observed are observed. The third region is positioned between the first region and the second region, the width of the third region is greater than 0 nm and less than 1.5 nm, and the average of the width of the first region and the width of the second region is greater than the width of the third region.

The above metal oxide preferably contains indium, an element M (M is any one or more of gallium, aluminum, yttrium, and tin), and zinc.

Another embodiment of the present invention is a semiconductor device including the above metal oxide in a channel formation region.

In the above semiconductor device, a channel length is preferably greater than or equal to 2 nm and less than or equal to 30 nm.

Another embodiment of the present invention is a method for forming a metal oxide, including a step of forming a metal oxide over a substrate by an ALD method using a source gas containing a precursor containing indium, a source gas containing a precursor containing gallium, and a source gas containing a precursor containing zinc; and a step of performing heat treatment with a flow rate ratio of a nitrogen gas to an oxygen gas of 4:1 at a temperature of higher than or equal to 420° C. and lower than or equal to 480° C.

Effect of the Invention

According to one embodiment of the present invention, a novel metal oxide and a formation method thereof can be provided. According to another embodiment of the present invention, a novel transistor and a manufacturing method thereof can be provided. According to another embodiment of the present invention, a semiconductor device with a high on-state current can be provided. According to another embodiment of the present invention, a semiconductor device with a high field-effect mobility can be provided. According to another embodiment of the present invention, a highly reliable semiconductor device can be provided. According to another embodiment of the present invention, a semiconductor device with favorable electrical characteristics can be provided. According to another embodiment of the present invention, a semiconductor device that can be miniaturized or highly integrated can be provided.

Note that the description of these effects does not preclude the existence of other effects. One embodiment of the present invention does not have to have all these effects. Note that effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIG. 3A to FIG. 3F are diagrams showing calculation models.

FIG. 13A to FIG. 13C are diagrams showing a film formation method.

FIG. 14A is a diagram showing the classification of crystal structures of IGZO. FIG. 14B is a graph showing an XRD spectrum of a CAAC-IGZO film. FIG. 14C is an image showing a nanobeam electron diffraction pattern of a CAAC-IGZO film.

FIG. 37A to FIG. 37E are schematic diagrams of memory devices of one embodiment of the present invention.

MODE FOR CARRYING OUT THE INVENTION

Figure 1A:
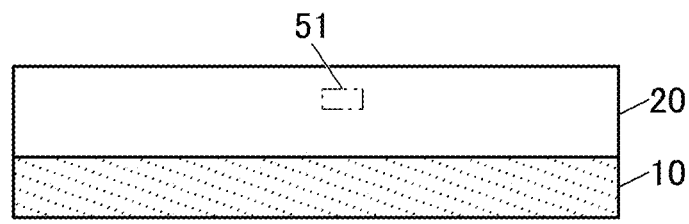
FIG. 1A is a diagram illustrating a structure body.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers that are used to specify one embodiment of the present invention in some cases.

In this specification and the like, terms for describing arrangement, such as "over" and "below", are used for convenience to describe the positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter, also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter, also referred to as an "effective channel width") is sometimes different from a channel width shown in a top view of a transistor (hereinafter, also referred to as an "apparent channel width"). For example, when a gate electrode covers a side surface of a semiconductor, an effective channel width is larger than an apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, nitrogen, and the like are given as examples. Note that water also serves as an impurity in some cases. Entry of an impurity may cause oxygen vacancies (sometimes referred to as $V_O$) in an oxide semiconductor, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

Note that in this specification and the like, a metal oxide containing nitrogen is also collectively referred to as a metal oxide in some cases. A metal oxide containing nitrogen may be referred to as a metal oxynitride.

In this specification and the like, "normally off" means that a drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

In this specification, in the case where the maximum value and the minimum value are specified, a structure in which the maximum value and the minimum value are freely combined is disclosed.

Embodiment 1

In this embodiment, a metal oxide (an oxide semiconductor) of one embodiment of the present invention and a formation method thereof will be described giving the case where the metal oxide is used in a semiconductor layer of a transistor as an example. Note that the metal oxide of one embodiment of the present invention is not limited to being used in a semiconductor layer of a transistor and may be used as an insulating material or a conductive material, depending on the kinds, combination, compositions, and the like of elements constituting the metal oxide.

A metal oxide sometimes includes a lattice defect. Examples of a lattice defect include point defects such as an atomic vacancy and an exotic atom, a line defect such as dislocation, a plane defect such as a crystal grain boundary, and a volume defect such as a void. Examples of a factor in generating a lattice defect include the deviation of the proportion of the number of atoms in constituent elements (excess or deficiency of constituent atoms) and an impurity.

In the case where a metal oxide is used in a semiconductor layer of a transistor, a lattice defect in the metal oxide may cause the generation, trapping, and the like of carriers. Thus, the use of a metal oxide with many lattice defects in a semiconductor layer of a transistor might lead to unstable electrical characteristics of the transistor. Hence, a metal oxide used in a semiconductor layer of a transistor preferably has as few lattice defects as possible.

In particular, a transistor using a metal oxide is likely to change its electrical characteristics when oxygen vacancies ($V_O$) and impurities exist in a channel formation region in the metal oxide, which might degrade the reliability. In some cases, hydrogen in the vicinity of an oxygen vacancy forms a defect that is an oxygen vacancy into which hydrogen enters (hereinafter, sometimes referred to as a $V_OH$ defect), which generates an electron serving as a carrier. Thus, when the channel formation region in the metal oxide includes oxygen vacancies, the transistor is likely to have normally-on characteristics (characteristics with which, even when no voltage is applied to the gate electrode, the channel exists and current flows through the transistor). Therefore, oxygen vacancies and impurities are preferably reduced as much as possible in the channel formation region in the metal oxide. In other words, the metal oxide preferably includes an i-type (intrinsic) or substantially i-type channel formation region with a low carrier concentration.

The kind of a lattice defect that is likely to exist in a metal oxide and the amount of lattice defects depend on the structure of a metal oxide, a method for forming a metal oxide, and the like.

The structure of a metal oxide is classified into a single crystal structure and other structures (non-single-crystal structures). Examples of a non-single-crystal structure include a CAAC structure, a polycrystalline structure, an nc structure, an amorphous-like (a-like) structure, and an amorphous structure. The a-like structure has a structure between the nc structure and the amorphous structure. Note that the classification of crystal structures will be described later.

A metal oxide having the a-like structure and a metal oxide having the amorphous structure each include a void or a low-density region. That is, the metal oxide having the a-like structure and the metal oxide having the amorphous structure have low crystallinity as compared with a metal oxide having the nc structure and a metal oxide having the CAAC structure. Moreover, the metal oxide having the a-like structure has a higher hydrogen concentration in the metal oxide than the metal oxide having the nc structure and the metal oxide having the CAAC structure. Thus, a lattice defect is easily formed in the metal oxide having the a-like structure and the metal oxide having the amorphous structure.

Thus, a metal oxide with high crystallinity is preferably used in a semiconductor layer of a transistor. For example, it is preferable to use the metal oxide having the CAAC structure or the metal oxide having the single crystal structure. The use of such a metal oxide for a transistor enables the transistor to have favorable electrical characteristics. In addition, a transistor having high reliability can be achieved.

Note that the metal oxide with high crystallinity does not include a metal oxide having the polycrystalline structure. The polycrystalline structure refers to a crystal structure in which a clear crystal grain boundary is observed. In the case where the metal oxide having the polycrystalline structure is used in a semiconductor layer of a transistor, it is highly probable that the crystal grain boundary becomes a recombination center and captures carriers, whereby the on-state current and field-effect mobility of a transistor are decreased, for example.

FIG. 1A is a diagram illustrating a structure body including a metal oxide of one embodiment of the present invention. The structure body includes a base film 10 and a metal oxide 20 formed over the base film 10.

The metal oxide 20 is a metal oxide including a plurality of crystals whose c-axes are aligned in a particular direction. Note that the particular direction refers to the thickness direction of the metal oxide 20, the normal direction of the surface where the metal oxide 20 is formed, or the normal direction of the surface of the metal oxide 20. Note that in this specification and the like, a crystal region refers to a crystal or a region including a crystal and its vicinity. Thus, a crystal is sometimes referred to as a crystal region.

Figure 1B:
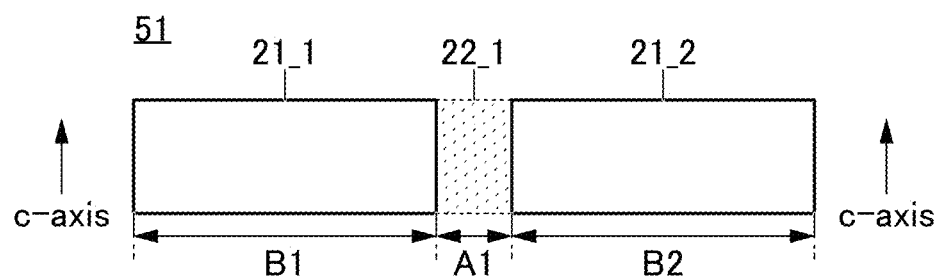
FIG. 1B and FIG. 1C are diagrams illustrating a metal oxide of one embodiment of the present invention.

Here, FIG. 1B is an enlarged view of an area 51 surrounded by a dashed-dotted line in FIG. 1A. A region indicated by the area 51 is part of the metal oxide 20. As illustrated in FIG. 1B, the metal oxide 20 includes a crystal 21_1, a crystal 21_2, and a region 22_1 positioned between the crystal 21_1 and the crystal 21_2. Note that the crystal 21_1 and the crystal 21_2 are adjacent in the direction perpendicular to the c-axis with the region 22_1 therebetween.

The c-axes of the crystal 21_1 and the crystal 21_2 are substantially perpendicular to the surface where the metal oxide 20 is formed (the top surface of the base film 10) or the top surface of the metal oxide 20. In other words, the a-b planes of the crystal 21_1 and the crystal 21_2 are substantially parallel to the surface where the metal oxide 20 is formed or the top surface of the metal oxide 20. Furthermore, the c-axis of the crystal 21_1 is substantially parallel to the c-axis of the crystal 21_2. Note that when the c-axis of a crystal is substantially perpendicular to the surface where a film including the crystal is formed or the top surface of the film, the crystal is regarded as having c-axis alignment.

The crystal 21_1 and the crystal 21_2 each preferably have a layered crystal structure. Examples of the layered crystal structure include a $YbFe_2O_4$ type structure, a $Yb_2Fe_3O_7$ type structure, and a variation of these structures. When the crystal 21_1 and the crystal 21_2 each have the layered crystal structure, the crystal 21_1 and the crystal 21_2 tend to have c-axis alignment with respect to the surface where the metal oxide 20 is formed (the top surface of the base film 10) or the top surface of the metal oxide 20.

Note that the layered crystal structure may be a structure in which layers formed by covalent bonding and/or ionic bonding are stacked with bonding such as the Van der Waals force, which is weaker than covalent bonding and/or ionic bonding. In this specification and the like, a material having such a structure is sometimes referred to as a layered material (also referred to as an atomic layer material, a two-dimensional material, or the like).

The crystal 21_1 and the crystal 21_2 are not limited to having the layered crystal structure as long as they are each a crystal that is likely to have c-axis alignment. For example, the crystal 21_1 and the crystal 21_2 may each have a wurtzite type structure or the like.

The region 22_1 is in contact with the crystal 21_1 in the direction perpendicular to the c-axis of the crystal 21_1. The region 22_1 is in contact with the crystal 21_2 in the direction perpendicular to the c-axis of the crystal 21_2.

The region 22_1 is a region having lower crystallinity than the crystal 21_1 and the crystal 21_2. For example, the region 22_1 is a region that has a short-range order but does not have a long-range order. Alternatively, the region 22_1 is a region having a lower density than the crystal 21_1 and the crystal 21_2.

Here, the width of the region 22_1 is A1. Note that A1 can be regarded as a distance between the crystal 21_1 and the crystal 21_2 (the shortest distance between the side surface of the crystal 21_1 facing the region 22_1 and the side surface of the crystal 21_2 facing the region 22_1). A1 is larger than 0 nm and preferably smaller than 2.0 nm, further preferably smaller than 1.5 nm. This can inhibit formation of defects ($V_O$, $V_OH$, and the like) in the metal oxide 20.

The density of the region 22_1 is preferably high. For example, the ratio of the density of the region 22_1 to the density of the crystal 21_1 is preferably greater than or equal to 0.87, further preferably greater than or equal to 0.92, still further preferably greater than or equal to 0.95. Increasing the density of the region 22_1 can inhibit the formation of defects in the metal oxide 20.

The sizes of the crystal 21_1 and the crystal 21_2 in the direction perpendicular to the c-axis are preferably large. The larger sizes of the crystal 21_1 and the crystal 21_2 in the direction perpendicular to the c-axis presumably result in a narrower width (A1) of the region 22_1 or a higher density of the region 22_1. Here, the size of the crystal 21_1 and the size of the crystal 21_2 in the direction perpendicular to the c-axis are B1 and B2, respectively. In addition, the average of B1 and B2 is C1. It is preferable that C1 be larger than at least A1. Specifically, C1 is larger than or equal to 3 nm and smaller than or equal to 15 nm, preferably larger than or equal to 5 nm and smaller than or equal to 10 nm.

Note that as long as C1 is larger than or equal to 3 nm and smaller than or equal to 15 nm, preferably larger than or equal to 5 nm and smaller than or equal to 10 nm, B1 and B2 are not limited thereto. For example, B1 (B2) is smaller than or equal to 5 nm or smaller than or equal to 3 nm in some cases, and is larger than or equal to 10 nm or larger than or equal to 15 nm in other cases. Each of B1 and B2 is at least larger than or equal to 1 nm.

The sizes of the crystal 21_1 and the crystal 21_2 in the c-axis direction depend on the crystal structures of the crystal 21_1 and the crystal 21_2 and thus are not particularly limited; for example, the sizes are larger than or equal to 0.7 nm.

As described above, the c-axis of the crystal 21_1 is substantially parallel to the c-axis of the crystal 21_2. Thus, when the crystal 21_1 and the crystal 21_2 are observed in a cross section of the metal oxide 20, the c-axis direction hardly changes with the region 22_1 serving as a boundary between the crystal 21_1 and the crystal 21_2. When the crystal 21_1 and the crystal 21_2 are observed from the top surface of the metal oxide 20, the a-axis (b-axis) direction seems to continuously change with the region 22_1 between the crystal 21_1 and the crystal 21_2. That is, the region 22_1 is not observed clearly as a crystal grain boundary. Hence, the region 22_1 can sometimes be referred to as a GB-like region.

Figure 1C:
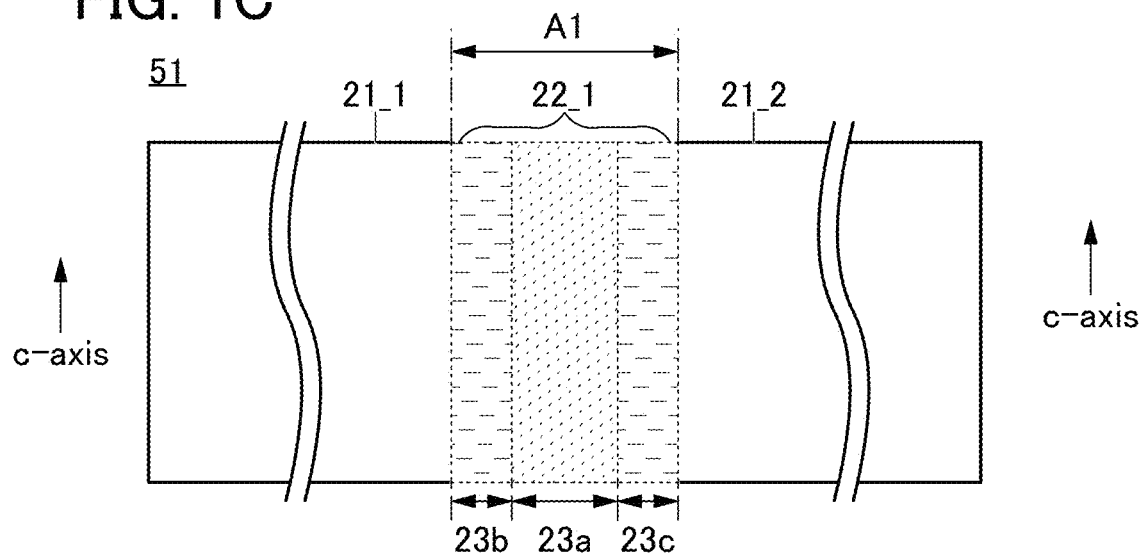

It is sometimes difficult to clearly detect the boundary between the crystal 21_1 and the region 22_1 and the boundary between the crystal 21_2 and the region 22_1. For example, as illustrated in FIG. 1C, a region 23a, a region 23b, and a region 23c may be observed between the crystal 21_1 and the crystal 21_2. The region 23a is positioned between the crystal 21_1 and the crystal 21_2, the region 23b is positioned between the crystal 21_1 and the region 23a, and the region 23c is positioned between the crystal 21_2 and the region 23a.

The crystallinity of the region 23a is different from that of the region 23b and the region 23c. For example, the region 23a has lower crystallinity than the crystal 21_1 and the crystal 21_2. Moreover, the region 23b and the region 23c have lower crystallinity than the crystal 21_1 and the crystal 21_2 and higher crystallinity than the region 23a. In the case where the region 23a, the region 23b, and the region 23c are observed between the crystal 21_1 and the crystal 21_2, the region 23a, the region 23b, and the region 23c are preferably regarded as the region 22_1. That is, the width (A1) of the region 22_1 is preferably regarded as the sum of the width of the region 23a, the width of the region 23b, and the width of the region 23c.

Although the shapes of the crystal 21_1 and the crystal 21_2 are illustrated as rectangles in FIG. 1B, the shapes are not limited thereto as long as the top surface and the bottom surface of the crystal 21_1 are substantially parallel to each other and the top surface and the bottom surface of the crystal 21_2 are substantially parallel to each other. Thus, the shapes of the crystal 21_1 and the crystal 21_2 may each be a quadrangle (a square, a parallelogram, a trapezoid, or the like) or a polygon with five or more vertices.

In the case where the width of a region having a feature similar to that of the region 22_1 is extremely small, two crystals adjacent in the direction perpendicular to the c-axis are sometimes observed to be coupled without the crystal grain boundary. In other words, it is sometimes difficult to clearly detect the boundary between the two crystals. In that case, the size of the crystal in the direction perpendicular to the c-axis may be larger than the above-described values.

Since being surrounded by the plurality of crystals, the region 22_1 is observed as a region that is not coupled with other regions each having a feature similar to that of the region 22_1 in some cases. In other cases, the region 22_1 is observed to be coupled with other regions each having a feature similar to that of the region 22_1.

In a TEM (Transmission Electron Microscopy) image of the metal oxide 20 (also referred to as a cross-sectional TEM image of the metal oxide 20) obtained in a plane perpendicular to the surface where the metal oxide 20 is formed (the top surface of the base film 10) or the top surface of the metal oxide 20, the crystal 21_1 and the crystal 21_2 are observed as images each corresponding to a crystal lattice (lattice images). Meanwhile, the region 22_1 is observed as a region where an image corresponding to a crystal lattice is not clearly observed (a region with no regularity of bright spot arrangement) or a region where bright spots are unclear.

Note that in the case where the crystal 21_1 and the crystal 21_2 each have a layered crystal structure, the crystal 21_1 and the crystal 21_2 are observed as lattice images in which bright spots are arranged in a layered manner in the cross-sectional TEM image. As described above, the c-axis of the crystal 21_1 is substantially parallel to the c-axis of the crystal 21_2. Thus, in the cross-sectional TEM image, a layer formed by the bright spots observed in the crystal 21_1 and a layer formed by the bright spots observed in the crystal 21_2 are observed to be substantially parallel to each other. The average of the width of the layer formed by the bright spots observed in the crystal 21_1 and the width of the layer formed by the bright spots observed in the crystal 21_2 corresponds to C1 described above.

Note that a cross-sectional TEM image includes information in the depth direction. That is, when a crystal and a region having a feature similar to that of the region 22_1 are adjacent to each other in the depth direction, a region including the crystal and the region is sometimes observed as a lattice image in a cross-sectional TEM image. Therefore, a region including a lattice image is sometimes referred to as a crystal region.

In a TEM image of the metal oxide 20 (also referred to as a plan-view TEM image of the metal oxide 20) obtained in a plane parallel to the surface where the metal oxide 20 is formed (the top surface of the base film 10) or the top surface of the metal oxide 20, the crystal 21_1 and the crystal 21_2 are observed as images each corresponding to a crystal lattice (lattice images). Meanwhile, the region 22_1 is observed as a region where an image corresponding to a crystal lattice is not clearly observed (a region with no regularity of bright spot arrangement) or a region where bright spots are unclear.

Note that in the case where the crystal 21_1 and the crystal 21_2 each have a layered crystal structure, the crystal 21_1 and the crystal 21_2 are observed as lattice images in which bright spots are arranged in a hexagonal or triangular manner in the plan-view TEM image. As described above, the a-axis (b-axis) direction seems to continuously change with the region 22_1 between the crystal 21_1 and the crystal 21_2. Thus, in the plan-view TEM image, the direction of the hexagons or triangles observed in the crystal 21_1 and the direction of the hexagons or triangles observed in the crystal 21_2 may be observed to be different from each other. The average of the width of the hexagons or triangles observed in the crystal 21_1 and the width of the hexagons or triangles observed in the crystal 21_2 corresponds to C1 described above.

Figure 2:
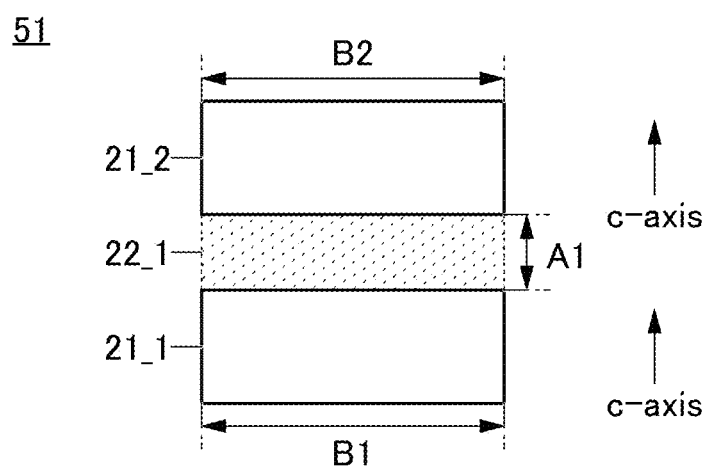
FIG. 2 is a diagram illustrating a metal oxide of one embodiment of the present invention.
Figure 4A:
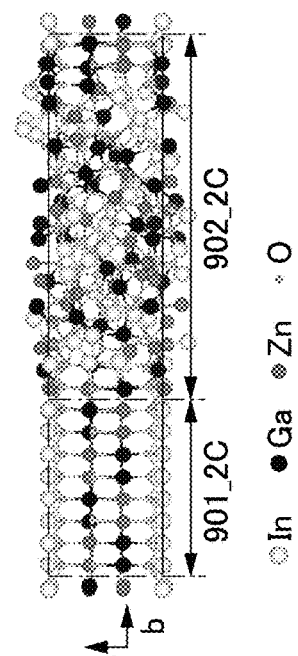
FIG. 4A to FIG. 4F are diagrams showing calculation models.
Figure 4B:
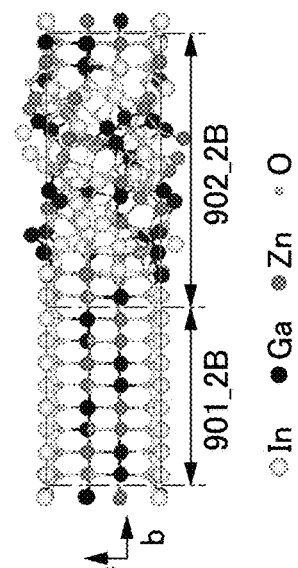
Figure 4C:
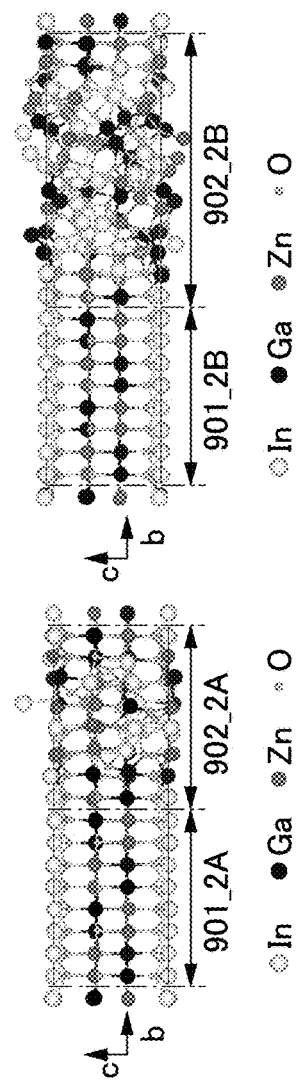
Figure 4D:
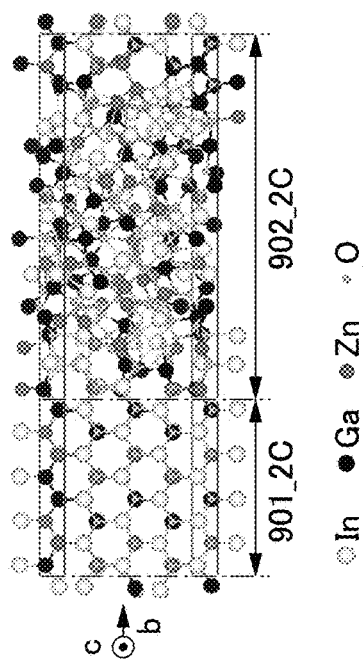
Figure 4E:
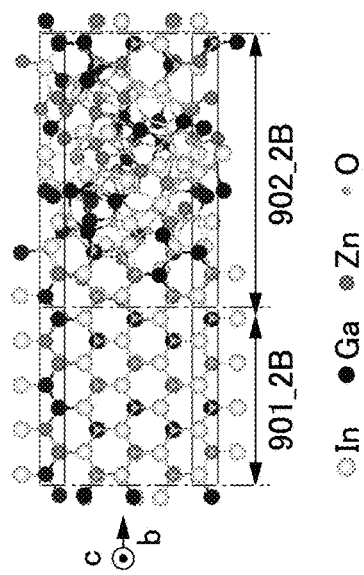
Figure 4F:
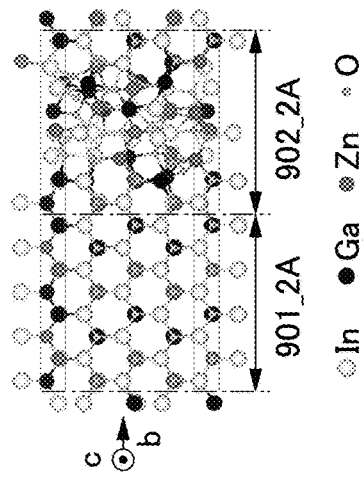

Although FIG. 1B illustrates the structure in which the crystal 21_1 and the crystal 21_2 are adjacent in the direction perpendicular to the c-axis with the region 22_1 therebetween, one embodiment of the present invention is not limited thereto. As illustrated in FIG. 2, the metal oxide 20 may have a structure in which the crystal 21_1 and the crystal 21_2 are adjacent in the c-axis direction with the region 22_1 therebetween. That is, the metal oxide 20 may have a structure in which the region 22_1 is positioned over the crystal 21_1 and the crystal 21_2 is positioned over the region 22_1.

Also in a structure illustrated in FIG. 2, the c-axes of the crystal 21_1 and the crystal 21_2 are substantially perpendicular to the surface where the metal oxide 20 is formed (the top surface of the base film 10) or the top surface of the metal oxide 20. In other words, the a-b planes of the crystal 21_1 and the crystal 21_2 are substantially parallel to the surface where the metal oxide 20 is formed or the top surface of the metal oxide 20. Furthermore, the c-axis of the crystal 21_1 is substantially parallel to the c-axis of the crystal 21_2.

In the structure illustrated in FIG. 2, the width A1 of the region 22_1 is the shortest distance between the top surface of the crystal 21_1 and the bottom surface of the crystal 21_2. A1 is larger than 0 nm and preferably smaller than 2.0 nm, further preferably smaller than 1.5 nm. This can inhibit formation of defects in the metal oxide 20.

In the case where the width of a region having a feature similar to that of the region 22_1 is extremely small in the structure illustrated in FIG. 2, two crystals adjacent in the c-axis direction are sometimes observed to be coupled without the crystal grain boundary. In other words, it is sometimes difficult to clearly detect the boundary between the two crystals. Thus, the size of the crystal in the c-axis direction is not particularly limited, and is larger than or equal to 0.7 nm, for example.

The above is the description of the structure of the metal oxide 20.

The metal oxide 20 preferably contains at least indium or zinc. In particular, indium and zinc are preferably contained. In addition, aluminum, gallium, yttrium, tin, or the like is preferably contained. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

<Ease of Defect Formation in Metal Oxide>

In this section, ease of defect formation in a metal oxide is described with results of first-principles calculations. Specifically, formation energy of an oxygen vacancy (hereinafter, sometimes referred to as $V_O$) and formation energy of a defect in which hydrogen enters an oxygen vacancy (hereinafter, sometimes referred to as $V_OH$) are calculated by first-principles calculations to evaluate the ease of defect formation in a metal oxide.

Here, formation energy of each defect ($V_O$ and $V_OH$) is described. In this specification, formation energy of a defect is calculated using the following formula. A defect whose formation energy is lower can be regarded as being formed more easily.

$$\Delta E(V_O)=E(V_O)-\{E(\text{no defect})-\mu_O\}$$

$$\Delta E(V_OH)=E(V_OH)-\{E(\text{no defect})-\mu_O+\mu_H\} \quad \text{[Formula 1]}$$

Here, $\Delta E(V_O)$ represents formation energy of $V_O$, and $\Delta E(V_OH)$ represents formation energy of $V_OH$. $E(V_O)$ represents the total energy of a calculation model including one $V_O$, and $E(V_OH)$ represents the total energy of a calculation model including one $V_OH$. $E(\text{no defect})$ represents the total energy of a calculation model without a defect. $\mu_O$ represents a chemical potential of an oxygen atom, and $\mu_H$ represents a chemical potential of a hydrogen atom.

The chemical potential $\mu_O$ of an oxygen atom and the chemical potential pH of a hydrogen atom are calculated using the following formula.

$$\mu_O=E(O_2)/2$$

$$\mu_H=E(H_2O)/2-E(O_2)/4 \quad \text{[Formula 2]}$$

Here, $E(O_2)$ is the total energy of an oxygen molecule ($O_2$) and $E(H_2O)$ is the total energy of a water molecule ($H_2O$).

The above is the description of the formation energy of a defect.

[Creating Method of Calculation Model]

In order to calculate formation energy of each defect ($V_O$ and $V_OH$), a calculation model 1A to a calculation model 1C and a calculation model 2A to a calculation model 2C are prepared. A method for creating the calculation model 1A to the calculation model 1C and the calculation model 2A to the calculation model 2C will be described below.

First, a crystal of an In—Ga—Zn oxide with a composition of In:Ga:Zn:O=1:1:1:4 [atomic ratio] is prepared. The crystal has a $YbFe_2O_4$ type structure. The density of the crystal is 6.2 g/cm$^3$.

Next, part of the crystal is cut out. Note that the number of atoms included in the cut crystal differs between the calculation models. Specifically, the number of atoms is 224 in the calculation model 1A and the calculation model 2A, 288 in the calculation model 1B and the calculation model 2B, and 336 in the calculation model 1C and the calculation model 2C. Note that three-dimensional periodic boundary conditions are applied to the calculation model 1A to the calculation model 1C and the calculation model 2A to the calculation model 2C.

Here, each of the calculation model 1A to the calculation model 1C and the calculation model 2A to the calculation model 2C is divided into a region 901 and a region 902. Specifically, the calculation model 1A is divided into a region 901_1A and a region 902_1A. The calculation model 1B is divided into a region 901_1B and a region 902_1B. The calculation model 1C is divided into a region 901_1C and a region 902_1C. The calculation model 2A is divided into a region 901_2A and a region 902_2A. The calculation model 2B is divided into a region 901_2B and a region 902_2B. The calculation model 2C is divided into a region 901_2C and a region 902_2C. Note that the region 901 described below may refer to some or all of the region 901_1A to the region 901_1C and the region 901_2A to the region 901_2C. In addition, the region 902 described below may refer to some or all of the region 902_1A to the region 902_1C and the region 902_2A to the region 902_2C.

The number of atoms included in each of the region 901_1A to the region 901_1C and the region 901_2A to the region 901_2C is 112. The number of atoms included in each of the region 902_1A and the region 902_2A is 112. The number of atoms included in each of the region 902_1B and the region 902_2B is 168. The number of atoms included in each of the region 902_1C and the region 902_2C is 224.

Next, the lattice constants of the calculation model 1A to the calculation model 1C are changed such that the density of each of the region 902_1A to the region 902_1C is 5.6 g/cm$^3$. In addition, the lattice constants of the calculation model 2A to the calculation model 2C are changed such that the density of each of the region 902_2A to the region 902_2C is 6.0 g/cm$^3$. Specifically, the regions 902 in the calculation models are extended in the b-axis direction. More specifically, the regions 902 in the calculation models are extended to have width values shown in Table 1.

TABLE 1

| Calculation model | Region 902 | | |
|---|---|---|---|
| | Number of atoms | Density [g/cm$^3$] | Width [nm] |
| 1A | 112 | 5.6 | 1.5 |
| 1B | 168 | 5.6 | 2.2 |
| 1C | 224 | 5.6 | 3.0 |
| 2A | 112 | 6.0 | 1.4 |
| 2B | 168 | 6.0 | 2.1 |
| 2C | 224 | 6.0 | 2.8 |

Note that when each of the regions 902 is extended in the b-axis direction, the coordinates of atoms included in the region 901 are fixed. By contrast, the coordinates of atoms included in the region 902 are changed in accordance with extension of the region 902 in the b-axis direction.

Next, calculation for melting the region 902 is performed. Specifically, the coordinates of the atoms positioned in the region 901 are fixed, the temperature is set to 4000 K, the time step is set to 2 fs, and the number of steps is set to 1000. The calculation performed with setting of the temperature, the time step, and the number of steps is hereinafter referred to as first-principles molecular dynamics calculations in some cases.

The calculation is performed using calculation program software "OpenMX" based on the density functional theory (DFT). Table 2 lists the calculation conditions other than the conditions set as described above.

TABLE 2

| Software | OpenMX |
|---|---|
| Exchange-correlation functional | GGA-PBE |
| Basis function | In: In7.0-s1p1d1 |
| | Ga: Ga7.0-s1p1d1 |
| | Zn: Zn6.0S-s1p1d1 |
| | O: O7.0-s2p2d1 |
| | H: H5.0-s2p1 |

TABLE 2-continued

| Cutoff energy | 160 Ry |
| --- | --- |
| k-point | Only Γ |

Note that in the first-principles molecular dynamics calculations and later-described calculation for optimizing the structures of the calculation models (also referred to as optimization calculation), which are performed in this embodiment, the lattice vectors (corresponding to the lengths of axes and the angle between axes) of the calculation models are fixed. In other words, the first-principles molecular dynamics calculations are performed under conditions where the number of particles (N), volume (V), and temperature (T) are constant (NVT ensemble). In addition, in the first-principles molecular dynamics calculations, a speed scaling method is used as a method for controlling the temperature.

Next, calculation for cooling the melted region 902 to a temperature of 500 K is performed. Note that the cooling rate is 500 K/ps. Specifically, first, the coordinates of the atoms positioned in the region 901 are fixed, the time step is set to 2 fs, and the number of steps is set to 500. Then, first-principles molecular dynamics calculations are performed, with the temperature set to 3500 K, on the calculation model obtained by the calculation for melting the region 902. Next, on the calculation model obtained following the calculations, first-principles molecular dynamics calculations are performed with the temperature set to 3000 K. Subsequently, on the calculation model obtained following the calculations, first-principles molecular dynamics calculations are performed with the temperature set to 2500 K. Then, on the calculation model obtained following the calculations, first-principles molecular dynamics calculations are performed with the temperature set to 2000 K. Next, on the calculation model obtained following the calculations, first-principles molecular dynamics calculations are performed with the temperature set to 1500 K. Subsequently, on the calculation model obtained following the calculations, first-principles molecular dynamics calculations are performed with the temperature set to 1000 K. Then, on the calculation model obtained following the calculations, first-principles molecular dynamics calculations are performed with the temperature set to 500 K. Through the above steps, the calculation for cooling the region 902 is completed.

Next, calculation for relaxation of the structure of the cooled region 902 is performed. Specifically, on the calculation model obtained by the calculation for cooling the region 902, first-principles molecular dynamics calculations are performed with the coordinates of the atoms positioned in the region 901 fixed, the temperature set to 300 K, the time step set to 2 fs, and the number of steps set to 2000.

Then, on the calculation model obtained through the calculation for relaxation of the structure of the region 902, calculation for optimizing the structure of the region 902 is performed with the coordinates of the atoms positioned in the region 901 fixed and the k-points changed to 3×1×3. After that, on the calculation model obtained through the calculation, calculation for optimizing the structure of the entire calculation model (the region 901 and the region 902) is performed with the coordinates of the atoms included in the calculation model not fixed.

By the above method, the calculation model 1A to the calculation model 1C and the calculation model 2A to the calculation model 2C are created. Note that as described above, the three-dimensional periodic boundary conditions are applied to the calculation model 1A to the calculation model 1C and the calculation model 2A to the calculation model 2C. Thus, in each of the calculation models, the region 901 corresponds to the crystal 21_1 and the crystal 21_2, and the region 902 corresponds to the region 22_1.

FIG. 3A to FIG. 3F show the created calculation model 1A to calculation model 1C. FIG. 4A to FIG. 4F show the created calculation model 2A to calculation model 2C. FIG. 3A, FIG. 3B, FIG. 3C, FIG. 4A, FIG. 4B, and FIG. 4C are diagrams of the calculation model 1A, the calculation model 1B, the calculation model 1C, the calculation model 2A, the calculation model 2B, and the calculation model 2C, respectively, seen from the direction perpendicular to the b-axis and the c-axis. FIG. 3D, FIG. 3E, FIG. 3F, FIG. 4D, FIG. 4E, and FIG. 4F are diagrams of the calculation model 1A, the calculation model 1B, the calculation model 1C, the calculation model 2A, the calculation model 2B, and the calculation model 2C, respectively, seen from the c-axis direction.

The formation energy of $V_O$ and the formation energy of $V_OH$ are calculated using the calculation model 1A to the calculation model 1C and the calculation model 2A to the calculation model 2C. Specifically, one oxygen atom is removed from each of the calculation models, so that calculation models each including one $V_O$ are prepared. In addition, one oxygen atom in each of the calculation models is replaced with one hydrogen atom, so that calculation models each including one $V_OH$ are prepared.

Note that each of the calculation model 1A and the calculation model 2A contains 128 oxygen atoms. Thus, 128 calculation models each including one $V_O$ and 128 calculation models each including one $V_OH$ are prepared for each of the calculation model 1A and the calculation model 2A. Each of the calculation model 1B and the calculation model 2B contains 160 oxygen atoms. Thus, 160 calculation models each including one $V_O$ and 160 calculation models each including one $V_OH$ are prepared for each of the calculation model 1B and the calculation model 2B. Each of the calculation model 1C and the calculation model 2C contains 192 oxygen atoms. Thus, 192 calculation models each including one $V_O$ and 192 calculation models each including one $V_OH$ are prepared for each of the calculation model 1C and the calculation model 2C.

Calculation for optimizing the structure of the entire calculation model is performed under the same calculation conditions as those shown in Table 2 except that the k-points are set to 3×1×3 for the calculation models each including one $V_O$ and the calculation models each including one $V_OH$. The total energy of the calculation model including one $V_O$ and the total energy of the calculation model including one $V_OH$, which are obtained through the calculation, are $E(V_O)$ and $E(V_OH)$, respectively. Note that performing the calculation on the calculation model including one $V_OH$ sometimes changes the $V_OH$ into a different defect (e.g., an oxygen vacancy and hydrogen).

Calculation models including no defect are the calculation model 1A, the calculation model 2A, the calculation model 1B, the calculation model 2B, the calculation model 1C, and the calculation model 2C themselves. Thus, E(no defect) is the total energy of the calculation model obtained after the calculation for optimizing the structure of the entire calculation model.

Note that $E(O_2)$ is calculated in the following manner: on a calculation model including one $O_2$, calculation for optimizing the structure of the $O_2$ is performed, and then, on the calculation model obtained following the calculation, single point calculation is performed. Furthermore, $E(H_2O)$ is calculated in the following manner: on a calculation model including one $H_2O$, calculation for optimizing the structure of the $H_2O$ is performed, and then, on the calculation model obtained following the calculation, single point calculation is performed. The calculations for obtaining $E(O_2)$ and $E(H_2O)$ are performed under the calculation conditions shown in Table 2. Note that in the above-described calculation for optimizing the structure of the $O_2$ or $H_2O$, a function of automatically determining a lattice vector of the calculation model is used.

The formation energy of each defect is calculated using $E(V_O)$, $E(V_OH)$, $E($no defect$)$, $E(O_2)$, and $E(H_2O)$ obtained by the above method. Note that a common calculation model is used for calculating the formation energy of defects. For example, in the case where the formation energy of $V_O$ ($\Delta E(V_O)$) in the calculation model 1A is calculated, $E(V_O)$ is calculated using the calculation model 1A including one $V_O$ and $E($no defect$)$ is calculated using the calculation model 1A including no defect.

Figure 5A:
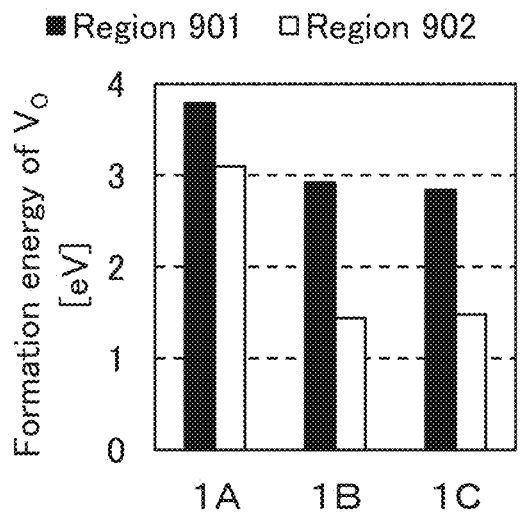
FIG. 5A and FIG. 5B are diagrams showing formation energy of V$_O$.
Figure 5B:
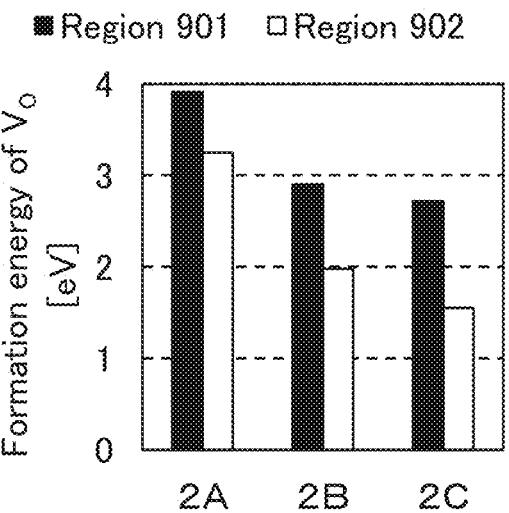
Figure 5C:
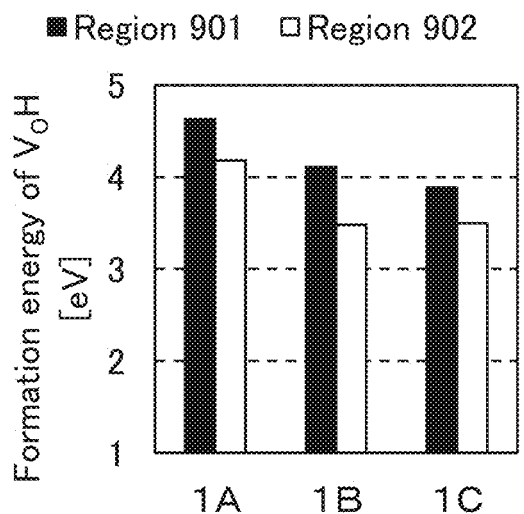
FIG. 5C and FIG. 5D are diagrams showing formation energy of V$_O$H.
Figure 5D:
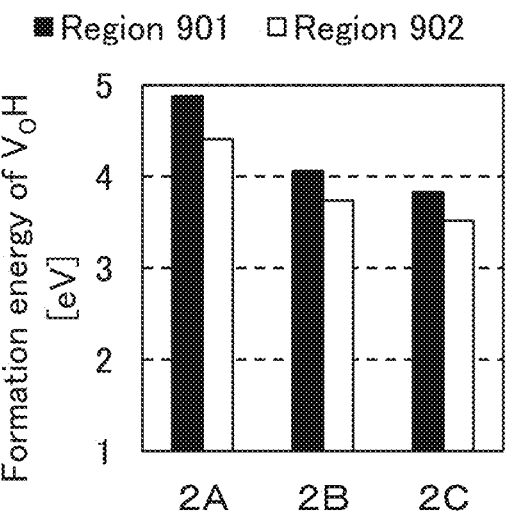

FIG. 5A to FIG. 5D show the calculated formation energy of each defect ($V_O$ and $V_OH$). FIG. 5A shows the formation energy of $V_O$ in the calculation model 1A to the calculation model 1C, FIG. 5B shows the formation energy of $V_O$ in the calculation model 2A to the calculation model 2C, FIG. 5C shows the formation energy of $V_OH$ in the calculation model 1A to the calculation model 1C, and FIG. 5D shows the formation energy of $V_OH$ in the calculation model 2A to the calculation model 2C. In each of FIG. 5A to FIG. 5D, the vertical axis represents formation energy [eV] of the defect ($V_O$ or $V_OH$). The colored bars in the graphs represent the average values of the formation energy of the defects in the regions 901 in the calculation models, and the white bars in the graphs represent the average values of the formation energy of the defects in the regions 902 in the calculation models.

As shown in FIG. 5A and FIG. 5B, the formation energy of $V_O$ in the region 902 is lower than the formation energy of $V_O$ in the region 901 in each of the calculation model 1A to the calculation model 1C and the calculation model 2A to the calculation model 2C. Thus, $V_O$ is probably more likely to be formed in the region 902 than in the region 901. Hence, the width of the region 902 (the region 22_1) is preferably narrow. Alternatively, the proportion of the region 902 (the region 22_1) in the metal oxide film is preferably low. Narrowing the width of the region 902 (the region 22_1) can inhibit formation of $V_O$ in the metal oxide film.

FIG. 5C and FIG. 5D reveal that the relationship of the formation energy of $V_OH$ between the region 901 and the region 902 is similar to the relationship of the formation energy of $V_O$ therebetween. Therefore, narrowing the width of the region 902 (the region 22_1) can inhibit formation of $V_OH$ in the metal oxide film.

As shown in FIG. 5A and FIG. 5B, the formation energy of $V_O$ in the region 902 in the calculation model 1A is lower than the formation energy of $V_O$ in the region 902 in the calculation model 2A. In addition, the formation energy of $V_O$ in the region 902 in the calculation model 1B is lower than the formation energy of $V_O$ in the region 902 in the calculation model 2B. Moreover, the formation energy of $V_O$ in the region 902 in the calculation model 1C is lower than the formation energy of $V_O$ in the region 902 in the calculation model 2C. These results suggest that $V_O$ is more likely to be formed in the region 902 with a density of 5.6 g/cm$^3$ than in the region 902 with a density of 6.0 g/cm$^3$. Thus, the density of the region 902 (the region 22_1) is preferably high. Increasing the density of the region 902 (the region 22_1) can inhibit formation of $V_O$ in the metal oxide film.

Note that the difference between the formation energy of $V_O$ in the region 902 in the calculation model 2C and the formation energy of $V_O$ in the region 902 in the calculation model 1C is smaller than the difference between the formation energy of $V_O$ in the region 902 in the calculation model 2B and the formation energy of $V_O$ in the region 902 in the calculation model 1B. That is, when the width of the region 902 is larger than the width of the region 902 in the calculation model 2B, $V_O$ is probably likely to be formed even with the region 902 having an increased density. Thus, the width of the region 902 (the region 22_1) is preferably smaller than the width of the region 902 in the calculation model 2B. Specifically, the width of the region 902 (the region 22_1) is preferably smaller than 2.1 nm. This can inhibit formation of $V_O$ in the metal oxide film.

FIG. 5C and FIG. 5D reveal that the relationship of the formation energy of $V_OH$ between the region 902 with a low density and the region 902 with a high density is similar to the relationship of the formation energy of $V_O$ therebetween. Therefore, narrowing the width of the region 902 (the region 22_1) can inhibit formation of $V_OH$ in the metal oxide film.

As shown in FIG. 5A, the formation energy of $V_O$ in the region 901 in the calculation model 1B and the formation energy of $V_O$ in the region 901 in the calculation model 1C are lower than the formation energy of $V_O$ in the region 902 in the calculation model 1A. That is, in the entire region (the region 901 and the region 902), the formation energy of $V_O$ in the calculation model 1B and the formation energy of $V_O$ in the calculation model 1C are lower than the formation energy of $V_O$ in the calculation model 1A. Thus, when the width of the region 902 is increased, $V_O$ is probably likely to be formed not only in the region 902 but also in the region 901. Hence, the width of the region 902 (the region 22_1) is preferably smaller than the width of the region 902 in the calculation model 1B. Specifically, the width of the region 902 (the region 22_1) is preferably smaller than 1.5 nm. This can inhibit formation of $V_O$ in the metal oxide film.

FIG. 5B reveals that the relationship of the formation energy of $V_O$ between the calculation model 2A, the calculation model 2B, and the calculation model 2C is similar to the relationship of the formation energy of $V_O$ between the calculation models (the calculation model 1A to the calculation model 1C) in each of which the density of the region 902 is 5.6 g/cm$^3$.

FIG. 5C and FIG. 5D reveal that the relationship of the formation energy of $V_OH$ between the calculation model 1A, the calculation model 1B, and the calculation model 1C is similar to the relationship of the formation energy of $V_O$ between the calculation models (the calculation model 1A to the calculation model 1C) in each of which the density of the region 902 is 5.6 g/cm$^3$. In addition, the relationship of the formation energy of $V_OH$ between the calculation model 2A, the calculation model 2B, and the calculation model 2C is similar to the relationship of the formation energy of $V_O$ between the calculation models (the calculation model 1A to the calculation model 1C) in each of which the density of the region 902 is 5.6 g/cm$^3$. Therefore, narrowing the width of the region 902 (the region 22_1) can inhibit formation of $V_OH$ in the metal oxide film.

In this manner, narrowing the width of the region 22_1 can inhibit formation of defects ($V_O$ and $V_OH$) in the metal oxide. Thus, the use of the metal oxide in which the width of the region 22_1 is narrow for a transistor can inhibit a variation in the electrical characteristics of the transistor.

The above is the description of ease of formation of defects in the metal oxide.

<Crystal Structure Example>

In this section, the crystal structure of the crystal included in the metal oxide of one embodiment of the present invention will be described. Examples of the crystal structure include, as described above, a $YbFe_2O_4$ type structure, a $Yb_2Fe_3O_7$ type structure, and a variation of these structures.

Here, the case where the metal oxide is an In-M-Zn oxide containing indium, the element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M.

Figure 6A:
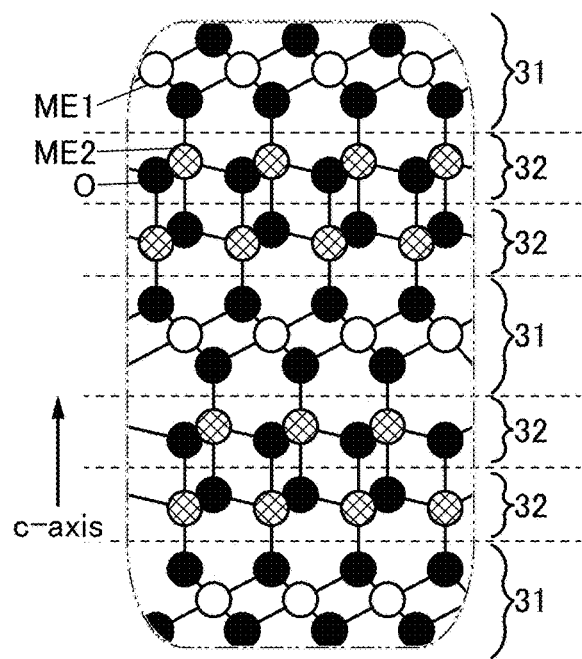
FIG. 6A to FIG. 6D are diagrams illustrating a crystal included in a metal oxide.
Figure 6B:
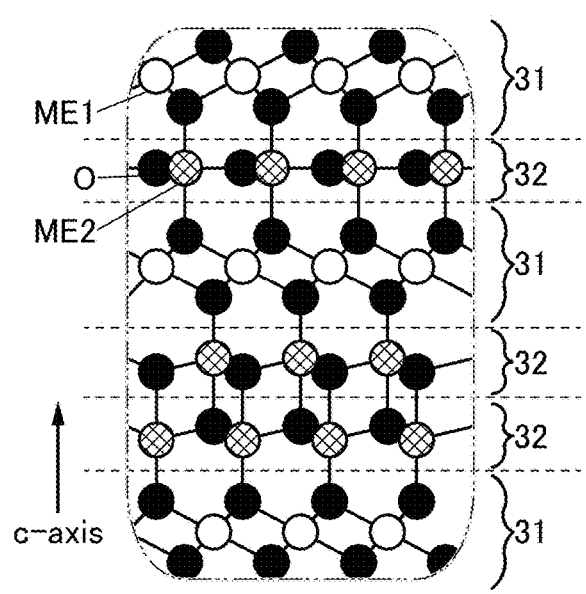
Figure 6C:
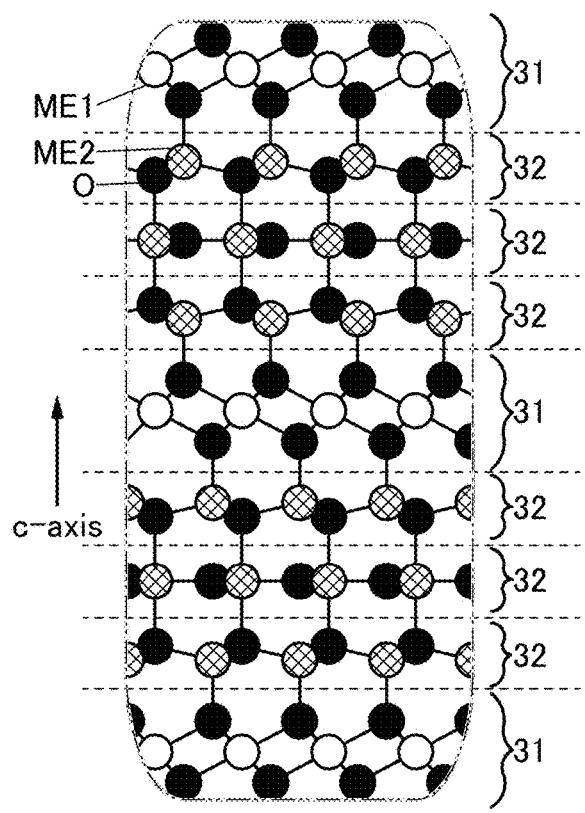

FIG. 6A to FIG. 6C are diagrams illustrating the atomic arrangement in the crystal included in the metal oxide of one embodiment of the present invention. In FIG. 6A to FIG. 6C, an atom is represented by a sphere (a circle), and a bond between a metal atom and an oxygen atom is represented by a line.

In FIG. 6A to FIG. 6C, the c-axis direction in the crystal structure of the In-M-Zn oxide is indicated by the arrows in FIG. 6A to FIG. 6C. The a-b plane direction in the crystal structure of the In-M-Zn oxide is the direction perpendicular to the c-axis direction indicated by the arrows in FIG. 6A to FIG. 6C.

Here, an element ME1 is indium in most cases. Note that an atom of the element M or a zinc atom may exist at a position of an atom of the element ME1. In addition, an element ME2 is the element M and zinc in most cases. Note that an indium atom may exist at a position of an atom of the element ME2.

As illustrated in FIG. 6A, the crystal included in the metal oxide 20 has a structure in which a layer 31 containing an atom of the element ME1 and an oxygen atom and a layer 32 containing an atom of the element ME2 and an oxygen atom are stacked. Note that in the crystal structure illustrated in FIG. 6A, two layers 32 exist between two layers 31 close to each other in the c-axis direction. That is, the crystal structure illustrated in FIG. 6A is a $YbFe_2O_4$ type structure. For example, in the case where the composition of the metal oxide 20 is In:M:Zn=1:1:1 [atomic ratio] or in the neighborhood thereof, such a crystal structure is likely to be obtained.

Figure 7A:
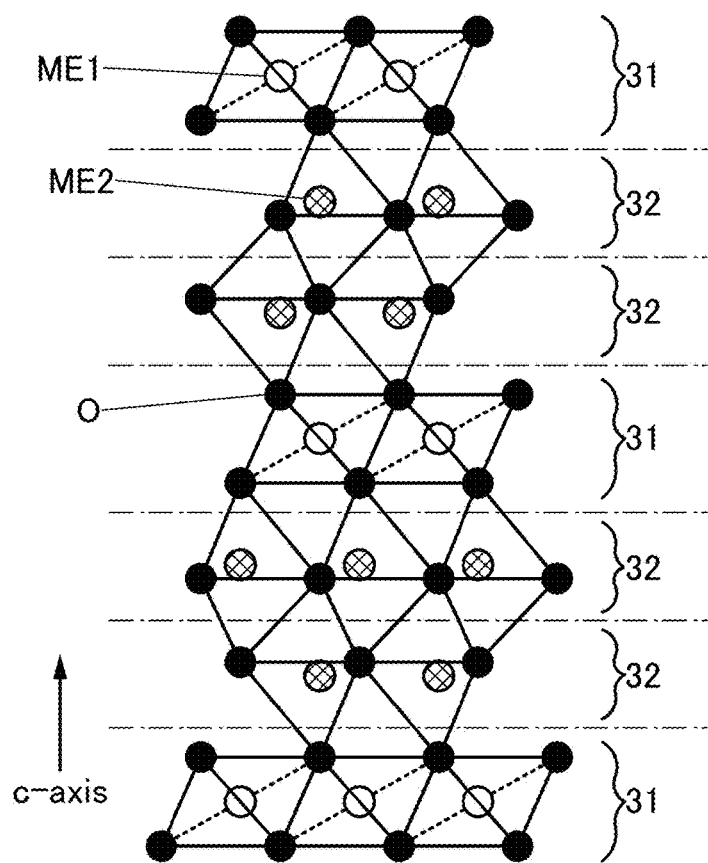
FIG. 7A is a diagram illustrating a crystal included in a metal oxide.

In FIG. 6A, the atomic arrangement in the crystal is represented with the spheres (circles) and the lines. Next, the atomic arrangement in the crystal is expressed as polyhedrons. FIG. 7A is a diagram in which the atomic arrangement in the crystal illustrated in FIG. 6A is expressed as polyhedrons. Note that the polyhedron included in the layer 31 is illustrated in FIG. 7B, and the polyhedron that can be included in the layer 32 is illustrated in FIG. 7C and FIG. 7D.

Figure 7B:
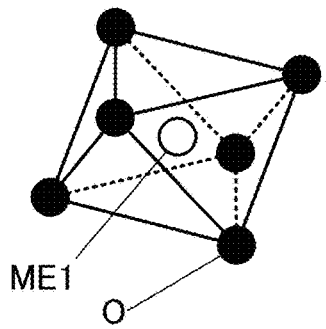
FIG. 7B to FIG. 7D are diagrams illustrating polyhedrons included in a crystal.

The polyhedron illustrated in FIG. 7B is an octahedral structure. The octahedral structure is a structure including an atom of the element ME1 (e.g., indium) at the center and oxygen atoms at vertexes. In the layer 31, such octahedral structures are edge-shared.

Figure 7C:
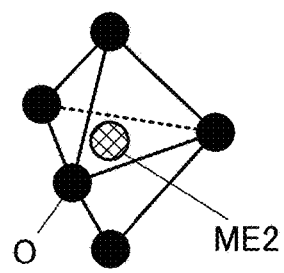
Figure 7D:
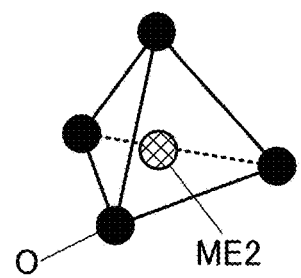
Figure 8A:
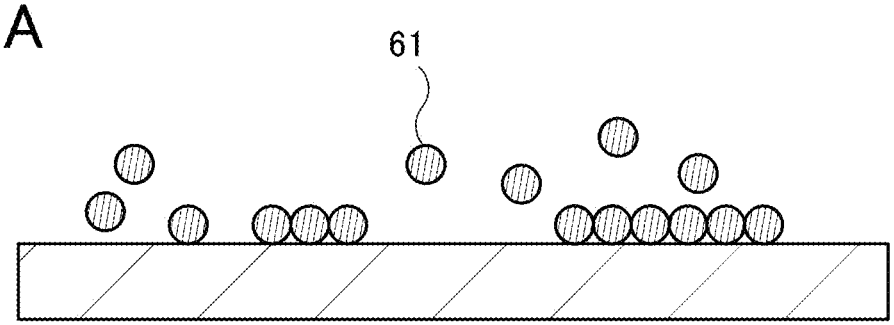
FIG. 8A to FIG. 8D are cross-sectional views illustrating a film formation method.
Figure 8B:
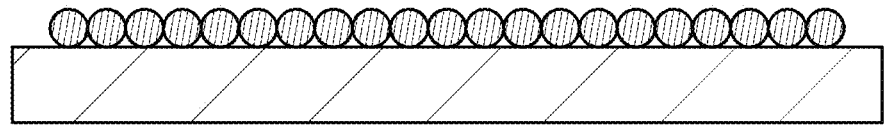
Figure 8C:
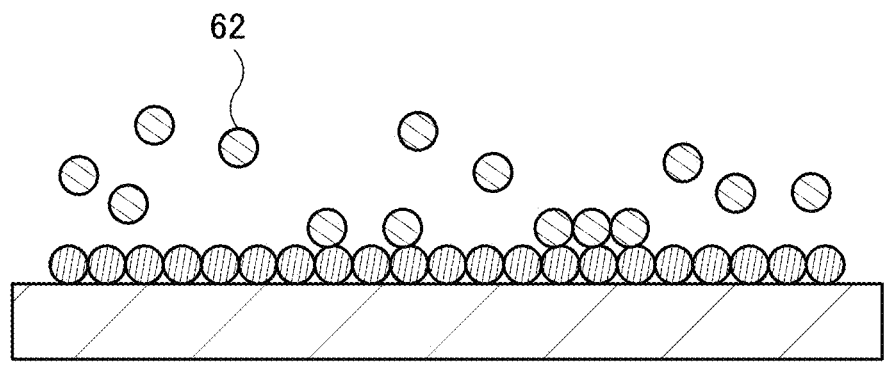
Figure 8D:
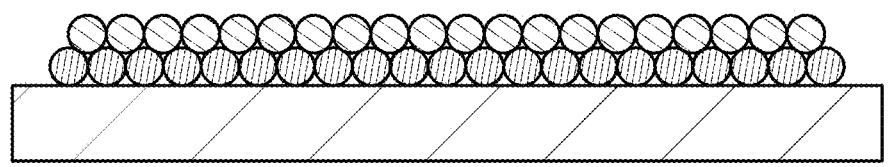

The polyhedron illustrated in FIG. 7C is a trigonal bipyramidal structure. The trigonal bipyramidal structure is a structure including an atom of the element ME2 (e.g., the element M or zinc) at the center or in the vicinity thereof and oxygen atoms at vertexes. The polyhedron illustrated in FIG. 7D is a tetrahedral structure. The tetrahedral structure is a structure including an atom of the element ME2 (e.g., the element M or zinc) at the center and oxygen atoms at vertexes. In the layer 32 illustrated in FIG. 7A, trigonal bipyramidal structures are edge-shared. Note that the structure of the layer 32 may depend on the number of layers 32 existing between the two layers 31 close to each other in the c-axis direction. In the layer 32, for example, the trigonal bipyramidal structures are vertex-shared or the tetrahedral structures are vertex-shared, in some cases.

The layer 31 and the layer 32 are vertex-shared. The two layers 32 adjacent to each other in the c-axis direction are vertex-shared or edge-shared. Note that in FIG. 7A, the two layers 32 adjacent to each other in the c-axis direction are edge-shared.

Although the In-M-Zn oxide with a composition of In:M:Zn=1:1:1 [atomic ratio] is given as an example of the metal oxide 20 in FIG. 6A and FIG. 7A, the composition of an oxide 230 is not limited thereto. The metal oxide 20 may be, for example, an In-M-Zn oxide whose composition formula is represented by $In_{(1+\alpha)}M_{(1-\alpha)}O_3(ZnO)_m$ ($\alpha$ is a real number greater than $-1$ and less than 1 and m is a positive real number).

In the case where m is a real number greater than 0 and less than 1, the crystal included in the metal oxide 20 sometimes includes a region where the two layers 32 exist between the two layers 31 close to each other in the c-axis direction and a region where one layer 32 exists between the two layers 31 close to each other in the c-axis direction (see FIG. 6B). Note that the crystal structure of the crystal included in the metal oxide 20 illustrated in FIG. 6B is a $Yb_2Fe_3O_7$ type structure. In the case where the composition of the metal oxide 20 is In:M:Zn=1:1:0.5 [atomic ratio], the crystal structure illustrated in FIG. 6B is likely to be obtained.

In the case where m is a real number greater than 1, the crystal included in the metal oxide 20 sometimes includes three or more layers 32 between the two layers 31 close to each other in the c-axis direction. In the crystal structure illustrated in FIG. 6C, for example, three layers 32 exist between the two layers 31 close to each other in the c-axis direction. Note that in the case where the composition of the metal oxide 20 is In:M:Zn=1:1:2 [atomic ratio] or in the neighborhood thereof, the crystal structure illustrated in FIG. 6C is likely to be obtained.

Note that the relationship between the stacked-layer structure of the layer 31 and the layer 32 and the composition of the metal oxide 20 is not limited to the above. Even when the composition of the metal oxide 20 is In:M:Zn=1:1:1 [atomic ratio] or in the neighborhood thereof, one layer 32 or three or more layers 32 may exist between the two layers 31 close to each other in the c-axis direction. The same applies to a crystal structure of the metal oxide 20 having a composition other than In:M:Zn=1:1:1 [atomic ratio] or in the neighborhood thereof. Such a crystal structure is sometimes referred to as a variant structure. An example of the variant structure is a crystal structure in which part of a $YbFe_2O_4$ type structure and part of a $Yb_2Fe_3O_7$ type structure are stacked.

In the case where $\alpha$ is a real number greater than 0 and less than 1, the layer 32 may contain an indium atom in addition to an atom of the element M and a zinc atom. In the case where $\alpha$ is a real number greater than $-1$ and less than 0, the layer 31 may contain an atom of the element M or a zinc atom in addition to an indium atom.

The crystal structure of the crystal included in the metal oxide 20 may be a wurtzite type structure.

Figure 6D:
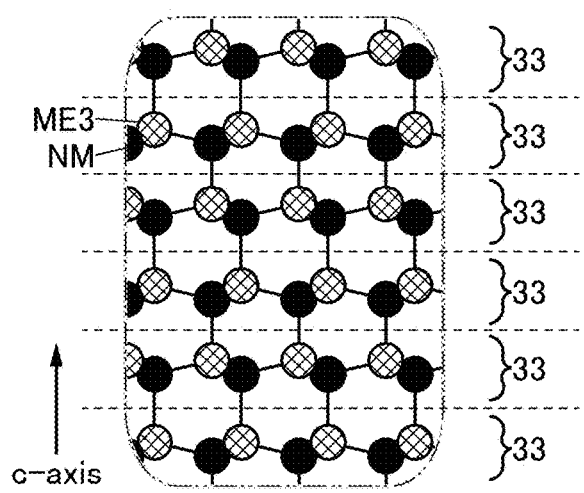

FIG. 6D is a diagram illustrating a wurtzite type structure. Note that in FIG. 6D, an atom is represented by a sphere (a circle), and a bond between a metal atom and an atom of an element NM is represented by a line. The c-axis direction of the crystal structure illustrated in FIG. 6D is indicated by an arrow in FIG. 6D. The a-b plane direction of the crystal structure illustrated in FIG. 6D is the direction perpendicular to the c-axis direction indicated by the arrow in FIG. 6D.

A wurtzite type structure can be regarded as a structure in which layers 33 are stacked in the c-axis direction. Note that in the layers 33, the tetrahedral structures are vertex-shared.

An element ME3 is a metal atom, and the element NM is an atom of a nonmetallic element. In the case where an In-M-Zn oxide contains nitrogen, for example, the In-M-Zn oxide sometimes has a wurtzite type structure in which an indium atom, an atom of the element M, or a zinc atom exists at a position of an atom of the element ME3 and an oxygen atom or a nitrogen atom exists at a position of an atom of the element NM, depending on the nitrogen atom content. For another example, in the case where the indium content and the element M content are low in the In-M-Zn oxide, the In-M-Zn oxide sometimes has a wurtzite type structure in which an indium atom, an atom of the element M, or a zinc atom exists at a position of an atom of the element ME3 and an oxygen atom exists at a position of an atom of the element NM.

The above is the description of the crystal structure of the crystal included in the metal oxide.

<Method for Forming Metal Oxide>

In this section, a method for forming the metal oxide of one embodiment of the present invention will be described.

Examples of a method for forming a metal oxide include a sputtering method, a chemical vapor deposition (CVD) method, a molecular beam epitaxy (MBE) method, a pulsed laser deposition (PLD) method, and an atomic layer deposition (ALD) method.

As a method for forming the metal oxide of one embodiment of the present invention, an ALD method is preferably used. Note that the metal oxide of one embodiment of the present invention is suitably formed especially by a PEALD method described later with the use of a precursor not containing hydrocarbon. In the case where the metal oxide of one embodiment of the present invention is formed by a PEALD method using a precursor not containing hydrocarbon, a reduction in the concentrations of impurities (carbon, hydrogen, and the like) in the film should lead to more stable formation of the crystal structure of the metal oxide.

In an ALD method, one atomic layer can be deposited at a time using self-regulating characteristics of precursor molecules or atoms included in the precursor. Hence, an ALD method has effects such as formation of an extremely thin film, formation of a film on a component with a high aspect ratio, formation of a film with a small number of defects such as pinholes, formation of a film with excellent coverage, and film formation at a low temperature. An ALD method includes a plasma ALD (PEALD: Plasma Enhanced ALD) method, which is a film formation method using plasma. The use of plasma is sometimes preferable because film formation at a lower temperature is possible. Note that a precursor used in an ALD method sometimes contains an element such as carbon or chlorine. Thus, in some cases, a film provided by an ALD method contains a larger amount of an element such as carbon or chlorine than a film provided by another film formation method. Note that these elements can be quantified by X-ray photoelectron spectroscopy (XPS).

Unlike a film formation method in which particles ejected from a target or the like are deposited, an ALD method is a film formation method in which a film is formed by reaction at a surface of an object. Thus, an ALD method is a film formation method that enables favorable step coverage almost regardless of the shape of an object. In particular, an ALD method enables excellent step coverage and excellent thickness uniformity and thus is suitable for covering a surface of an opening portion with a high aspect ratio, for example. Note that an ALD method has a relatively low film formation rate; thus, it is sometimes preferable to combine an ALD method with another film formation method with a high film formation rate such as a CVD method.

When an ALD method is employed, the composition of a film to be obtained can be controlled with the amount of introduced source gases. For example, a film with a certain composition can be formed depending on the amount of introduced source gases or the number of times of introduction (also referred to as the number of pulses) in an ALD method. Moreover, for example, when the amount of introduced source gases or the number of times of introduction is changed during the film formation in an ALD method, a film in which the composition is continuously changed can be formed. In the case of forming a film while changing the amount of introduced source gases or the number of times of introduction, time taken for the film formation can be shortened because time taken for transfer and pressure adjustment is omitted, as compared with the case of forming a film with the use of a plurality of film formation chambers. Thus, the productivity of semiconductor devices can be improved in some cases.

[Film Formation Method Using ALD Apparatus and ALD Method]

Here, a film formation apparatus using an ALD method (hereinafter, also referred to as an ALD apparatus) that can be used for forming the metal oxide and a film formation method using an ALD method will be described.

In a film formation apparatus utilizing an ALD method, film formation is performed in such a manner that a first source gas (also referred to as a precursor or a metal precursor) and a second source gas (also referred to as a reactant or a nonmetallic precursor) are alternately introduced into a chamber, and then the introduction of these source gases is repeated. Note that the source gases to be introduced can be switched by switching the respective switching valves (also referred to as high-speed valves), for example. When the source gases are introduced, an inert gas such as nitrogen ($N_2$) or argon (Ar) may be introduced as a carrier gas with the source gases into the chamber. With the use of a carrier gas, the source gases can be inhibited from being adsorbed onto an inner side of a pipe or an inner side of a valve and can be introduced into the chamber, even in the case where the volatility of the source gases is low or the vapor pressure is low. Moreover, uniformity of the formed film is improved, which is preferable.

An example of a film formation method using an ALD method is described with reference to FIG. 8A to FIG. 8D. First, a first source gas is introduced into a chamber (see FIG. 8A) and a precursor 61 is adsorbed onto a substrate surface (a first step). Here, the precursor 61 is adsorbed onto the substrate surface, whereby a self-limiting mechanism of surface chemical reaction works and no more precursor is adsorbed onto a layer of the precursor over the substrate (see FIG. 8B). Note that the proper range of substrate temperatures at which the self-limiting mechanism of surface chemical reaction works is also referred to as an ALD Window. The ALD Window is determined by the temperature characteristics, vapor pressure, decomposition temperature, and the like of a precursor and is set to higher than or equal to 100° C. and lower than or equal to 500° C., preferably higher than or equal to 200° C. and lower than or equal to 400° C. Next, an excessive precursor, a reaction product, and the like are released from the chamber by vacuum evacuation (a second step). Alternatively, instead of performing vacuum evacuation, an inert gas (e.g., argon or nitrogen) or the like may be introduced into the chamber to release an excessive precursor, a reaction product, and the like from the chamber. The second step is also called purge. Next, a reactant 62 (e.g., an oxidizer (ozone ($O_3$), oxygen ($O_2$), water ($H_2O$), and plasma, a radical, and an ion thereof)) is introduced as a second source gas into the chamber (see FIG. 8C) to react with the precursor 61 adsorbed onto the substrate surface, whereby part of components contained in the precursor 61 is released while the component molecules of the film are kept adsorbed onto the substrate (a third step) (see FIG. 8D). After that, an excessive reactant 62, a reaction product, and the like are released from the chamber by vacuum evacuation or introduction of an inert gas (a fourth step).

Note that in the following description of this specification, in the case of using ozone, oxygen, and water as a reactant or an oxidizer, they include not only those in a gas state or a molecular state but also those in a plasma state, a radical state, and in an ion state, unless otherwise specified. In the case where a film is formed using an oxidizer in a plasma state, a radical state, or an ion state, a radical ALD apparatus or a plasma ALD apparatus, which will be described later, is used.

Water is preferably used as an oxidizer to remove carbon contained in the precursor. Hydrogen contained in water reacts with carbon contained in the precursor, whereby carbon can be released from the precursor efficiently. On the other hand, in order to reduce hydrogen contained in a film to be formed as much as possible, ozone or oxygen, which does not contain hydrogen, is preferably used as the oxidizer. Alternatively, after water is introduced as a first oxidizer to the chamber to remove carbon contained in the precursor, vacuum evacuation is performed, hydrogen is removed by introducing ozone or oxygen, which does not contain hydrogen, as a second oxidizer to the chamber, and vacuum evacuation is performed. After that, the first step to the fourth step are repeated until a desired thickness is obtained.

Note that in the above description, an example in which the second source gas is introduced into the chamber after the first source gas is introduced into the chamber is shown; however, one embodiment of the present invention is not limited thereto. The first source gas may be introduced into the chamber after the second source gas is introduced into the chamber. That is, film formation may be performed in such a manner that the third step and the fourth step are performed first, and then the first step, the second step, the third step, and the fourth step are repeated. Alternatively, film formation may be performed in such a manner that the third step and the fourth step are repeated a plurality of times, and then the first step to the fourth step are repeated.

In this manner, the third step and the fourth step are preferably performed once or more before the first step, in which case the film formation atmosphere in the chamber can be controlled. For example, an oxidizer is introduced as the third step, so that the chamber can have an oxygen atmosphere. Film formation began in an oxygen atmosphere is preferable because the formed film can have a high concentration of oxygen. Furthermore, oxygen can also be supplied to the insulator or the oxide that is to be bases of the film. A semiconductor device formed by such a method can have favorable characteristics and obtain high reliability.

After the first step and the second step are performed, introduction of the second source gas in the third step and vacuum evacuation or introduction of an inert gas in the fourth step may be repeated a plurality of times. That is, after the first step, the second step, the third step, the fourth step, the third step, and the fourth step are performed, that is, after the third step and the fourth step are repeated, the first step and the second step may be performed.

For example, $O_3$ and $O_2$ are introduced as oxidizers in the third step, vacuum evacuation is performed in the fourth step, and then these steps may be repeated a plurality of times.

In the case where the third step and the fourth step are repeated, it is not necessary to repeat the introduction of the same kind of source gas. For example, $H_2O$ may be used as an oxidizer in the third step in the first cycle, and $O_3$ may be used as an oxidizer in the third steps in and after the second cycle.

In this manner, the introduction of an oxidizer and vacuum evacuation (or the introduction of an inert gas) in the chamber are repeated a plurality of times in a short time, whereby excess hydrogen atoms, carbon atoms, chlorine atoms, and the like can be more certainly removed from the precursor adsorbed onto the substrate surface and released to the outside of the chamber. When the number of kinds of the oxidizer is increased to two, more excess hydrogen atoms and the like can be removed from the precursor adsorbed onto the substrate surface. In this manner, hydrogen atoms are prevented from being taken into the film during the film formation, so that water, hydrogen, and the like contained in the formed film can be reduced.

With the use of such a method, it is possible to form a film of which the released amount of water molecules is greater than or equal to $1.0 \times 10^{13}$ molecules/cm$^2$ and less than or equal to $1.0 \times 10^{16}$ molecules/cm$^2$, preferably greater than or equal to $1.0 \times 10^{13}$ molecules/cm$^2$ and less than or equal to $3.0 \times 10^{15}$ molecule/cm$^2$ in TDS analysis in a film-surface temperature range of 100° C. to 700° C. or 100° C. to 500° C.

A first layer can be formed on the substrate surface in the above manner, and a second layer can be stacked over the first layer by performing the first step to the fourth step again. The first step to the fourth step are repeated a plurality of times while the gas introduction is controlled until a desired film thickness is obtained, whereby a thin film with excellent step coverage can be formed. The thickness of the thin film can be adjusted by the number of repetitions; therefore, an ALD method makes it possible to accurately adjust a film thickness and thus is suitable for a case of fabricating a miniaturized transistor.

A film formed by the above method has a layered structure in some cases. In addition, when a film formed by the above method has a crystal structure, the c-axis of the film is aligned in the direction substantially parallel to the normal direction of the surface where the film is formed. That is, the c-axis of the film is aligned perpendicular to the surface where the film is formed. In this specification, such a crystal structure is sometimes referred to as a CAAC structure. It is possible to form a metal oxide having a CAAC structure by an ALD method.

An ALD method is a method in which film formation is performed through reaction of a precursor and a reactant using thermal energy. A temperature required for the reaction between the precursor and the reactant is determined by the temperature characteristics, vapor pressure, decomposition temperature, and the like thereof and is set to higher than or equal to 100° C. and lower than or equal to 500° C., preferably higher than or equal to 200° C. and lower than or equal to 400° C. Moreover, an ALD method in which treatment is performed by introducing a plasma-excited reactant into the chamber as a third source gas in addition to the precursor and the reactant which react with each other is referred to as a plasma ALD method in some cases. In this case, a plasma generation apparatus is provided in the introduction portion of the third source gas. Inductively coupled plasma (ICP) can be used for plasma generation. On the other hand, an ALD method in which reaction between the precursor and the reactant is performed using thermal energy is sometimes referred to as a thermal ALD method.

In a plasma ALD method, film formation is performed by introducing a plasma-excited reactant in the third step. Alternatively, film formation is performed in such a manner that the first step to the fourth step are repeated while a plasma-excited reactant (a second reactant) is introduced. In this case, the reactant introduced in the third step is referred to as a first reactant. In the plasma ALD method, the same material as the above-described oxidizer can be used for the second reactant used as the third source gas. In other words, plasma-excited ozone, oxygen, and water can be used as the second reactant. Other than the oxidizer, a nitriding agent may be used as the second reactant. As the nitriding agent, nitrogen ($N_2$) or ammonia ($NH_3$) can be used. A mixed gas of nitrogen ($N_2$) and hydrogen ($H_2$) can also be used as the nitriding agent. For example, a mixed gas of nitrogen ($N_2$) of 5% and hydrogen ($H_2$) of 95% can be used as the nitriding agent. Film formation is performed while plasma-excited nitrogen or ammonia is introduced, whereby a nitride film such as a metal nitride film can be formed.

Argon (Ar) or nitrogen ($N_2$) may be used as a carrier gas for the second reactant. The use of a carrier gas such as argon or nitrogen is preferable because plasma is easily discharged and the plasma-excited second reactant is easily generated. Note that in the case where an oxide film such as a metal oxide film is formed by a plasma ALD method and nitrogen is used as a carrier gas, nitrogen enters the film and a desired film quality cannot be obtained in some cases. In this case, argon is preferably used as the carrier gas.

By an ALD method, an extremely thin film can be formed to have a uniform thickness. In addition, the coverage of an uneven surface with the film is high.

When film formation is performed by a plasma ALD method, film formation can be performed at a lower temperature than that by a thermal ALD method. By a plasma ALD method, for example, film formation can be performed without decreasing the film formation rate even at 100° C. or lower. Furthermore, in a plasma ALD method, not only an oxidizer but also any of a variety of reactants such as a nitriding agent can be used; therefore, it is possible to form various kinds of films of a nitride, an oxynitride, a fluoride, a metal, and the like as well as an oxide.

In the case where a plasma ALD method is employed, as in an ICP method or the like, plasma can be generated in a state apart from a substrate. When plasma is generated in this manner, plasma damage can be reduced.

By the above method, a film that includes, as a component, atoms included in the first source gas, an oxide film, or a nitride film can be formed.

On the other hand, in the case where a film containing a plurality of metals is formed as the metal oxide, a plurality of precursors are prepared for every metal and sequentially introduced into the chamber.

In the case where an In-M-Zn oxide is formed as the metal oxide, a source gas that contains a first precursor containing indium is introduced into the chamber, and an excess source gas is evacuated (purged). Then, an oxidizer is introduced as a reactant into the chamber, and an excess reactant is evacuated. Next, a source gas that contains a second precursor containing the element M is introduced into the chamber, and an excess source gas is evacuated (purged). Then, an oxidizer is introduced as a reactant into the chamber, and an excess reactant is evacuated. After that, a source gas that contains a third precursor containing zinc is introduced into the chamber, and an excess source gas is evacuated (purged). Subsequently, an oxidizer is introduced as a reactant into the chamber, and an excess reactant is evacuated. The above steps are repeated, whereby a metal oxide including a layer containing indium, a layer containing the element M, and a layer containing zinc can be formed.

The order of introduction of the source gases is not limited to the above. After the source gas containing the first precursor is introduced, the source gas containing the third precursor may be introduced, and then the source gas containing the second precursor may be introduced; the order can be determined as appropriate by a practitioner in accordance with required film properties. In addition, evacuation of an excess source gas and introduction and evacuation of a reactant can be performed as appropriate after the introduction of any of the source gases. Note that the metal oxide is not limited to an In-M-Zn oxide. As described above, the metal oxide preferably contains at least indium or zinc, particularly preferably contains indium and zinc. Alternatively, the number of kinds of metals contained in the metal oxide may be two, or four or more.

The atomic ratio of the metals contained in the metal oxide can be controlled by adjusting the number of times of introduction of the source gases containing precursors containing the metals into the chamber or the film formation temperature. For example, in order to increase the atomic ratio of the element M to indium and zinc, the number of times of introduction of the source gas containing the second precursor containing the element M into the chamber is preferably larger than the number of times of introduction of the source gas containing the first precursor containing indium into the chamber and the number of times of introduction of the source gas containing the third precursor containing zinc into the chamber.

A plurality of precursors may be introduced into the chamber; for example, the metal oxide containing an In-M-Zn oxide may be formed in the following manner: a source gas containing the first precursor is introduced into the chamber, an excess source gas is evacuated, a reactant is introduced into the chamber, an excess reactant is evacuated, a source gas containing the second precursor and the third precursor is introduced into the chamber, an excess source gas is evacuated, a reactant is introduced into the chamber, an excess reactant is evacuated, a source gas containing the second precursor and the third precursor is introduced into the chamber, an excess source gas is evacuated, a reactant is introduced into the chamber, and an excess reactant is evacuated. Note that the combination of precursors introduced into the chamber is not limited to the above. A source gas containing the first precursor and the second precursor may be introduced into the chamber, a source gas containing the first precursor and the third precursor may be introduced into the chamber, and a source gas containing the first precursor, the second precursor, and the third precursor may be introduced into the chamber. The combination can be determined as appropriate by a practitioner in accordance with required film properties.

Alternatively, source gases that contain different precursors may be introduced into the chamber successively. For example, the metal oxide containing an In-M-Zn oxide may be formed in the following manner: a source gas containing the first precursor is introduced into the chamber, an excess source gas is evacuated, a reactant is introduced into the chamber, an excess reactant is evacuated, a source gas containing the second precursor is introduced into the chamber, an excess source gas is evacuated, then without introduction of a reactant into the chamber, a source gas containing the third precursor is successively introduced into the chamber, an excess source gas is evacuated, a reactant is introduced into the chamber, an excess reactant is evacuated, a source gas containing the second precursor is introduced into the chamber, an excess source gas is evacuated, then without introduction of a reactant into the chamber, a source gas containing the third precursor is successively introduced into the chamber, an excess source gas is evacuated, a reactant is introduced into the chamber, and an excess reactant is evacuated. Note that the order of introduction and combination of the precursors that are successively introduced into the chamber are not limited to the above. After the source gas containing the first precursor is introduced into the chamber, the source gas containing the second precursor may be introduced into the chamber without introduction of the reactant. The combination can be determined as appropriate by a practitioner in accordance with required film properties.

The metal oxide may be formed using a precursor containing a plurality of metals. For example, the metal oxide may be formed using a precursor containing indium and the element M in one molecule, a precursor containing indium and zinc in one molecule, a precursor containing the element M and zinc in one molecule, or the like.

Here, an example of a method for forming the metal oxide 20 including an In-M-Zn oxide will be described with reference to FIG. 9A to FIG. 9C and FIG. 10A to FIG. 10C. Note that FIG. 9A to FIG. 9C and FIG. 10A to FIG. 10C illustrate an example in which the layer 31 containing indium is formed, a layer 32*a* containing the element M is formed thereover, and further a layer 32*b* containing zinc is formed thereover; however, this embodiment is not limited thereto. For example, one of the layer 32*a* and the layer 32*b* may be formed, the layer 31 may be formed thereover, and further the other of the layer 32*a* and the layer 32*b* may be formed thereover. Alternatively, one of the layer 32*a* and the layer 32*b* may be formed, the other of the layer 32*a* and the layer 32*b* may be formed thereover, and further the layer 31 may be formed thereover.

Figure 9A:
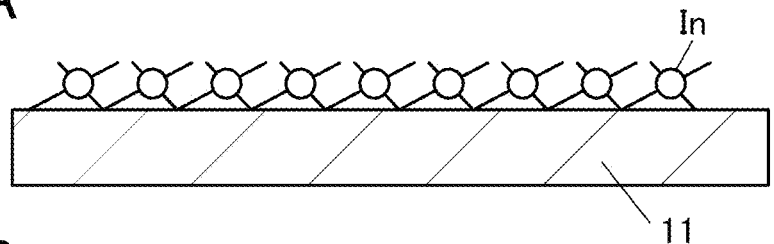
FIG. 9A to FIG. 9D are cross-sectional views illustrating a film formation method.
Figure 9B:
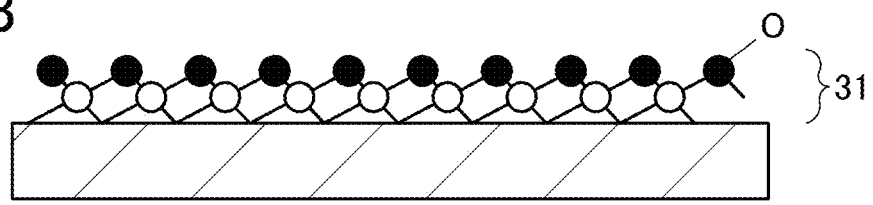

First, a source gas that contains a precursor containing indium is introduced into a chamber, so that the precursor is adsorbed onto a surface of a structure body 11 (see FIG. 9A). Here, the source gas contains a carrier gas such as argon or nitrogen in addition to the precursor. Triethylindium, tris(2,2,6,6-tetramethyl-3,5-heptanedione acid)indium, cyclopentadienylindium, or the like can be used as the precursor containing indium. Next, the chamber is purged, whereby an excess precursor, a reaction product, and the like are released from the chamber.

Then, an oxidizer introduced as a reactant into the chamber is reacted with the adsorbed precursor, and components other than indium are released while indium is adsorbed onto the substrate. Thus, the layer 31 composed of indium and oxygen is formed (see FIG. 9B). Ozone, oxygen, water, or the like can be used as the oxidizer. After that, the chamber is purged, whereby an excess reactant, a reaction product, and the like are released from the chamber.

Figure 9C:
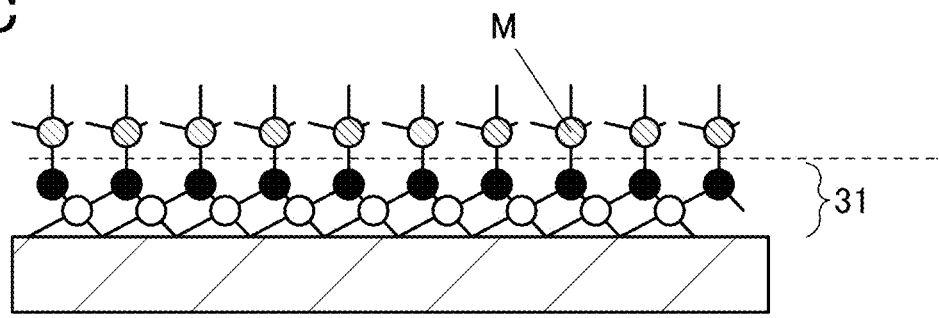

Subsequently, a source gas that contains a precursor containing the element M is introduced into the chamber, so that the precursor is adsorbed onto the layer 31 (see FIG. 9C). Here, the source gas contains a carrier gas such as argon or nitrogen in addition to the precursor. In the case where gallium is used as the element M, trimethylgallium, triethylgallium, gallium trichloride, tris(dimethylamide)gallium, gallium(III) acetylacetonate, tris(2,2,6,6-tetramethyl-3,5-heptanedione acid)gallium, dimethylchlorogallium, diethylchlorogallium, or the like can be used as the precursor containing gallium. Next, the chamber is purged, whereby an excess precursor, a reaction product, and the like are released from the chamber.

Figure 9D:
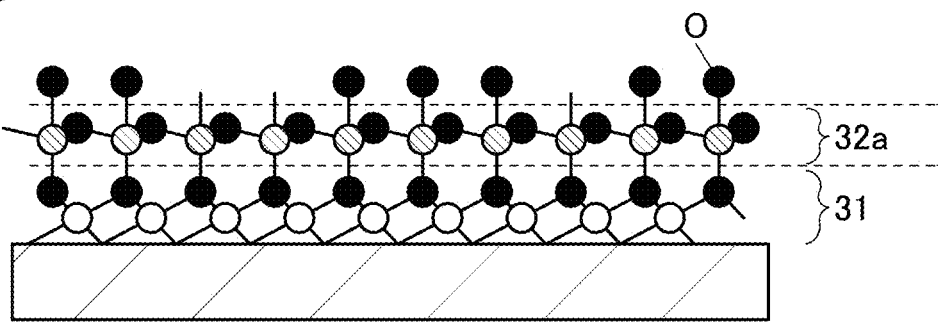

Then, an oxidizer introduced as a reactant into the chamber is reacted with the adsorbed precursor, and components other than the element M are released while the element M is adsorbed onto the substrate. Thus, the layer 32*a* composed of the element M and oxygen is formed (see FIG. 9D). At this time, part of oxygen contained in the layer 32*b* is adsorbed onto the layer 32*a* in some cases. After that, the chamber is purged, whereby an excess reactant, a reaction product, and the like are released from the chamber.

Figure 10A:
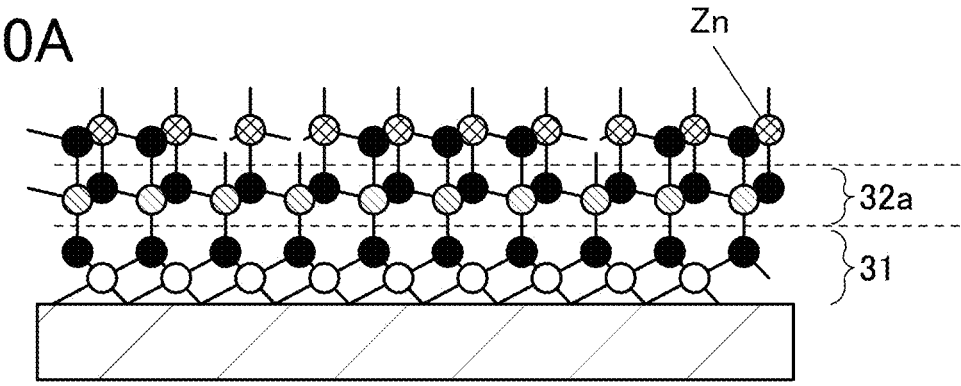
FIG. 10A to FIG. 10C are cross-sectional views illustrating a film formation method.
Figure 10B:
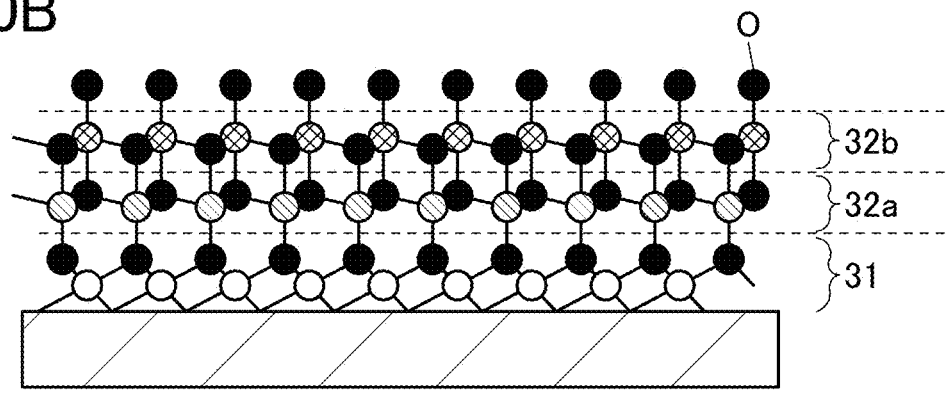

Next, a source gas that contains a precursor containing zinc is introduced into the chamber, so that the precursor is adsorbed onto the layer 32*a* (see FIG. 10A). At this time, part of the layer 32*b* composed of zinc and oxygen is formed in some cases. The source gas contains a carrier gas such as argon or nitrogen in addition to the precursor. Dimethylzinc, diethylzinc, bis(2,2,6,6-tetramethyl-3,5-heptanedione acid)zinc, or the like can be used as the precursor containing zinc. Next, the chamber is purged, whereby an excess precursor, a reaction product, and the like are released from the chamber.

Then, an oxidizer introduced as a reactant into the chamber is reacted with the adsorbed precursor, and components other than zinc are released while zinc is adsorbed onto the substrate. Thus, the layer 32*b* composed of zinc and oxygen is formed (see FIG. 10B). After that, the chamber is purged, whereby an excess reactant, a reaction product, and the like are released from the chamber. Note that a stack of the layers 32*a* and the layers 32*b* with a desired number of atoms, a desired number of layers, and a desired thickness may be formed between the two layers 31 when the layer 32*a* and the layer 32*b* are each formed a plurality of times before the formation of the subsequent layer 31.

Figure 10C:
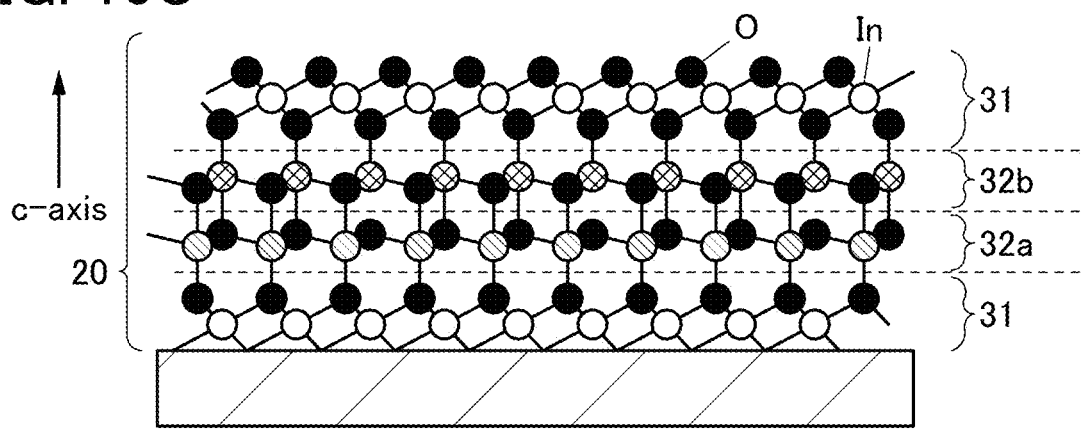

Next, the layer 31 is formed again over the layer 32*b* by the above-described method (see FIG. 10C). By repeating the above-described method, the metal oxide 20 can be formed over the substrate or the structure body.

As described above, an ALD method is employed, whereby the metal oxide having a structure in which the c-axis is aligned substantially parallel to the normal direction of the surface where the film is formed (a CAAC structure) can be formed.

As described above, an ALD method is a film formation method in which a film is formed by a reaction at a surface of an object. Thus, damage to an object during film formation can be minimized. Hence, a metal oxide formed by an ALD method sometimes has a larger crystal than a metal oxide formed by another film formation method. A larger crystal included in a metal oxide can shorten the distance between crystals or can increase the density of a region positioned between crystals.

As described above, an ALD method can control the composition of a film to be formed with the amount of introduced source gases. That is, an ALD method can be regarded as having high controllability of the composition (stoichiometric composition) of a metal oxide. Thus, film formation by an ALD method enables a metal oxide having a desired composition to be formed.

As described above, an ALD method enables formation of a film on a component with a high aspect ratio and also enables formation of a film with excellent coverage on a side surface of a structure body. By using an ALD method, a metal oxide having a CAAC structure can be easily formed regardless of the orientation of the surface where the film is formed. For example, a metal oxide with favorable coverage can be formed on a top surface, a bottom surface, a side surface, and a surface with a slope of a structure body even when the structure body has a projected shape or a recessed shape. In other words, a metal oxide that has a substantially uniform thickness in the normal direction can be formed on each surface where the film is formed. As for the metal oxide that is formed on each of the top surface, the bottom surface, the side surface, and the surface with the slope of the structure body, the ratio of the minimum thickness to the maximum thickness can be greater than or equal to 0.5 and less than or equal to 1, preferably greater than or equal to 0.7 and less than or equal to 1, further preferably greater than or equal to 0.9 and less than or equal to 1. At this time, in the case where the metal oxide has a crystal, the c-axis thereof is aligned in the direction substantially parallel to the normal direction of each surface where the film is formed. In other words, the c-axis is aligned perpendicular to each surface where the film is formed.

Figure 11A:
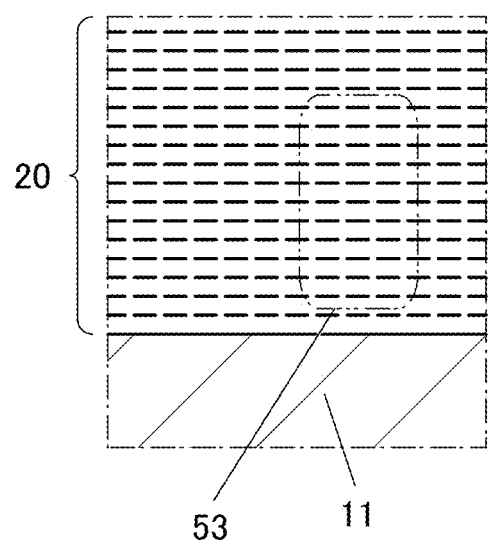
FIG. 11A to FIG. 11D are cross-sectional views of a metal oxide of one embodiment of the present invention.

FIG. 11A is a diagram illustrating the metal oxide 20 including an In-M-Zn oxide formed on the structure body 11. Here, the structure body refers to a component included in a semiconductor device such as a transistor. The structure body 11 includes a substrate, conductors such as a gate electrode, a source electrode, and a drain electrode, an insulator such as a gate insulating film, an interlayer insulating film, and a base insulating film, a semiconductor such as a metal oxide and silicon, and the like. The structure body 11 corresponds to the base film 10 illustrated in FIG. 1A. In FIG. 11A, a surface where the structure body 11 is formed is positioned parallel to a substrate (or a base, not illustrated).

Figure 11B:
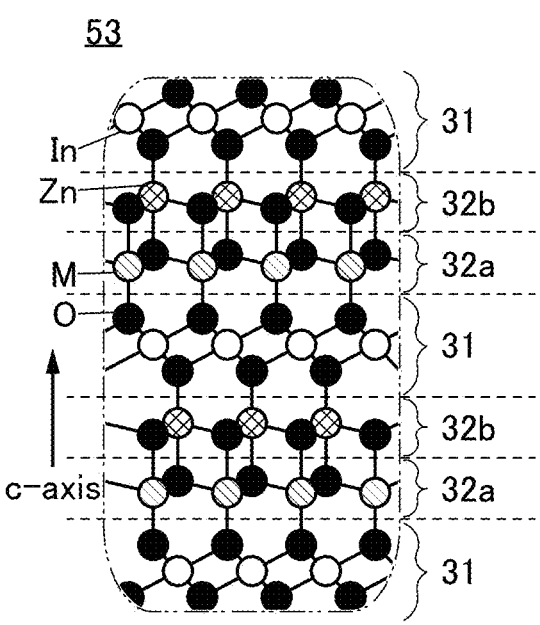

FIG. 11B is an enlarged view of a region 53 that is part of the metal oxide 20 in FIG. 11A. FIG. 11B illustrates a state in which the layer 31 containing indium (In), the layer 32a containing the element M, and the layer 32b containing zinc (Zn) are stacked over the top surface or the bottom surface of the structure body 11. The layer 31 is positioned parallel to the surface where the structure body 11 is formed, the layer 32a is positioned thereover to be parallel to the surface where the structure body 11 is formed, and further the layer 32b is positioned thereover to be parallel to the surface where the structure body 11 is formed. That is, the a-b plane of the metal oxide 20 is substantially parallel to the surface where the structure body 11 is formed, and the c-axis of the metal oxide 20 is substantially parallel to the normal direction of the surface where the structure body 11 is formed.

Figure 11C:
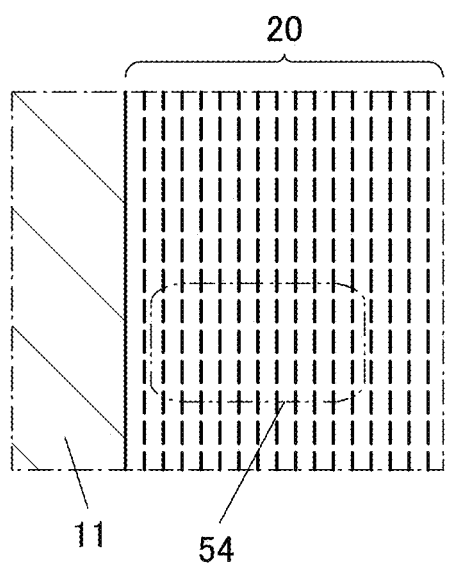
Figure 11D:
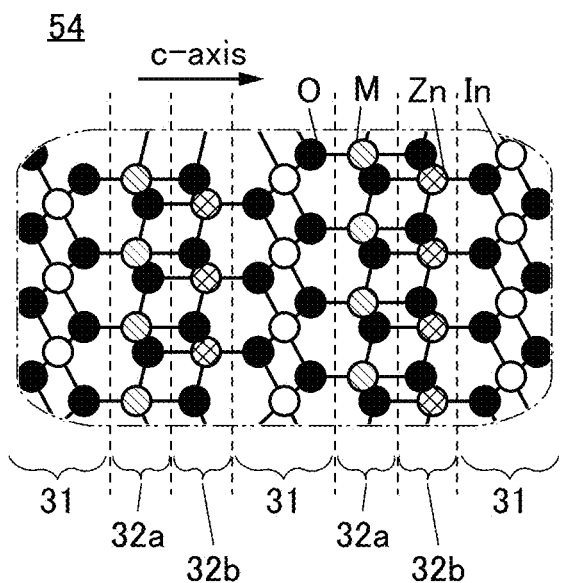

In FIG. 11C, the surface where the structure body 11 is formed is positioned perpendicular to a substrate (or a base, not illustrated). FIG. 11D is an enlarged view of a region 54 that is part of the metal oxide 20 in FIG. 11C. FIG. 11D illustrates a state in which the layer 31 containing indium (In), the layer 32a containing the element M, and the layer 32b containing zinc (Zn) are stacked over the side surface of the structure body 11. The layer 31 is positioned parallel to the surface where the structure body 11 is formed, the layer 32a is positioned thereover to be parallel to the surface where the structure body 11 is formed, and further the layer 32b is positioned thereover to be parallel to the surface where the structure body 11 is formed. That is, the a-b plane of the metal oxide 20 is substantially parallel to the surface where the structure body 11 is formed, and the c-axis of the metal oxide 20 is substantially parallel to the normal direction of the surface where the structure body 11 is formed.

Figure 12A:
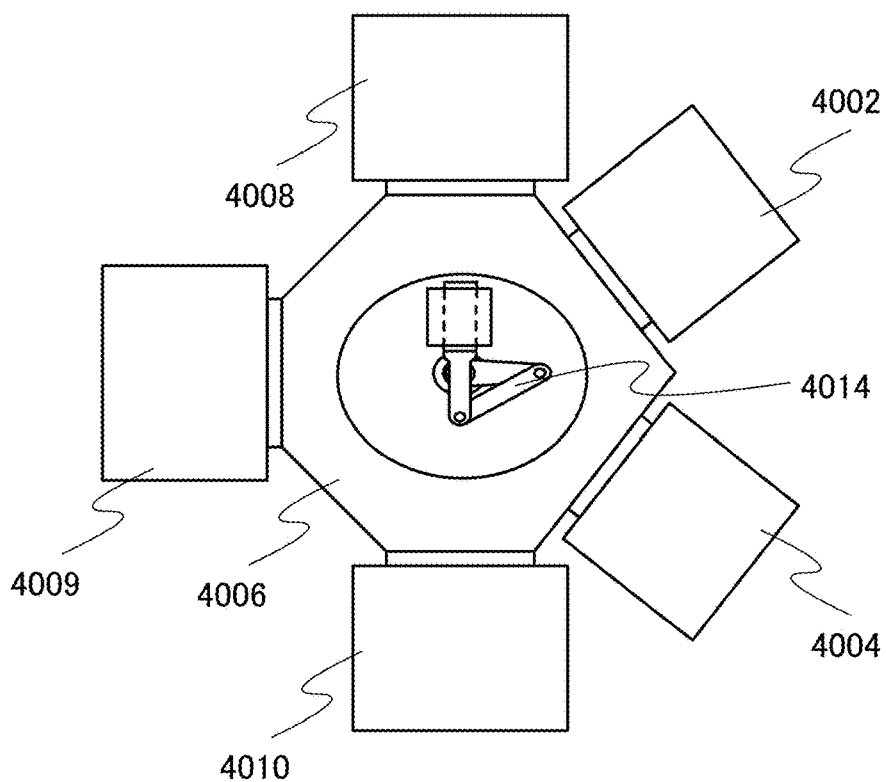
FIG. 12A is a top view illustrating a film formation apparatus.
Figure 12B:
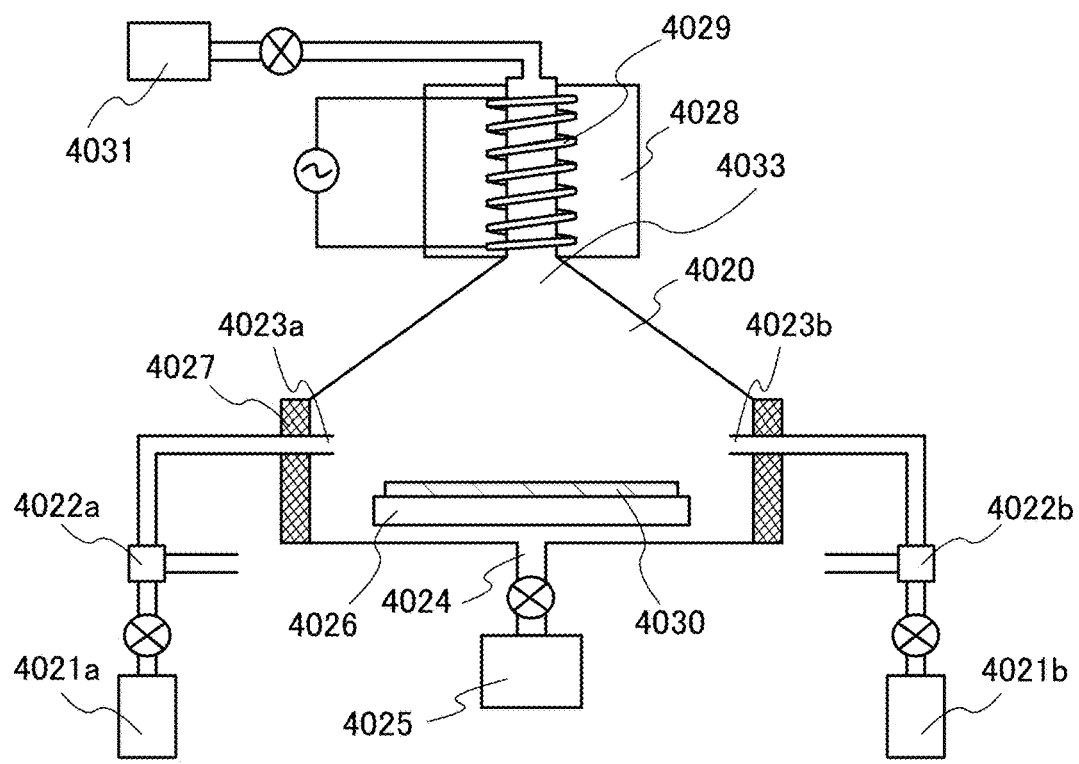
FIG. 12B is a cross-sectional view illustrating a film formation apparatus.

Here, the structure of a film formation apparatus 4000 will be described with reference to FIG. 12A and FIG. 12B as an example of an apparatus with which film formation can be performed by an ALD method. FIG. 12A is a schematic view of the multi-chamber type film formation apparatus 4000, and FIG. 12B is a cross-sectional view of an ALD apparatus that can be used for the film formation apparatus 4000.

[Structure Example of Film Formation Apparatus]

The film formation apparatus 4000 includes a carrying-in/out chamber 4002, a carrying-in/out chamber 4004, a transfer chamber 4006, a film formation chamber 4008, a film formation chamber 4009, a film formation chamber 4010, and a transfer arm 4014. Here, the carrying-in/out chamber 4002, the carrying-in/out chamber 4004, the film formation chamber 4008, the film formation chamber 4009, and the film formation chamber 4010 are each independently connected to the transfer chamber 4006. Thus, successive film formation can be performed in the film formation chamber 4008, the film formation chamber 4009, and the film formation chamber 4010 without exposure to the air, whereby entry of impurities into a film can be prevented. Moreover, contamination of an interface between a substrate and a film and interfaces between films can be reduced, so that clean interfaces can be obtained.

Note that in order to prevent attachment of moisture and the like, the carrying-in/out chamber 4002, the carrying-in/out chamber 4004, the transfer chamber 4006, and the film formation chamber 4008 to the film formation chamber 4010 are preferably filled with an inert gas (e.g., a nitrogen gas) whose dew point is controlled, and desirably maintain reduced pressure.

An ALD apparatus can be used as the film formation chamber 4008 to the film formation chamber 4010. Alternatively, a structure may be employed in which a film formation apparatus other than an ALD apparatus is used as any of the film formation chamber 4008 to the film formation chamber 4010. Examples of the film formation apparatus that can be used as any of the film formation chamber 4008 to the film formation chamber 4010 include a sputtering apparatus, a plasma CVD (PECVD: Plasma Enhanced CVD) apparatus, a thermal CVD (TCVD) apparatus, a photo CVD apparatus, a metal CVD (MCVD) apparatus, and a metal organic CVD (MOCVD) apparatus. An apparatus having a function other than a film formation apparatus may be provided in one or more of the film formation chamber 4008 to the film formation chamber 4010. Examples of the apparatus include a heating apparatus (typically, a vacuum heating apparatus) and a plasma generation apparatus (typically, μ-wave plasma generation apparatus).

For example, in the case where the film formation chamber 4008 is an ALD apparatus, the film formation chamber 4009 is a PECVD apparatus, and the film formation chamber 4010 is a metal CVD apparatus, a metal oxide can be formed in the film formation chamber 4008, an insulating film functioning as a gate insulating film can be formed in the film formation chamber 4009, and a conductive film functioning as a gate electrode can be formed in the film formation chamber 4010. At this time, the metal oxide, the insulating film thereover, and the conductive film thereover can be formed successively without exposure to the air.

Although the film formation apparatus 4000 has a structure including the carrying-in/out chamber 4002, the carrying-in/out chamber 4004, and the film formation chamber 4008 to the film formation chamber 4010, one embodiment of the present invention is not limited thereto. The number of film formation chambers in the film formation apparatus 4000 may be four or more. The film formation apparatus 4000 may be of a single-wafer type or may be of a batch type, in which case film formation is performed on a plurality of substrates at a time.

[ALD Apparatus]

Next, a structure of an ALD apparatus that can be used as the film formation apparatus 4000 will be described with reference to FIG. 12B. The ALD apparatus includes a film formation chamber (a chamber 4020), a source material supply portion 4021 (a source material supply portion 4021a and a source material supply portion 4021b), a source material supply portion 4031, a high-speed valve 4022a and a high-speed valve 4022b that are introduction amount controllers, a source material introduction port 4023 (a source material introduction port 4023a and a source material introduction port 4023b), a source material introduction port 4033, a source material exhaust port 4024, and an evacuation unit 4025. The source material introduction port 4023a, the source material introduction port 4023b, and the source material introduction port 4033 provided in the chamber 4020 are connected to the source material supply portion 4021a, the source material supply portion 4021b, and the source material supply portion 4031, respectively, through supply tubes and valves, and the source material exhaust port 4024 is connected to the evacuation unit 4025 through an exhaust tube, a valve, and a pressure controller.

A plasma generation apparatus 4028 is connected to the chamber 4020 as illustrated in FIG. 12B, whereby film formation can be performed by a plasma ALD method as well as a thermal ALD method. It is preferable that the plasma generation apparatus 4028 be an ICP-type plasma generation apparatus using a coil 4029 connected to a high-frequency power source. The high-frequency power source is capable of outputting power with a frequency higher than or equal to 10 kHz and lower than or equal to 100 MHz, preferably higher than or equal to 1 MHz and lower than or equal to 60 MHz, further preferably higher than or equal to 10 MHz and lower than or equal to 60 MHz. For example, power with a frequency of 13.56 MHz or 60 MHz can be output. A plasma ALD method enables film formation without decreasing the film formation rate even at low temperatures, and thus is preferably used for a single-wafer type film formation apparatus with low film formation efficiency.

A substrate holder 4026 exists in the chamber, and a substrate 4030 is put over the substrate holder 4026. The substrate holder 4026 may be provided with a mechanism to which a constant potential or a high-frequency wave is applied. Alternatively, the substrate holder 4026 may be floating or grounded. A heater 4027, which is provided on an outside wall of the chamber, can control the temperature inside the chamber 4020 and the temperatures of the substrate holder 4026, the surface of the substrate 4030, and the like. The heater 4027 is preferably capable of controlling the temperature of the surface of the substrate 4030 to higher than or equal to 100° C. and lower than or equal to 500° C., preferably higher than or equal to 200° C. and lower than or equal to 400° C., and is preferably capable of setting the temperature of the heater 4027 itself to higher than or equal to 100° C. and lower than or equal to 500° C.

In the source material supply portion 4021a, the source material supply portion 4021b, and the source material supply portion 4031, a source gas is formed from a solid source material or a liquid source material using a vaporizer, a heating unit, or the like. Alternatively, the source material supply portion 4021a, the source material supply portion 4021b, and the source material supply portion 4031 may supply a source gas.

Although FIG. 12B illustrates the example in which two source material supply portions 4021 and one source material supply portion 4031 are provided, this embodiment is not limited thereto. One or three or more source material supply portions 4021 may be provided. In addition, two or more source material supply portions 4031 may be provided. The high-speed valve 4022a and the high-speed valve 4022b can be precisely controlled by time and are configured to control supply of a source gas from the source material supply portion 4021a and supply of a source gas from the source material supply portion 4021b.

In the film formation apparatus illustrated in FIG. 12B, a thin film is formed over a substrate surface in such a manner that after the substrate 4030 is transferred onto the substrate holder 4026 and the chamber 4020 is sealed, the substrate 4030 is set to a desired temperature (e.g., higher than or equal to 100° C. and lower than or equal to 500° C., preferably higher than or equal to 200° C. and lower than or equal to 400° C.) by the heater 4027, and supply of the source gas from the source material supply portion 4021a, evacuation with the evacuation unit 4025, supply of the source gas from the source material supply portion 4031, and evacuation with the evacuation unit 4025 are repeated. Furthermore, in the formation of the thin film, supply of a source gas from the source material supply portion 4021b and evacuation with the evacuation unit 4025 may further be performed. The temperature of the heater 4027 is determined as appropriate depending on the kind of the film to be formed, the source gas, a desired film quality, and heat resistance of a substrate or a film or an element that is provided over the substrate. For example, the film formation may be performed with the temperature of the heater 4027 set to higher than or equal to 200° C. and lower than or equal to 300° C. or higher than or equal to 300° C. and lower than or equal to 500° C.

When film formation is performed while the substrate 4030 is heated by the heater 4027, heat treatment for the substrate 4030 that is necessary in a later step can be omitted. That is, with the use of the chamber 4020 or the film formation apparatus 4000 provided with the heater 4027, formation of a film over the substrate 4030 can also serve as heat treatment for the substrate 4030.

In the film formation apparatus illustrated in FIG. 12B, a metal oxide can be formed by appropriate selection of source materials (e.g., a volatile organometallic compound) used in the source material supply portion 4021 and the source material supply portion 4031. In the case where an In—Ga—Zn oxide, which contains indium, gallium, and zinc, is formed as the metal oxide, it is preferable to use a film formation apparatus provided with at least three source material supply portions 4021 and at least one source material supply portion 4031. It is preferable that a precursor containing indium be supplied from the first source material supply portion 4021, a precursor containing gallium be supplied from the second source material supply portion 4021, and a precursor containing zinc be supplied from the third source material supply portion 4021. In the case where precursors containing indium and gallium are used to form the metal oxide, at least two source material supply portions 4021 are provided. Any of the above-described precursors can be used as the precursor containing indium, the precursor containing gallium, and the precursor containing zinc.

A reactant is supplied from the source material supply portion 4031. An oxidizer containing at least one of ozone, oxygen, and water can be used as the reactant.

[Film Formation Sequence]

FIG. 13A shows a film formation sequence using the ALD apparatus illustrated in FIG. 12B. First, the substrate 4030 is set on the substrate holder 4026 in the chamber 4020 (Step S101). Next, the temperature of the heater 4027 is adjusted (Step S102). Then, the substrate 4030 is held on the substrate holder 4026 so that the temperature of the substrate 4030 becomes uniform in the substrate surface (Step S103). After that, film formation is performed through the first step to the fourth step that are described above. In other words, the first source gas and the second source gas are alternately introduced into the chamber 4020 to perform film formation over the substrate 4030 (Step S104). In addition, treatment for setting the inside of the chamber 4020 in an oxygen atmosphere may be performed between Step S103 and Step S104. The inside of the chamber 4020 is set in an oxygen atmosphere after setting and holding the substrate 4030, whereby oxygen can be added to the substrate 4030 and the film provided over the substrate 4030 in some cases. Furthermore, hydrogen can be released from the substrate 4030 before film formation and the film provided over the substrate 4030 in some cases. Hydrogen in the substrate 4030 or the film sometimes reacts with oxygen added to the substrate 4030 or the film, and is released from the substrate 4030 or the film as water ($H_2O$).

FIG. 13B shows a specific example of the above film formation sequence. In accordance with Step S101 to Step S103 described above, the substrate 4030 is set on the substrate holder 4026, the temperature of the heater 4027 is adjusted, and the substrate 4030 is held.

Next, the first source gas and the second source gas are alternately introduced to perform film formation over the substrate 4030 (Step S104). The first source gas and the second source gas are introduced in a pulsed form. In FIG. 13B, introductions of the first source gas and the second source gas are each indicated by ON, and periods during which the source gases are not introduced are each indicated by OFF. In periods during which neither the first source gas nor the second source gas is introduced, the chamber 4020 is evacuated. The pulse time of introducing the first source gas into the chamber 4020 is preferably longer than or equal to 0.1 seconds and shorter than or equal to 1 second, further preferably longer than or equal to 0.1 seconds and shorter than or equal to 0.5 seconds. The period during which the first source gas is not introduced is longer than or equal to 1 second and shorter than or equal to 15 seconds, preferably longer than or equal to 1 second and shorter than or equal to 5 seconds. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced is longer than or equal to 1 second and shorter than or equal to 15 seconds, preferably longer than or equal to 1 second and shorter than or equal to 5 seconds.

In the film formation, introduction of the first source gas (the first step), evacuation of the first source gas (the second step), introduction of the second source gas (the third step), and evacuation of the second source gas (the fourth step) are regarded as one cycle, and a film having a desired thickness is formed by repetition of this cycle.

In the case where treatment for setting the inside of the chamber 4020 in an oxygen atmosphere is performed between Step S103 and Step S104, the second source gas may be introduced into the chamber 4020. It is preferable that one or more selected from ozone ($O_3$), oxygen ($O_2$), and water ($H_2O$), which function as oxidizers, be introduced as the second source gas. In this embodiment, ozone ($O_3$) and oxygen ($O_2$) are used as the second source gas. In that case, the second source gas is preferably introduced in a pulsed form in a manner similar to that in Step S104; however, one embodiment of the present invention is not limited thereto. The second source gas may be successively introduced. In the period during which the second source gas is not introduced, the chamber 4020 is evacuated. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced is longer than or equal to 1 second and shorter than or equal to 15 seconds, preferably longer than or equal to 1 second and shorter than or equal to 5 seconds. When the second source gas such as an oxidizer is introduced into the chamber 4020, the substrate 4030 or the film provided over the substrate 4030 is exposed to the second source gas such as an oxidizer.

Note that after setting the substrate 4030 (Step S101), adjusting the temperature of the heater 4027 may be omitted if not needed. Moreover, after holding the substrate 4030 (Step S103), setting the inside of the chamber 4020 in an oxygen atmosphere may be omitted if not needed.

FIG. 13C shows an example of a sequence in the case where film formation is performed using two or more kinds of source gases containing precursors. In FIG. 13C, source gases containing precursors correspond to the first source gas, the third source gas, and a fourth source gas, and a source gas containing an oxidizer corresponds to the second source gas. In accordance with Step S101 to Step S103 described above, the substrate 4030 is set on the substrate holder 4026, the temperature of the heater 4027 is adjusted, and the substrate 4030 is held.

Next, the first source gas, the second source gas, the third source gas, the second source gas, the fourth source gas, and the second source gas are sequentially introduced to perform film formation over the substrate 4030 (Step S104). The first source gas to the fourth source gas are introduced in a pulsed form. In FIG. 13C, introductions of the first source gas to the fourth source gas are each indicated by ON, and periods during which the source gases are not introduced are each indicated by OFF. In periods during which none of the first source gas to the fourth source gas are introduced, the chamber 4020 is evacuated. The pulse time of introducing the first source gas, the third source gas, and the fourth source gas into the chamber 4020 is preferably longer than or equal to 0.1 seconds and shorter than or equal to 1 second, further preferably longer than or equal to 0.1 seconds and shorter than or equal to 0.5 seconds. The period during which the first source gas, the third source gas, and the fourth source gas are not introduced is longer than or equal to 1 second and shorter than or equal to 15 seconds, preferably longer than or equal to 1 second and shorter than or equal to 5 seconds. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced is longer than or equal to 1 second and shorter than or equal to 15 seconds, preferably longer than or equal to 1 second and shorter than or equal to 5 seconds.

In the film formation, introduction of the first source gas, evacuation of the first source gas, introduction of the second source gas, evacuation of the second source gas, introduction of the third source gas, evacuation of the third source gas, introduction of the second source gas, evacuation of the second source gas, introduction of the fourth source gas, evacuation of the fourth source gas, introduction of the second source gas, and evacuation of the second source gas are regarded as one cycle, and a film having a desired thickness is formed by repetition of this cycle.

For example, in the case where the first source gas contains a precursor containing indium, the third source gas contains a precursor containing gallium, and the fourth source gas contains a precursor containing zinc, an In—Ga—Zn oxide can be formed by the sequence shown in FIG. 13C.

Note that in the sequence shown in FIG. 13C, the order of introduction of the first source gas, the third source gas, and the fourth source gas is not limited thereto. Furthermore, the number of times of introduction of the first source gas, the third source gas, and the fourth source gas in one cycle is not necessarily one. A certain source gas is introduced a plurality of times in one cycle, whereby a film that has a high concentration of a metal element contained in the source gas can be formed. That is, the atomic ratio of a film to be formed can be controlled by change in the number of times of introduction of the gases. The first source gas, the third source gas, and the fourth source gas, or two kinds of source gases selected from these source gases may be introduced into the chamber 4020 concurrently.

The above is the description of the method for forming the metal oxide by an ALD method.

Note that a sputtering method may be used as the method for forming the metal oxide of one embodiment of the present invention.

In the case where the metal oxide is formed by a sputtering method, the crystallinity of the formed metal oxide can be increased as the substrate temperature (stage temperature) at the time of film formation is higher. The crystallinity of the formed metal oxide can be increased as the proportion of a flow rate of an oxygen gas to the whole film formation gas (also referred to as oxygen flow rate ratio) used at the time of film formation is higher. In this manner, the crystallinity of the metal oxide to be formed can be controlled by the substrate temperature and the oxygen flow rate ratio of the film formation gas.

[Heat Treatment]

Heat treatment is preferably performed after the metal oxide is formed by a sputtering method or an ALD method. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment performed using a highly purified gas can prevent entry of moisture or the like into the metal oxide as much as possible.

For example, as the heat treatment, treatment for one hour is performed with a flow rate ratio of a nitrogen gas to an oxygen gas of 4:1 at a temperature of 400° C. or higher and 550° C. or lower, preferably 420° C. or higher and 480° C. or lower after the formation of the metal oxide. For example, a flow rate of a nitrogen gas is set to 4 slm, and a flow rate of an oxygen gas is set to 1 slm. By the heat treatment, impurities such as water and hydrogen contained in the metal oxide can be removed, for example.

Particularly in the case where a metal oxide is formed by an ALD method using a precursor containing carbon, the metal oxide may contain carbon. By the heat treatment, carbon in the metal oxide can be removed as $CO_2$. In the case where a metal oxide is formed by an ALD method using a precursor containing hydrogen, the metal oxide may contain hydrogen. By the heat treatment, hydrogen in the metal oxide can be removed as $H_2O$.

Alternatively, the heat treatment can improve the crystallinity of the metal oxide. For example, the crystal included in the metal oxide can be made larger than that before the heat treatment. This can make the distance between crystals (e.g., the width of the region 22_1) small or can increase the density of a region (e.g., the region 22_1) positioned between crystals. Thus, formation of defects in the metal oxide 20 can be inhibited.

In the above manner, the metal oxide of one embodiment of the present invention can be formed.

<Classification of Crystal Structure>

Hereinafter, the classification of the crystal structures of a metal oxide (an oxide semiconductor) will be described.

First, the classification of the crystal structures of an oxide semiconductor will be described with reference to FIG. 14A. FIG. 14A is a diagram showing the classification of crystal structures of an oxide semiconductor, typically IGZO (a metal oxide containing In, Ga, and Zn).

As shown in FIG. 14A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 14A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 14B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 14B and obtained by GIXD measurement is hereinafter simply referred to as an XRD spectrum. The CAAC-IGZO film in FIG. 14B has a composition in the neighborhood of In:Ga:Zn=4:2:3 [atomic ratio]. The CAAC-IGZO film in FIG. 14B has a thickness of 500 nm.

In FIG. 14B, the horizontal axis represents 2θ [deg.], and the vertical axis represents Intensity [a.u.]. As shown in FIG. 14B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 14B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 14C shows a diffraction pattern of the CAAC-IGZO film. FIG. 14C shows a diffraction pattern obtained by NBED in which an electron beam is incident in the direction parallel to the substrate. The CAAC-IGZO film in FIG. 14C has a composition in the neighborhood of In:Ga:Zn=4:2:3 [atomic ratio]. In the nanobeam electron diffraction method, electron diffraction is performed with a probe diameter of 1 nm.

As shown in FIG. 14C, a plurality of spots indicating c-axis alignment are observed in the diffraction pattern of the CAAC-IGZO film.

<Metal Oxide Having CAAC Structure>

The details of a metal oxide having a CAAC structure will be described below.

The CAAC structure includes a plurality of crystals, and the plurality of crystals have c-axis alignment in a particular direction. Note that the particular direction refers to the thickness direction of the metal oxide having the CAAC structure, the normal direction of the surface where the metal oxide having the CAAC structure is formed, or the normal direction of the surface of the metal oxide having the CAAC structure. Note that a crystal region refers to a crystal itself included in the CAAC structure or a region including a crystal included in the CAAC structure and its vicinity. Thus, a crystal included in the CAAC structure is sometimes referred to as a crystal region included in the CAAC structure.

The crystal region refers to a region having a periodic atomic arrangement. When an atomic arrangement is regarded as a lattice arrangement, the crystal region also refers to a region with a uniform lattice arrangement. The CAAC structure has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the metal oxide having the CAAC structure is a metal oxide having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC structure tends to have a layered crystal structure (also referred to as a layered structure) in which a layer containing indium (In) and oxygen and a layer containing the element M, zinc (Zn), and oxygen are stacked. Note that the layer containing indium and oxygen sometimes contains the element M or zinc. The layer containing the element M, zinc, and oxygen sometimes contains indium. Such a layered structure is observed as a lattice image in a high-resolution TEM image, for example.

When the metal oxide having the CAAC structure is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the metal oxide.

For example, a plurality of bright spots are observed in the electron diffraction pattern of the metal oxide having the CAAC structure. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of the distortion in the metal oxide having the CAAC structure. That is, formation of a crystal grain boundary is inhibited by the distortion of lattice arrangement. This is probably because the metal oxide having the CAAC structure can tolerate distortion owing to a low density of arrangement of oxygen atoms in the a-b plane direction, an interatomic bond distance changed by substitution of a metal atom, or the like.

The metal oxide having the CAAC structure is a metal oxide with high crystallinity in which no clear crystal grain boundary is observed. That is, a reduction in electron mobility due to the crystal grain boundary is unlikely to occur in the metal oxide having the CAAC. Thus, the metal oxide having the CAAC structure is physically stable. Therefore, the metal oxide having the CAAC structure is resistant to heat and has high reliability. Hence, the metal oxide having the CAAC structure is one of crystalline oxides having a crystal structure suitable for a semiconductor layer of a transistor.

<Transistor Including Metal Oxide>

Next, the case where the metal oxide (oxide semiconductor) is used for a transistor will be described.

With the use of the metal oxide (oxide semiconductor) of one embodiment of the present invention for a transistor, a transistor with high field-effect mobility can be achieved. In addition, a transistor having high reliability can be achieved. Moreover, a miniaturized or highly integrated transistor can be achieved. For example, a transistor with a channel length of greater than or equal to 2 nm and less than or equal to 30 nm can be formed.

An oxide semiconductor with a low carrier concentration is preferably used for a channel formation region of the transistor. For example, the carrier concentration in an oxide semiconductor in the channel formation region is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge captured by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity in Metal Oxide>

Here, the influence of each impurity in the metal oxide (oxide semiconductor) will be described.

When silicon or carbon, which is one of Group 14 elements, is contained in the oxide semiconductor, defect states are formed in the oxide semiconductor. Thus, the concentration of silicon or carbon in the oxide semiconductor in the channel formation region and the concentration of silicon or carbon in the vicinity of an interface with the oxide semiconductor in the channel formation region (the concentrations obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor in the channel formation region, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor in the channel formation region, which is obtained by SIMS, is set lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor in the channel formation region is preferably reduced as much as possible. Specifically, the hydrogen concentration in the oxide semiconductor in the channel formation region, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When an oxide semiconductor with sufficiently reduced impurities is used for the channel formation region of the transistor, stable electrical characteristics can be given.

<Other Materials that can be Used for Semiconductor Layer of Transistor>

One embodiment of the present invention is not limited to the above-described metal oxide. For example, the above-described layered material may be used. Like the above-described metal oxide, the layered material sometimes includes the crystal 21_1, the crystal 21_2, and a region that is positioned between the crystal 21_1 and the crystal 21_2 and has a feature similar to that of the region 22_1.

The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the semiconductor layer of the transistor, a transition metal chalcogenide functioning as a semiconductor is preferably used, for example. Specific examples of the transition metal chalcogenide which can be used for the semiconductor layer of the transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

This embodiment can be implemented in an appropriate combination with the structures described in the other embodiments.

Embodiment 2

In this embodiment, an example of a semiconductor device including a transistor 200 using the metal oxide described in the above embodiment and a manufacturing method thereof will be described with reference to FIG. 15 to FIG. 27.

<Structure Example of Semiconductor Device>

Figure 15A:
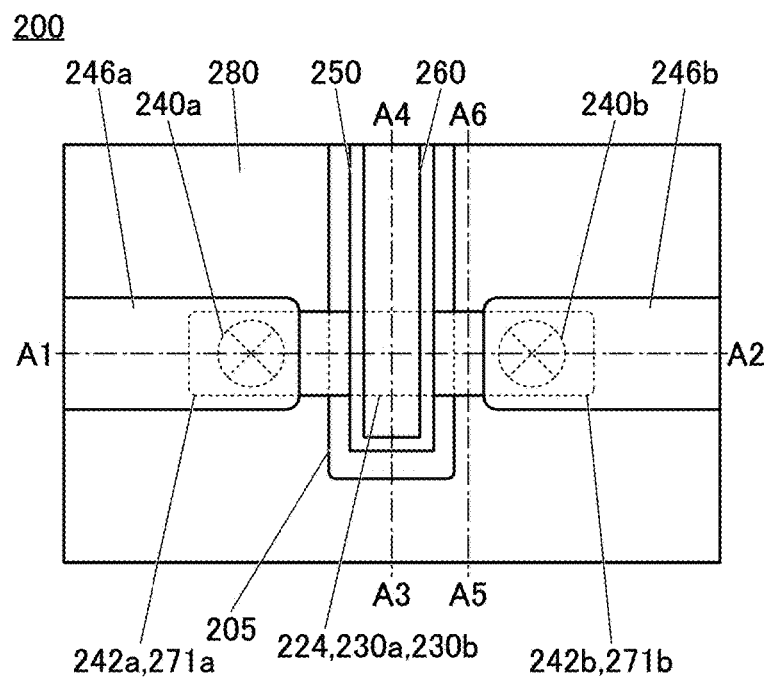
FIG. 15A is a top view of a semiconductor device of one embodiment of the present invention.
Figure 15C:
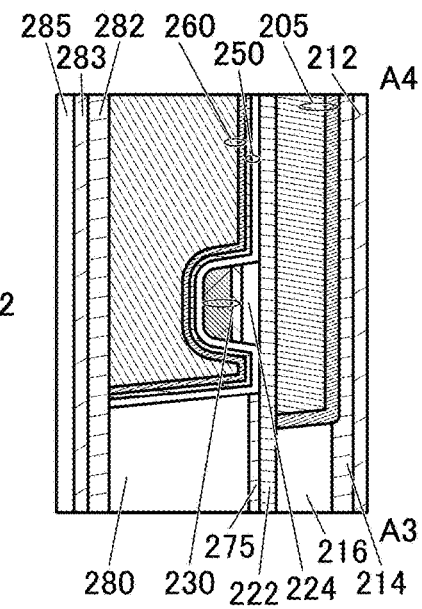
FIG. 15B to FIG. 15D are cross-sectional views of a semiconductor device of one embodiment of the present invention.
Figure 15B:
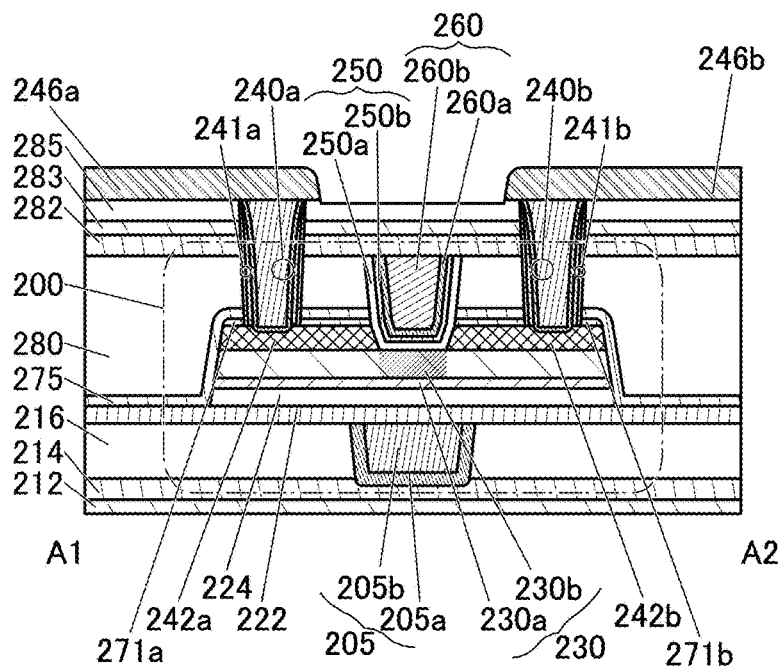
Figure 15D:
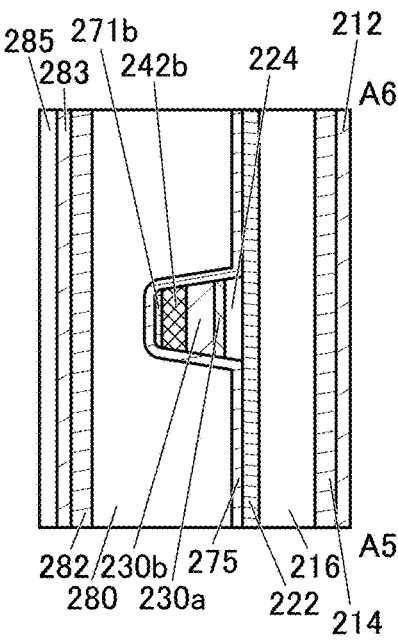

A structure of the semiconductor device including the transistor 200 is described with reference to FIG. 15. FIG. 15A to FIG. 15D are a top view and cross-sectional views of the semiconductor device including the transistor 200. FIG. 15A is the top view of the semiconductor device. FIG. 15B to FIG. 15D are the cross-sectional views of the semiconductor device. Here, FIG. 15B is a cross-sectional view of a portion indicated by the dashed-dotted line A1-A2 in FIG. 15A, and is a cross-sectional view of the transistor 200 in the channel length direction. FIG. 15C is a cross-sectional view of a portion indicated by the dashed-dotted line A3-A4 in FIG. 15A, and is a cross-sectional view of the transistor 200 in the channel width direction. FIG. 15D is a cross-sectional view of a portion indicated by the dashed-dotted line A5-A6 in FIG. 15A. Note that for clarity of the drawing, some components are omitted in the top view of FIG. 15A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, and an insulator 285 over the insulator 283. The insulator 212, the insulator 214, the insulator 280, the insulator 282, the insulator 283, and the insulator 285 function as interlayer insulating films. A conductor 240a and a conductor 240b that are electrically connected to the transistor 200 and function as plugs are also included. An insulator 241a is provided in contact with a side surface of the conductor 240a, and an insulator 241b is provided in contact with a side surface of the conductor 240b. A conductor 246a and a conductor 246b that are electrically connected to the conductor 240 and function as wirings are provided over the insulator 285, the conductor 240a, and the conductor 240b.

Hereinafter, the conductor 240a and the conductor 240b are sometimes collectively referred to as a conductor 240. The insulator 241a and the insulator 241b are sometimes collectively referred to as an insulator 241. The conductor 246a and the conductor 246b are sometimes collectively referred to as a conductor 246.

The insulator 241a is provided in contact with an inner wall of an opening in the insulator 280, the insulator 282, the insulator 283, and the insulator 285, and the conductor 240a is provided in contact with a side surface of the insulator 241a. In addition, the insulator 241b is provided in contact with an inner wall of the opening in the insulator 280, the insulator 282, the insulator 283, and the insulator 285, and the conductor 240b is provided in contact with a side surface of the insulator 241b. Note that the insulator 241 has a structure in which a first insulator is provided in contact with the inner wall of the opening and a second insulator is provided on the inner side. The conductor 240 has a structure in which a first conductor is provided in contact with the side surface of the insulator 241 and a second conductor is provided on the inner side.

Note that although the transistor 200 is illustrated to have a structure in which the first conductor of the insulator 241 and the second conductor of the insulator 241 are stacked, one embodiment of the present invention is not limited thereto. For example, the insulator 241 may be provided as a single layer or to have a stacked-layer structure of three or more layers. Moreover, although the transistor 200 is illustrated to have a structure in which the first conductor of the conductor 240 and the second conductor of the conductor 240 are stacked, one embodiment of the present invention is not limited thereto. For example, the conductor 240 may be provided as a single layer or to have a stacked-layer structure of three or more layers. In the case where a component has a stacked-layer structure, layers may be distinguished by ordinal numbers corresponding to the formation order.

[Transistor 200]

As illustrated in FIG. 15A to FIG. 15D, the transistor 200 includes an insulator 216 over the insulator 214; a conductor 205 (a conductor 205a and a conductor 205b) positioned to be embedded in the insulator 216; an insulator 222 over the insulator 216 and the conductor 205; an insulator 224 over the insulator 222; an oxide 230a over the insulator 224; an oxide 230b over the oxide 230a; a conductor 242a over the oxide 230b; an insulator 271a over the conductor 242a; a conductor 242b over the oxide 230b; an insulator 271b over the conductor 242b; an insulator 250 (an insulator 250a and an insulator 250b) over the oxide 230b; a conductor 260 (a conductor 260a and a conductor 260b) that is positioned over the insulator 250 and overlaps with part of the oxide 230b; and an insulator 275 positioned to cover the insulator 222, the insulator 224, the oxide 230a, the oxide 230b, the conductor 242a, the conductor 242b, the insulator 271a, and the insulator 271b.

Hereinafter, the oxide 230a and the oxide 230b are sometimes collectively referred to as an oxide 230. The conductor 242a and the conductor 242b are sometimes collectively referred to as a conductor 242. The insulator 271a and the insulator 271b are sometimes collectively referred to as an insulator 271.

An opening reaching the oxide 230b is provided in the insulator 280 and the insulator 275. The insulator 250 and the conductor 260 are positioned in the opening. In addition, in the channel length direction of the transistor 200, the conductor 260 and the insulator 250 are provided between the insulator 271a and the conductor 242a and the insulator 271b and the conductor 242b. The insulator 250 includes a region in contact with a side surface of the conductor 260 and a region in contact with a bottom surface of the conductor 260.

The oxide 230 preferably includes the oxide 230a positioned over the insulator 224 and the oxide 230b positioned over the oxide 230a. With the oxide 230a positioned under the oxide 230b, diffusion of impurities from components formed below the oxide 230a into the oxide 230b can be inhibited.

Note that although the transistor 200 is illustrated to have a structure in which two layers, the oxide 230a and the oxide 230b, are stacked as the oxide 230, one embodiment of the present invention is not limited thereto. For example, the oxide 230 may be provided as a single layer of the oxide 230b or to have a stacked-layer structure of three or more layers, or the oxide 230a and the oxide 230b may each have a stacked-layer structure.

The conductor 260 functions as a first gate (also referred to as top gate) electrode, and the conductor 205 functions as a second gate (also referred to as back gate) electrode. The insulator 250 functions as a first gate insulating film, and the insulator 224 and the insulator 222 function as a second gate insulating film. The conductor 242a functions as one of a source electrode and a drain electrode, and the conductor 242b functions as the other of the source electrode and the drain electrode. A region of the oxide 230 that overlaps with the conductor 260 at least partly functions as a channel formation region.

The metal oxide described in the above embodiment (hereinafter, also referred to as an oxide semiconductor) can be used for the oxide 230 (the oxide 230a and the oxide 230b) including the channel formation region of the transistor 200.

The metal oxide described in the above embodiment can function as a semiconductor. At this time, the metal oxide has a band gap of 2 eV or more, or 2.5 eV or more. The use of a metal oxide having such a wide band gap can reduce the off-state current of a transistor.

As the oxide 230, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used, as described in the above embodiment. Alternatively, an In—Ga oxide, an In—Zn oxide, or indium oxide may be used as the oxide 230.

The atomic ratio of In to the element M in the metal oxide used as the oxide 230b is preferably greater than the atomic ratio of In to the element M in the metal oxide used as the oxide 230a.

The oxide 230a is positioned under the oxide 230b, whereby impurities and oxygen can be inhibited from diffusing into the oxide 230b from components formed below the oxide 230a.

When the oxide 230a and the oxide 230b contain a common element (as the main component) besides oxygen, the density of defect states at the interface between the oxide 230a and the oxide 230b can be low. Since the density of defect states at the interface between the oxide 230a and the oxide 230b can be decreased, the influence of interface scattering on carrier conduction is small, and a high on-state current can be obtained.

A metal oxide having high crystallinity, such as a CAAC-OS, has a dense structure with small amounts of impurities and defects (e.g., oxygen vacancies); thus, oxygen extraction from the oxide 230b by the source electrode or the drain electrode can be inhibited. This can reduce oxygen extraction from the oxide 230b even when heat treatment is performed; thus, the transistor 200 is stable with respect to high temperatures in a manufacturing process (what is called thermal budget).

Figure 16A:
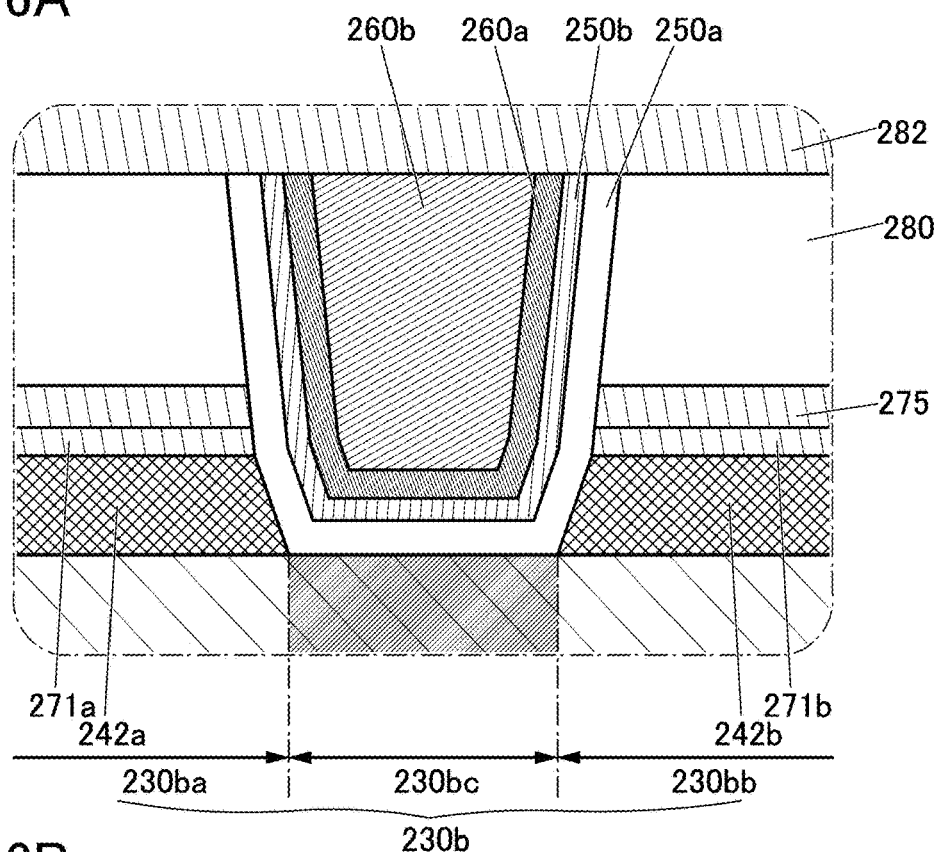
FIG. 16A and FIG. 16B are cross-sectional views of a semiconductor device of one embodiment of the present invention.

Here, FIG. 16A is an enlarged view of the vicinity of the channel formation region of the transistor 200. Supply of oxygen to the oxide 230b forms the channel formation region in a region between the conductor 242a and the conductor 242b. Thus, as illustrated in FIG. 16A, the oxide 230b includes a region 230bc functioning as the channel formation region of the transistor 200 and a region 230ba and a region 230bb that are provided to sandwich the region 230bc and function as a source region and a drain region. At least part of the region 230bc overlaps with the conductor 260. In other words, the region 230bc is provided between the conductor 242a and the conductor 242b. The region 230ba is provided to overlap with the conductor 242a, and the region 230bb is provided to overlap with the conductor 242b.

The region 230bc functioning as the channel formation region is a high-resistance region with a low carrier concentration because it includes a smaller amount of oxygen vacancies or has a lower impurity concentration than the region 230ba and the region 230bb. Thus, the region 230bc can be regarded as being i-type (intrinsic) or substantially i-type.

The region 230ba and the region 230bb functioning as the source region and the drain region are each a low-resistance region with an increased carrier concentration because it includes a large amount of oxygen vacancies or has a high concentration of an impurity such as hydrogen, nitrogen, or a metal element. In other words, the region 230ba and the region 230bb are each an n-type region having a higher carrier concentration and a lower resistance than the region 230bc.

The carrier concentration in the region 230bc functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration in the region 230bc functioning as the channel formation region is not particularly limited and can be, for example, $1\times10^{-9}$ cm$^{-3}$.

A region having a carrier concentration that is lower than or substantially equal to the carrier concentrations in the region 230ba and the region 230bb and higher than or substantially equal to the carrier concentration in the region 230bc is formed between the region 230bc and the region 230ba or the region 230bb. That is, the region functions as a junction region between the region 230bc and the region 230ba or the region 230bb. The hydrogen concentration in the junction region is sometimes lower than or substantially equal to the hydrogen concentrations in the region 230ba and the region 230bb and higher than or substantially equal to the hydrogen concentration in the region 230bc. The amount of oxygen vacancies in the junction region is sometimes smaller than or substantially equal to the amounts of oxygen vacancies in the region 230ba and the region 230bb and larger than or substantially equal to the amount of oxygen vacancies in the region 230bc.

Although FIG. 16A illustrates an example in which the region 230ba, the region 230bb, and the region 230bc are formed in the oxide 230b, one embodiment of the present invention is not limited thereto. For example, the above regions may be formed not only in the oxide 230b but also in the oxide 230a.

In the oxide 230, the boundaries between the regions are difficult to detect clearly in some cases. The concentration of a metal element and an impurity element such as hydrogen and nitrogen, which is detected in each region, may be not only gradually changed between the regions, but also continuously changed in each region. That is, the region closer to the channel formation region preferably has a lower concentration of a metal element and an impurity element such as hydrogen and nitrogen.

As illustrated in FIG. 15C, a curved surface may be provided between a side surface of the oxide 230b and a top surface of the oxide 230b in the cross-sectional view in the channel width direction of the transistor 200. That is, an end portion of the side surface and an end portion of the top surface may be curved (such a shape is also referred to as a rounded shape).

The radius of curvature of the curved surface is preferably greater than 0 nm and less than the thickness of the oxide 230b in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230b with the insulator 250 and the conductor 260.

The oxide 230 preferably has a stacked-layer structure of a plurality of oxide layers with different chemical compositions. Specifically, the atomic ratio of the element M to the metal element of the main component in the metal oxide used as the oxide 230a is preferably greater than the atomic ratio of the element M to the metal element of the main component in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a.

Here, the conduction band minimum gradually changes at a junction portion of the oxide 230a and the oxide 230b. In other words, the conduction band minimum at the junction portion of the oxide 230a and the oxide 230b continuously changes or is continuously connected. To obtain this, the density of defect states in a mixed layer formed at the interface between the oxide 230a and the oxide 230b is preferably decreased.

Specifically, when the oxide 230a and the oxide 230b contain a common element as a main component besides oxygen, a mixed layer with a low density of defect states can be formed. For example, in the case where the oxide 230b is an In-M-Zn oxide, an In-M-Zn oxide, an M-Zn oxide, an oxide of the element M, an In—Zn oxide, indium oxide, or the like may be used as the oxide 230a.

Specifically, as the oxide 230a, a metal oxide with In:M:Zn=1:3:4 [atomic ratio] or a composition in the neighborhood thereof, or In:M:Zn=1:1:0.5 [atomic ratio] or a composition in the neighborhood thereof is used. As the oxide 230b, a metal oxide with In:M:Zn=1:1:1 [atomic ratio] or a composition in the neighborhood thereof, In:M:Zn=4:2:3 [atomic ratio] or a composition in the neighborhood thereof, or In:M:Zn=5:1:3 [atomic ratio] or a composition in the neighborhood thereof is used. Note that a composition in the neighborhood includes the range of ±30% of an intended atomic ratio. Gallium is preferably used as the element M.

When the metal oxide is formed by a sputtering method, the above atomic ratio is not limited to the atomic ratio of the formed metal oxide and may be the atomic ratio of a sputtering target used for forming the metal oxide.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

Although the oxide 230 in the transistor 200 has a structure in which two layers of the oxide 230a and the oxide 230b are stacked, one embodiment of the present invention is not limited thereto. For example, a single layer of the oxide 230b or a stacked-layer structure of three or more layers may be provided. Each of the oxide 230a and the oxide 230b may have a stacked-layer structure. In the case where the oxide 230 has a stacked-layer structure of three or more layers, like the insulator 250, part of the stacked-layer structure of the oxide 230 may be formed in the opening formed in the insulator 280 and the insulator 275.

At least one of the insulator 212, the insulator 214, the insulator 271, the insulator 275, the insulator 282, and the insulator 283 preferably functions as a barrier insulating film, which inhibits diffusion of impurities such as water and hydrogen from the substrate side or above the transistor 200 into the transistor 200. Thus, for at least one of the insulator 212, the insulator 214, the insulator 271, the insulator 275, the insulator 282, and the insulator 283, an insulating material which has a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities do not easily pass) is preferably used. Alternatively, it is preferable to use an insulating material which has a function of inhibiting diffusion of oxygen (e.g., at least one of an oxygen atom, an oxygen molecule, and the like) (through which the above oxygen does not easily pass).

Note that in this specification, a barrier insulating film refers to an insulating film having a barrier property. A barrier property in this specification means a function of inhibiting diffusion of a targeted substance (also referred to as having low permeability). Alternatively, a barrier property in this specification means a function of capturing and fixing (also referred to as gettering) a targeted substance.

Aluminum oxide, magnesium oxide, hafnium oxide, gallium oxide, indium gallium zinc oxide, silicon nitride, or silicon nitride oxide can be used for the insulator 212, the insulator 214, the insulator 271, the insulator 275, the insulator 282, and the insulator 283, for example. For example, silicon nitride, which has a higher hydrogen barrier property, is preferably used for the insulator 212, the insulator 275, and the insulator 283. For example, aluminum oxide or magnesium oxide, which has a function of capturing or fixing more hydrogen, is preferably used for the insulator 214, the insulator 271, and the insulator 282. In this case, impurities such as water and hydrogen can be inhibited from diffusing to the transistor 200 side from the substrate side through the insulator 212 and the insulator 214. Impurities such as water and hydrogen can be inhibited from diffusing to the transistor 200 side from an interlayer insulating film and the like which are provided outside the insulator 283. Alternatively, oxygen contained in the insulator 224 or the like can be inhibited from diffusing to the substrate side through the insulator 212 and the insulator 214. Alternatively, oxygen contained in the insulator 280 and the like can be inhibited from diffusing to the components above the transistor 200 through the insulator 282 and the like. In this manner, it is preferable that the transistor 200 be surrounded with the insulator 212, the insulator 214, the insulator 271, the insulator 275, the insulator 282, and the insulator 283, which have a function of inhibiting diffusion of oxygen and impurities such as water and hydrogen.

Here, an oxide having an amorphous structure is preferably used for at least one of the insulator 212, the insulator 214, the insulator 271, the insulator 275, the insulator 282, and the insulator 283. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided in the vicinity of the transistor 200, hydrogen contained in the transistor 200 or hydrogen in the vicinity of the transistor 200 can be captured or fixed. In particular, hydrogen contained in the channel formation region of the transistor 200 is preferably captured or fixed. The metal oxide having an amorphous structure is used as the component of the transistor 200 or provided in the vicinity of the transistor 200, whereby the transistor 200 and a semiconductor device which have favorable characteristics and high reliability can be manufactured.

Although at least one of the insulator 212, the insulator 214, the insulator 271, the insulator 275, the insulator 282, and the insulator 283 preferably has an amorphous structure, at least one thereof may partly include a region with a polycrystalline structure. Alternatively, at least one of the insulator 212, the insulator 214, the insulator 271, the insulator 275, the insulator 282, and the insulator 283 may have a multilayer structure in which a layer with an amorphous structure and a layer with a polycrystalline structure are stacked. For example, a stacked-layer structure in which a layer with a polycrystalline structure is formed over a layer with an amorphous structure may be employed.

The insulator 212, the insulator 214, the insulator 271, the insulator 275, the insulator 282, and the insulator 283 can be formed by a sputtering method, for example. Since a sputtering method does not need to use hydrogen as a film formation gas, the hydrogen concentrations in the insulator 212, the insulator 214, the insulator 271, the insulator 275, the insulator 282, and the insulator 283 can be reduced. The film formation method is not limited to a sputtering method; a CVD method, an MBE method, a PLD method, an ALD method, or the like may be used as appropriate. For example, the insulator 275 may be formed by an ALD method with relatively favorable coverage. Among ALD methods, a PEALD method that can set the film formation temperature to be relatively low may be employed.

The resistivities of the insulator 212 and the insulator 283 are preferably low in some cases. For example, by setting the resistivities of the insulator 212 and the insulator 283 to approximately $1\times10^{13}$ Ωcm, the insulator 212 and the insulator 283 can sometimes reduce charge up of the conductor 205, the conductor 242, the conductor 260, or the conductor 246 in treatment using plasma or the like in the manufacturing process of a semiconductor device. The resistivities of the insulator 212 and the insulator 283 are preferably higher than or equal to $1\times10^{10}$ Ωcm and lower than or equal to $1\times10^{15}$ Ωcm.

The insulator 216 and the insulator 280 preferably have a lower permittivity than the insulator 214. When a material with a low permittivity is used for an interlayer insulating film, parasitic capacitance generated between wirings can be reduced. For the insulator 216 and the insulator 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The conductor 205 is positioned to overlap with the oxide 230 and the conductor 260. Here, the conductor 205 is preferably provided to be embedded in an opening formed in the insulator 216. Part of the conductor 205 is sometimes embedded in the insulator 214.

The conductor 205 includes the conductor 205a and the conductor 205b. The conductor 205a is provided in contact with a bottom surface and a sidewall of the opening. The conductor 205b is provided to be embedded in a depression portion formed in the conductor 205a. Here, the level of the top surface of the conductor 205b is substantially the same as the level of the top surface of the conductor 205a and the level of the top surface of the insulator 216.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a is formed using a conductive material having a function of inhibiting diffusion of hydrogen, impurities such as hydrogen contained in the conductor 205b can be prevented from diffusing into the oxide 230 through the insulator 224 and the like. When the conductor 205a is formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 205a. For example, titanium nitride is used for the conductor 205a.

Moreover, the conductor 205b is preferably formed using a conductive material containing tungsten, copper, or aluminum as its main component. For example, tungsten is used for the conductor 205b.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205 than in the case where a potential is not applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied.

As illustrated in FIG. 15A, the conductor 205 is preferably provided to be larger than a region of the oxide 230 that does not overlap with the conductor 242a or the conductor 242b. As illustrated in FIG. 15C, it is particularly preferable that the conductor 205 extend to a region outside end portions of the oxide 230a and the oxide 230b that intersect with the channel width direction. That is, the conductor 205 and the conductor 260 preferably overlap with each other with the insulators therebetween on the outer side of a side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, the S-channel structure refers to a transistor structure in which a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

Furthermore, as illustrated in FIG. 15C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 is illustrated to have a structure in which the conductor 205 has a stacked-layer structure of the conductor 205a and the conductor 205b, one embodiment of the present invention is not limited thereto. For example, the conductor 205 may be provided as a single layer or to have a stacked-layer structure of three or more layers.

The insulator 222 and the insulator 224 function as a gate insulating film.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

For the insulator 222, an insulator containing an oxide of one or both of aluminum and hafnium, which is an insulating material, is preferably used. It is preferable that aluminum oxide, hafnium oxide, an oxide containing aluminum and hafnium (hafnium aluminate), or the like be used for the insulator. In the case where the insulator 222 is formed using such a material, the insulator 222 functions as a layer that inhibits release of oxygen from the oxide 230 to the substrate side or diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 222.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current might arise because of a thinner gate insulator. When a high-k material is used for the insulator functioning as a gate insulator, a gate potential during operation of the transistor can be reduced while the physical thickness of the gate insulator is maintained.

Silicon oxide or silicon oxynitride, for example, can be used as appropriate for the insulator 224 that is in contact with the oxide 230. When the insulator 224 containing oxygen is provided in contact with the oxide 230, oxygen vacancies in the oxide 230 can be reduced, leading to an improvement in the reliability of the transistor 200. The insulator 224 is preferably processed into an island shape so as to overlap with the oxide 230a. In that case, the insulator 275 is in contact with a side surface of the insulator 224 and a top surface of the insulator 222. With such a structure, the volume of the insulator 224 can be reduced greatly and the insulator 224 and the insulator 280 can be isolated from each other by the insulator 275. Thus, oxygen contained in the insulator 280 can be inhibited from diffusing into the insulator 224 and oxygen in the insulator 224 can be inhibited from being in excess.

Note that the insulator 222 and the insulator 224 may each have a stacked-layer structure of two or more layers. In that case, without limitation to a stacked-layer structure formed of the same material, a stacked-layer structure formed of different materials may be employed. Note that FIG. 15B and the like illustrate the structure in which the insulator 224 is formed into an island shape so as to overlap with the oxide 230a; however, one embodiment of the present invention is not limited thereto. In the case where the amount of oxygen contained in the insulator 224 can be adjusted appropriately, a structure in which the insulator 224 is not patterned in a manner similar to that of the insulator 222 may be employed.

In a manufacturing process of the transistor 200, heat treatment is preferably performed with a surface of the oxide 230 exposed. The heat treatment is performed at higher than or equal to 100° C. and lower than or equal to 600° C., preferably higher than or equal to 350° C. and lower than or equal to 550° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies (V$_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 230 can promote a reaction in which oxygen vacancies in the oxide 230 are repaired with supplied oxygen, i.e., a reaction of "V$_O$+O→null". Furthermore, hydrogen remaining in the oxide 230 reacts with supplied oxygen, so that the hydrogen can be removed as H$_2$O (dehydration). This can inhibit recombination of hydrogen remaining in the oxide 230 with oxygen vacancies and formation of V$_O$H.

The conductor 242a and the conductor 242b are preferably provided in contact with a top surface of the oxide 230b. The conductor 242a and the conductor 242b function as a source electrode and a drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

Here, a film with large compressive stress is preferably used for the conductor 242; for example, tantalum nitride deposited by a sputtering method is preferably used. When the crystal structures of the region 230ba and the region 230bb are distorted by the stress of the conductor 242, oxygen vacancies are easily formed in these regions. Thus, the amounts of $V_OH$ formed in the region 230ba and the region 230bb are increased, whereby the carrier concentrations in the region 230ba and the region 230bb are increased, making the region 230ba and the region 230bb n-type regions.

Note that hydrogen contained in the oxide 230b or the like is diffused into the conductor 242a or the conductor 242b in some cases. In particular, when a nitride containing tantalum is used for the conductor 242a and the conductor 242b, hydrogen contained in the oxide 230b or the like is likely to be diffused into the conductor 242a or the conductor 242b, and the diffused hydrogen is bonded to nitrogen contained in the conductor 242a or the conductor 242b in some cases. That is, hydrogen contained in the oxide 230b or the like is sometimes absorbed by the conductor 242a or the conductor 242b in some cases.

No curved surface is preferably formed between a side surface of the conductor 242 and a top surface of the conductor 242. When no curved surface is formed in the conductor 242, the conductor 242 can have a large cross-sectional area in the channel width direction as illustrated in FIG. 15D. Accordingly, the conductivity of the conductor 242 is increased, so that the on-state current of the transistor 200 can be increased.

The insulator 271a is provided in contact with the top surface of the conductor 242a, and the insulator 271b is provided in contact with the top surface of the conductor 242b. The insulator 271 preferably has a function of capturing impurities such as hydrogen. In that case, for the insulator 271, a metal oxide having an amorphous structure, for example, an insulator such as aluminum oxide or magnesium oxide may be used. It is particularly preferable to use aluminum oxide having an amorphous structure or aluminum oxide with an amorphous structure for the insulator 271 because hydrogen can be captured or fixed more effectively in some cases. Accordingly, the transistor 200 and a semiconductor device which have favorable characteristics and high reliability can be manufactured.

The insulator 271 preferably functions as a barrier insulating film against oxygen. Thus, the insulator 271 preferably has a function of inhibiting oxygen diffusion. For example, the insulator 271 preferably has a function of inhibiting diffusion of oxygen more than the insulator 280. In this case, a nitride containing silicon such as silicon nitride may be used for the insulator 271, for example.

The insulator 275 is provided in contact with the top surface of the insulator 222, the side surface of the insulator 224, a side surface of the oxide 230a, a side surface of the oxide 230b, the side surface of the conductor 242, and a side surface and a top surface of the insulator 271. The insulator 275 includes the opening formed in a region where the insulator 250 and the conductor 260 are provided.

The insulator 275 preferably functions as a barrier insulating film that inhibits passage of oxygen. In addition, the insulator 275 preferably functions as a barrier insulating film that inhibits the diffusion of impurities such as water and hydrogen and preferably has a function of capturing impurities such as hydrogen. As the insulator 275, a single layer or a stacked layer of an insulator such as aluminum oxide or silicon nitride is used. For example, an aluminum oxide film with an amorphous structure is provided and a silicon nitride film is provided thereover. Such a stacked-layer structure is preferable because of its high hydrogen and oxygen barrier property compared with a single layer of an aluminum oxide film or a single layer of a silicon nitride film.

When the above insulator 271 and the insulator 275 are provided, the conductor 242 can be surrounded by the insulators having a barrier property against oxygen. That is, oxygen contained in the insulator 224, the insulator 280, and the insulator 250a can be prevented from diffusing into the conductor 242. As a result, the conductor 242 can be inhibited from being directly oxidized by oxygen contained in the insulator 224, the insulator 280, and the insulator 250a, so that an increase in resistivity and a reduction in an on-state current can be inhibited.

The insulator 214, the insulator 271, and the insulator 275, which have a function of capturing impurities such as hydrogen, are provided in a region sandwiched between the insulator 212 and the insulator 275, whereby impurities such as hydrogen contained in the insulator 224, the insulator 216, or the like can be captured and the amount of hydrogen in the region can be kept constant. In that case, at least part of the insulator 275 preferably contains aluminum oxide with an amorphous structure.

The insulator 250 includes the insulator 250a and the insulator 250b over the insulator 250a and functions as a gate insulating film. The insulator 250a is preferably positioned in contact with a top surface of the oxide 230b and the side surface of the insulator 280. The thickness of the insulator 250 is preferably greater than or equal to 1 nm and less than or equal to 20 nm.

For the insulator 250a, silicon oxide, silicon oxynitride, silicon nitride oxide, silicon nitride, silicon oxide to which fluorine is added, porous silicon oxide, or the like can be used. In particular, silicon oxide and silicon oxynitride, which have thermal stability, are preferable. The carbon content in the insulator 250a is preferably as low as possible.

However, one embodiment of the present invention is not limited thereto and the insulator 250a may contain carbon. For example, the carbon concentration in the insulator 250a by SIMS analysis is preferably higher than or equal to $1 \times 10^{18}$ atoms/cm$^3$ and lower than or equal to $5 \times 10^{20}$ atoms/cm$^3$, further preferably higher than or equal to $5 \times 10^{18}$ atoms/cm$^3$ and lower than or equal to $1 \times 10^{20}$ atoms/cm$^3$. The carbon concentration in the insulator 250a can be measured by SIMS analysis or the like.

As in the insulator 224, the concentration of impurities such as water and hydrogen in the insulator 250a is preferably reduced.

It is preferable that the insulator 250a be formed using an insulator from which oxygen is likely to diffuse by heating and the insulator 250b be formed using an insulator having a function of inhibiting diffusion of oxygen. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, the insulator 250b can be formed using a material similar to that used for the insulator 222.

In the case where silicon oxide, silicon oxynitride, or the like is used for the insulator 250a, the insulator 250b may be formed using an insulating material that is a high-k material having a high relative permittivity. The gate insulator having a stacked-layer structure of the insulator 250a and the insulator 250b can be thermally stable and can have a high relative permittivity. Thus, a gate potential that is applied during operation of the transistor can be reduced while the physical thickness of the gate insulator is maintained. In addition, the equivalent oxide thickness (EOT) of the insulator functioning as the gate insulator can be reduced.

Specifically, as the insulator 250b, a metal oxide containing one kind or two or more kinds selected from hafnium, aluminum, gallium, yttrium, zirconium, tungsten, titanium, tantalum, nickel, germanium, magnesium, and the like or a metal oxide that can be used as the oxide 230 can be used. In particular, an insulator containing an oxide of one or both of aluminum and hafnium is preferably used. As the insulator, aluminum oxide, hafnium oxide, an oxide containing aluminum and hafnium (hafnium aluminate), or the like is preferably used. As the insulator 250b, stacked-layer films of a hafnium oxide film and a silicon nitride film over the hafnium oxide film may be used.

Figure 16B:
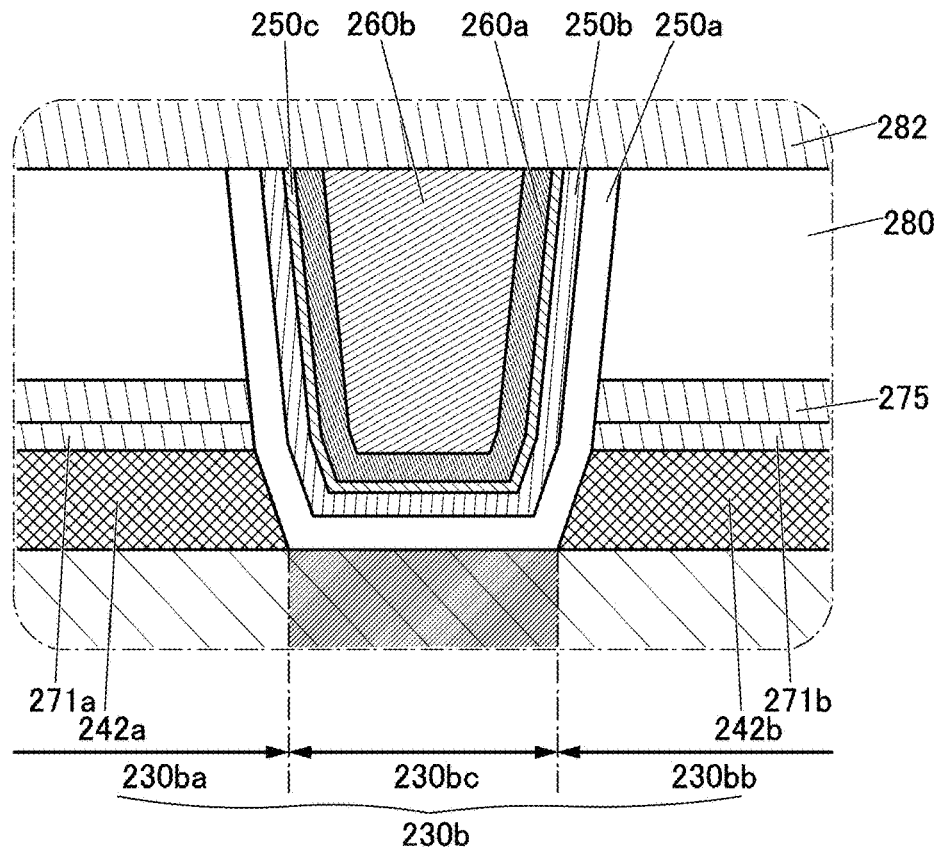
Figure 17A:
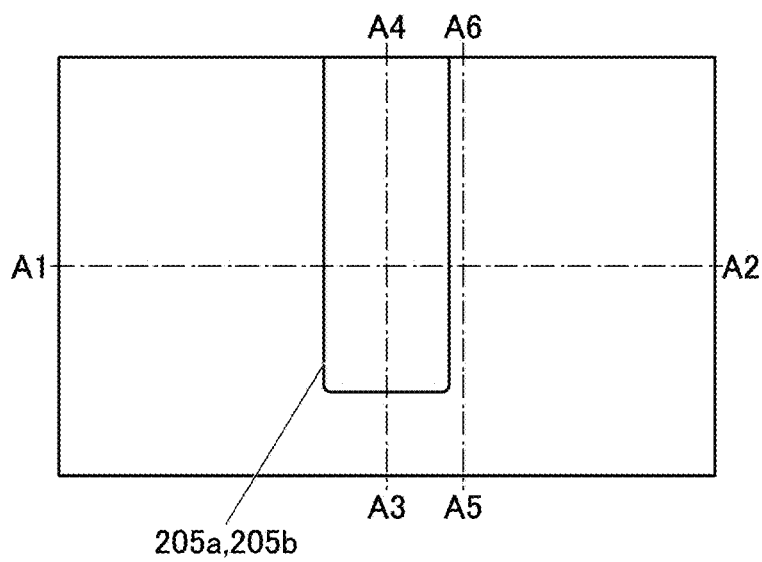
FIG. 17A is a top view illustrating a method for manufacturing a semiconductor device of one embodiment of the present invention.
Figure 17C:
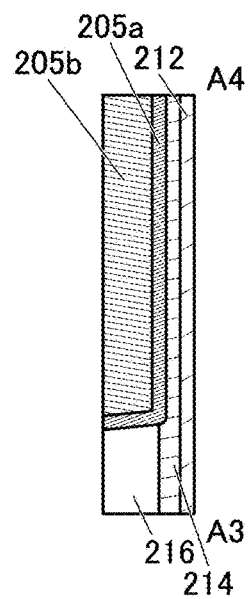
FIG. 17B to FIG. 17D are cross-sectional views illustrating a method for manufacturing a semiconductor device of one embodiment of the present invention.
Figure 17B:
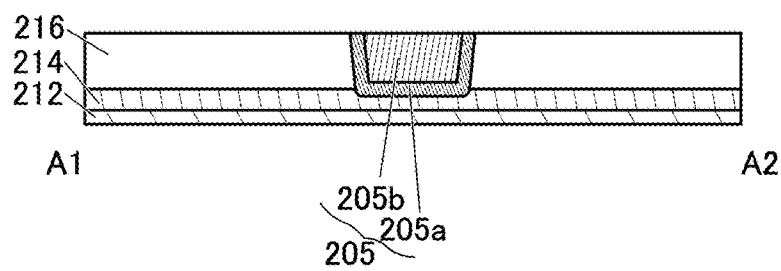
Figure 17D:
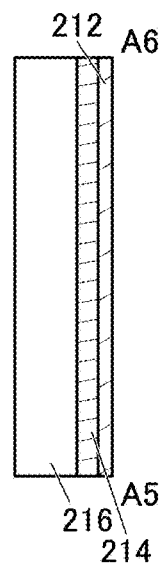
Figure 18A:
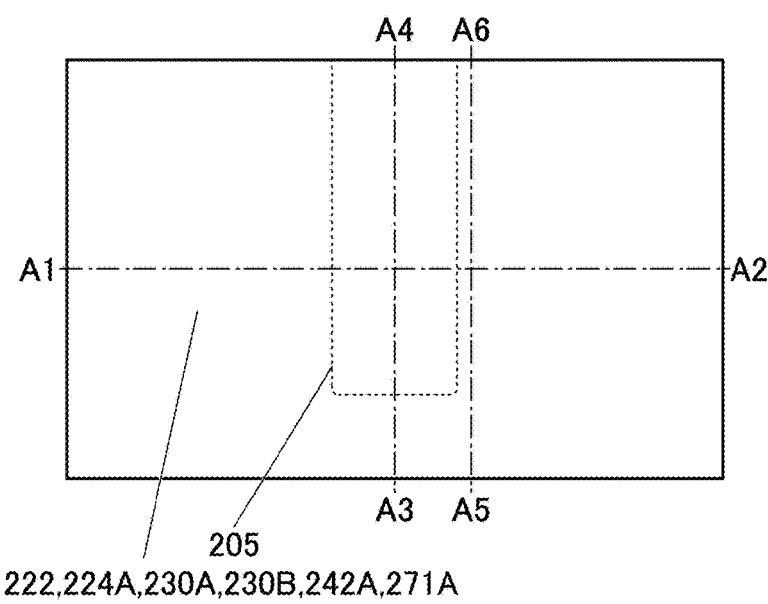
FIG. 18A is a top view illustrating a method for manufacturing a semiconductor device of one embodiment of the present invention.
Figure 18C:
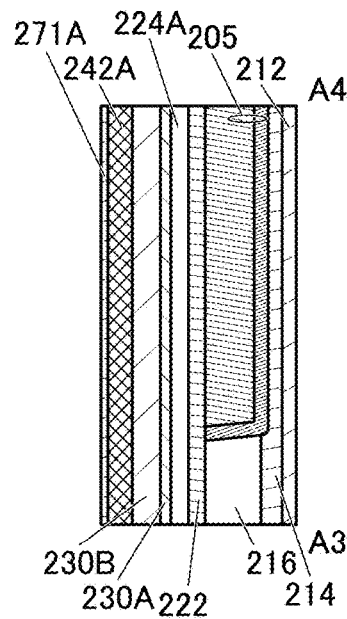
FIG. 18B to FIG. 18D are cross-sectional views illustrating a method for manufacturing a semiconductor device of one embodiment of the present invention.
Figure 18B:
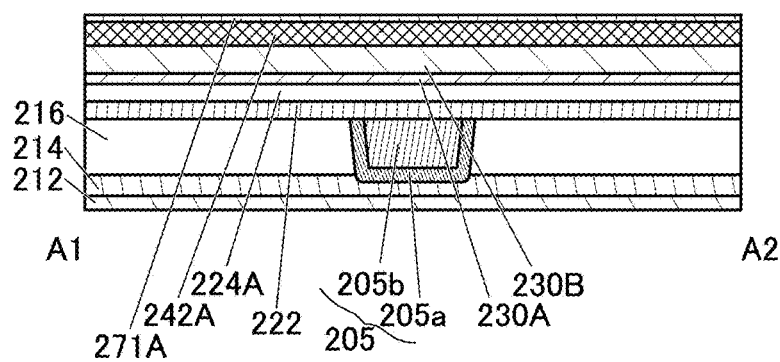
Figure 18D:
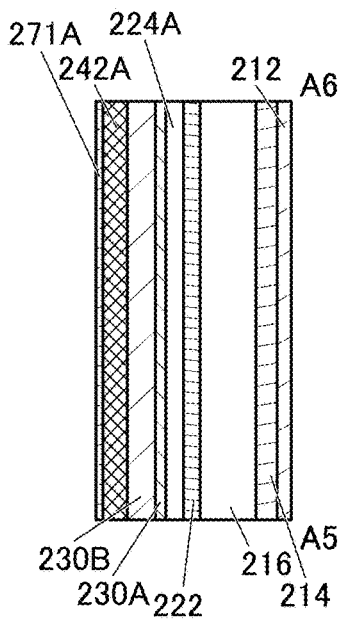

Note that although the insulator 250 has a stacked-layer structure of two layers in FIG. 15B and FIG. 15C, one embodiment of the present invention is not limited thereto. The insulator 250 may be a single layer or have a stacked-layer structure of three or more layers. For example, as illustrated in FIG. 16B, an insulator 250c may be provided between the insulator 250b and the conductor 260a. An insulator that can be used as the above insulator 250b can be used as the insulator 250c. As the insulator 250c, a barrier insulating film against hydrogen is preferably used. This can prevent diffusion of impurities such as hydrogen contained in the conductor 260 into the insulator 250b, the insulator 250a, and the oxide 230b. For example, silicon nitride deposited by a PEALD method may be used as the insulator 250c.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

Note that the metal oxide may have a function of part of the first gate electrode. For example, a metal oxide that can be used as the oxide 230 can be used as the metal oxide. In that case, when the conductor 260a is formed by a sputtering method, the metal oxide can have a reduced electric resistance value to be a conductor. Such a conductor can be referred to as an OC (Oxide Conductor) electrode. With the metal oxide, the on-state current of the transistor 200 can be increased without a reduction in the influence of the electric field from the conductor 260.

The conductor 260 is provided over the insulator 250b and functions as the first gate electrode of the transistor 200. The conductor 260 preferably includes the conductor 260a and the conductor 260b positioned over the conductor 260a. For example, the conductor 260a is preferably positioned to cover a bottom surface and a side surface of the conductor 260b. Moreover, as illustrated in FIG. 15B and FIG. 15C, a top surface of the conductor 260 is substantially level with the top surface of the insulator 250. Although the conductor 260 has a two-layer structure of the conductor 260a and the conductor 260b in FIG. 15B and FIG. 15C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be positioned certainly in a region between the conductor 242a and the conductor 242b without alignment. Note that as illustrated in FIG. 16A or the like, in the case where an upper portion of the opening has a wider shape than the lower portion of the opening, the conductor 260 also has a shape in which an upper portion is wider than a lower portion.

As illustrated in FIG. 15C, in the channel width direction of the transistor 200, with reference to a bottom surface of the insulator 222, the level of the bottom surface of the conductor 260 in a region where the conductor 260 and the oxide 230b do not overlap with each other is preferably lower than the level of a bottom surface of the oxide 230b. When the conductor 260 functioning as the gate electrode covers a side surface and a top surface of the channel formation region of the oxide 230b with the insulator 250 and the like therebetween, the electric field of the conductor 260 is likely to act on the entire channel formation region of the oxide 230b. Thus, the on-state current of the transistor 200 can be increased and the frequency characteristics of the transistor 200 can be improved. When the bottom surface of the insulator 222 is a reference, the difference between the level of the bottom surface of the conductor 260 in a region where the conductor 260 does not overlap with the oxide 230a and the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 250 and the conductor 260 are to be provided. In addition, the top surface of the insulator 280 may be planarized. In that case, the top surface of the insulator 280 is preferably level with the top surface of the insulator 250 and the top surface of the conductor 260.

The insulator 280 functioning as an interlayer insulating film preferably has a low permittivity. When a material with a low permittivity is used for an interlayer insulating film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

Like the insulator 224, the insulator 280 sometimes contains excess oxygen. The insulator 280 preferably has a reduced concentration of impurities such as water and hydrogen. An oxide containing silicon such as silicon oxide or silicon oxynitride is used as appropriate for the insulator 280, for example. When the insulator 280 is provided in contact with the insulator 250a, oxygen can be supplied to the oxide 230 through the insulator 250a. The oxygen reduces oxygen vacancies in the oxide 230, whereby the reliability of the transistor 200 can be improved.

The insulator 282 is provided in contact with the top surface of the insulator 280, a top surface of the insulator 250, and the top surface of the conductor 260. As the insulator 282, for example, an insulator such as aluminum oxide can be used. When aluminum oxide is deposited by a sputtering method as the insulator 282, the insulator 280 can contain excess oxygen. The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. The insulator 282, which has a function of capturing impurities such as hydrogen, is provided in contact with the insulator 280 in a region sandwiched between the insulator 212 and the insulator 283, whereby impurities such as hydrogen contained in the insulator 280 and the like can be captured and the amount of hydrogen in the region can be kept constant. It is particularly preferable to use aluminum oxide having an amorphous structure or aluminum oxide with an amorphous structure for the insulator 282 because hydrogen can be captured or fixed more effectively in some cases. Accordingly, the transistor 200 and a semiconductor device which have favorable characteristics and high reliability can be manufactured.

The insulator 283 functions as a barrier insulating film that inhibits impurities such as water and hydrogen from diffusing into the insulator 280 from above. The insulator 283 is positioned over the insulator 282. The insulator 283 is preferably formed using a nitride containing silicon such as silicon nitride or silicon nitride oxide. For example, silicon nitride deposited by a sputtering method is used as the insulator 283. When the insulator 283 is formed by a sputtering method, a high-density silicon nitride film where a void or the like is unlikely to be formed can be formed. To obtain the insulator 283, silicon nitride deposited by an ALD method may be stacked over silicon nitride deposited by a sputtering method. Such a structure is preferable because, even when a defect, e.g., a void, is generated in the silicon nitride deposited by a sputtering method, the silicon nitride deposited by an ALD method achieving good coverage can fill the void and a sealing property can be improved.

The insulator 285 is provided over the insulator 283. The insulator 285 is preferably provided using a material similar to that for the insulator 280, for example. In particular, silicon oxide and silicon oxynitride, which have thermal stability, are preferable. Note that although FIG. 15B and FIG. 15C illustrate a structure in which the insulator 285 is provided, one embodiment of the present invention is not limited thereto. A structure may be employed in which the insulator 285 is not provided and the conductor 246 is provided in contact with the insulator 283.

For the conductor 240a and the conductor 240b, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting passage of impurities such as water and hydrogen is preferably used for a first conductor in contact with the insulator 241. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240a and the conductor 240b.

For the insulator 241a and the insulator 241b, a barrier insulating film that can be used for the insulator 275 or the like is used. For example, an insulator such as silicon nitride, aluminum oxide, or silicon nitride oxide may be used for the insulator 241a and the insulator 241b. Since the insulator 241a and the insulator 241b are provided in contact with the insulator 283, the insulator 282, and the insulator 271, impurities such as water and hydrogen contained in the insulator 280 and the like can be inhibited from entering the oxide 230 through the conductor 240a and the conductor 240b. In particular, silicon nitride is suitable because of having a high blocking property against hydrogen. Furthermore, oxygen contained in the insulator 280 can be prevented from being absorbed by the conductor 240a and the conductor 240b.

In the case where the insulator 241a and the insulator 241b each have a stacked-layer structure as illustrated in FIG. 15A, a combination of a barrier insulating film against oxygen and a barrier insulating film against hydrogen is preferably used for a first insulator that is in contact with an inner wall of the opening in the insulator 280 and the like and a second insulator inside the first insulator.

For example, aluminum oxide deposited by an ALD method is used as the first insulator and silicon nitride deposited by a PEALD method is used as the second insulator. With this structure, oxidation of the conductor 240 can be inhibited, and hydrogen that enters the conductor 240 can be reduced.

The conductor 246a functioning as a wiring may be positioned in contact with the top surface of the conductor 240a, and the conductor 246b functioning as a wiring may be positioned in contact with the top surface of the conductor 240b. For the conductor 246 (the conductor 246a and the conductor 246b), a conductive material containing tungsten, copper, or aluminum as its main component is preferably used. Furthermore, the conductor may have a stacked-layer structure and may be a stack of titanium or titanium nitride and the conductive material, for example. Note that the conductor may be formed to be embedded in an opening provided in an insulator.

<Constituent Materials of Semiconductor Device>

Constituent materials that can be used for the semiconductor device will be described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a nitride of a metal and a substrate including an oxide of a metal. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. By contrast, when a material with a low relative permittivity is used for the insulator functioning as an interlayer insulating film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<Method for Manufacturing Semiconductor Device>

Next, a method for manufacturing the semiconductor device of one embodiment of the present invention illustrated in FIG. 15A to FIG. 15D will be described with reference to FIG. 17 to FIG. 26.

FIG. 17A, FIG. 18A, FIG. 19A, FIG. 20A, FIG. 21A, FIG. 22A, FIG. 23A, FIG. 24A, FIG. 25A, and FIG. 26A illustrate top views. FIG. 17B, FIG. 18B, FIG. 19B, FIG. 20B, FIG. 21B, FIG. 22B, FIG. 23B, FIG. 24B, FIG. 25B, and FIG. 26B are cross-sectional views corresponding to portions indicated by the dashed-dotted lines A1-A2 in FIG. 17A, FIG. 18A, FIG. 19A, FIG. 20A, FIG. 21A, FIG. 22A, FIG. 23A, FIG. 24A, FIG. 25A, and FIG. 26A, respectively, and are also cross-sectional views of the transistor 200 in the channel length direction. Furthermore, FIG. 17C, FIG. 18C, FIG. 19C, FIG. 20C, FIG. 21C, FIG. 22C, FIG. 23C, FIG. 24C, FIG. 25C, and FIG. 26C are cross-sectional views corresponding to portions indicated by the dashed-dotted lines A3-A4 in FIG. 17A, FIG. 18A, FIG. 19A, FIG. 20A, FIG. 21A, FIG. 22A, FIG. 23A, FIG. 24A, FIG. 25A, and FIG. 26A, respectively, and are also cross-sectional views of the transistor 200 in the channel width direction. Moreover, FIG. 17D, FIG. 18D, FIG. 19D, FIG. 20D, FIG. 21D, FIG. 22D, FIG. 23D, FIG. 24D, FIG. 25D, and FIG. 26D are cross-sectional views corresponding to portions indicated by the dashed-dotted lines A5-A6 in FIG. 17A, FIG. 18A, FIG. 19A, FIG. 20A, FIG. 21A, FIG. 22A, FIG. 23A, FIG. 24A, FIG. 25A, and FIG. 26A, respectively. Note that for clarity of the drawings, some components are omitted in the top views of FIG. 17A, FIG. 18A, FIG. 19A, FIG. 20A, FIG. 21A, FIG. 22A, FIG. 23A, FIG. 24A, FIG. 25A, and FIG. 26A.

Hereinafter, an insulating material for forming an insulator, a conductive material for forming a conductor, and a semiconductor material for forming a semiconductor can be formed by a sputtering method, a CVD method, an MBE method, a PLD method, an ALD method, or the like as appropriate.

Examples of the sputtering method include an RF sputtering method in which a high-frequency power source is used as a sputtering power source, a DC sputtering method in which a DC power source is used, and a pulsed DC sputtering method in which the voltage applied to an electrode is changed in a pulsed manner. An RF sputtering method is mainly used in the case where an insulating film is formed, and a DC sputtering method is mainly used in the case where a metal conductive film is formed. The pulsed DC sputtering method is mainly used in the case where a compound such as an oxide, a nitride, or a carbide is formed by a reactive sputtering method.

Note that the CVD method can be classified into a plasma enhanced CVD (PECVD) method using plasma (sometimes referred to as a plasma enhanced chemical vapor deposition method), a thermal CVD (TCVD) method using heat, a photo CVD method using light, and the like. Moreover, the CVD method can be classified into a metal CVD (MCVD) method and a metal organic CVD (MOCVD) method (sometimes referred to as a metal organic chemical vapor deposition method) depending on a source gas to be used.

A high-quality film can be obtained at a relatively low temperature by a plasma CVD method. Furthermore, a thermal CVD method is a film formation method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. By contrast, such plasma damage does not occur in the case of a thermal CVD method, which does not use plasma, and thus the yield of the semiconductor device can be increased. In addition, a thermal CVD method does not cause plasma damage during film formation, so that a film with few defects can be obtained.

As an ALD method, a thermal ALD method, in which a precursor and a reactant react with each other only by thermal energy, a PEALD method, in which a reactant excited by plasma is used, and the like can be used.

An ALD method, which enables one atomic layer to be deposited at a time using self-regulating characteristics of atoms, has advantages such as formation of an extremely thin film, film formation on a component with a high aspect ratio, formation of a film with a small number of defects such as pinholes, film formation with excellent coverage, and low-temperature film formation. The use of plasma in a PEALD method is sometimes preferable because film formation at a lower temperature is possible. Note that a precursor used in an ALD method sometimes contains impurities such as carbon. Thus, in some cases, a film provided by an ALD method contains impurities such as carbon in a larger amount than a film provided by another film formation method. Note that impurities can be quantified by X-ray photoelectron spectroscopy (XPS).

Unlike a film formation method in which particles ejected from a target or the like are deposited, a CVD method and an ALD method are film formation methods in which a film is formed by reaction at a surface of an object to be processed. Thus, a CVD method and an ALD method are film formation methods that enable good step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low film formation rate, and thus is preferably used in combination with another film formation method with a high film formation rate, such as a CVD method, in some cases.

A CVD method and an ALD method enable control of the composition of a film to be obtained with the flow rate ratio of the source gases. For example, by a CVD method and an ALD method, a film with a certain composition can be formed depending on the flow rate ratio of the source gases. Moreover, for example, by a CVD method and an ALD method, a film whose composition is continuously changed can be formed by changing the flow rate ratio of the source gases during the film formation. In the case where the film is formed while the flow rate ratio of the source gases is changed, as compared to the case where the film is formed using a plurality of film formation chambers, the time taken for the film formation can be shortened because the time taken for transfer and pressure adjustment is omitted. Thus, the productivity of the semiconductor device can be increased in some cases.

First, a substrate (not illustrated) is prepared, and the insulator 212 is formed over the substrate (see FIG. 17A to FIG. 17D). The insulator 212 is preferably formed by a sputtering method. Since hydrogen is not used as a film formation gas in the sputtering method, the hydrogen concentration in the insulator 212 can be reduced. Without limitation to a sputtering method, the insulator 212 may be formed by a CVD method, an MBE method, a PLD method, an ALD method, or the like as appropriate.

In this embodiment, for the insulator 212, silicon nitride is deposited by a pulsed DC sputtering method using a silicon target in an atmosphere containing a nitrogen gas. The use of the pulsed DC sputtering method can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water and hydrogen do not easily pass, such as silicon nitride, can inhibit diffusion of impurities such as water and hydrogen contained in a layer below the insulator 212. When an insulator through which copper does not easily pass, such as silicon nitride, is used as the insulator 212, even in the case where a metal that easily diffuses, such as copper, is used for a conductor in a layer (not illustrated) below the insulator 212, diffusion of the metal into a layer above the insulator 212 through the insulator 212 can be inhibited.

Next, the insulator 214 is formed over the insulator 212 (see FIG. 17A to FIG. 17D). The insulator 214 is preferably formed by a sputtering method. Since hydrogen is not used as a film formation gas in the sputtering method, the hydrogen concentration in the insulator 214 can be reduced. Without limitation to a sputtering method, the insulator 214 may be formed by a CVD method, an MBE method, a PLD method, an ALD method, or the like as appropriate.

In this embodiment, as the insulator 214, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality. Here, RF (Radio Frequency) power may be applied to the substrate. For example, when a layer below the insulator 214 is formed, RF power is not applied; and when a layer above the insulator 214 is formed, RF power is applied. The amount of oxygen implanted to the layer below the insulator 214 can be controlled depending on the amount of the RF power applied to the substrate. The RF power is higher than or equal to 0 W/cm$^2$ and lower than or equal to 1.86 W/cm$^2$. In other words, the implantation amount of oxygen can be changed to be appropriate for the characteristics of the transistor, with the RF power used at the time of forming the insulator 214. Accordingly, an appropriate amount of oxygen for improving the reliability of the transistor can be implanted. The RF frequency is preferably 10 MHz or higher. The typical frequency is 13.56 MHz. The higher the RF frequency is, the less damage the substrate gets.

A metal oxide having an amorphous structure, which has an excellent function of capturing and fixing hydrogen, such as aluminum oxide, is preferably used for the insulator 214. In this case, the insulator 214 captures or fixes hydrogen contained in the insulator 216 and the like and prevents the hydrogen from diffusing into the oxide 230. It is particularly preferable to use aluminum oxide having an amorphous structure or aluminum oxide with an amorphous structure for the insulator 214 because hydrogen can be captured or fixed more effectively in some cases. Accordingly, the transistor 200 and a semiconductor device which have favorable characteristics and high reliability can be manufactured.

Next, the insulator 216 is formed over the insulator 214. The insulator 216 is preferably formed by a sputtering method. Since hydrogen is not used as a film formation gas in the sputtering method, the hydrogen concentration in the insulator 216 can be reduced. Without limitation to a sputtering method, the insulator 216 may be formed by a CVD method, an MBE method, a PLD method, an ALD method, or the like as appropriate.

In this embodiment, for the insulator 216, silicon oxide is deposited by a pulsed DC sputtering method using a silicon target in an atmosphere containing an oxygen gas. The use of the pulsed DC sputtering method can achieve more uniform film thickness and improve the sputtering rate and film quality.

The insulator 212, the insulator 214, and the insulator 216 are preferably successively formed without exposure to the air. For example, a multi-chamber film formation apparatus is used. As a result, the amounts of hydrogen in the formed insulator 212, insulator 214, and insulator 216 can be reduced, and furthermore, entry of hydrogen in the films in intervals between film formation steps can be inhibited.

Then, an opening reaching the insulator 214 is formed in the insulator 216. Examples of the opening include a groove and a slit. A region where an opening is formed is referred to as an opening portion in some cases. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214. Note that a depression portion overlapping with the opening in the insulator 216 is sometimes formed in the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is formed. The conductive film desirably includes a conductor having a function of inhibiting passage of oxygen. For example, tantalum nitride, tungsten nitride, or titanium nitride can be used. Alternatively, stacked-layer films of the conductor having a function of inhibiting passage of oxygen and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, a titanium nitride film is formed as the conductive film to be the conductor 205a. When such a metal nitride is provided in contact with a bottom surface and a side surface of the conductor 205b, oxidation of the conductor 205b by the insulator 216 or the like can be inhibited. Furthermore, even when a metal that easily diffuses, such as copper, is used for the conductor 205b, the metal can be prevented from diffusing to the outside through the conductor 205a.

Next, a conductive film to be the conductor 205b is formed. Tantalum, tungsten, titanium, molybdenum, aluminum, copper, a molybdenum-tungsten alloy, or the like can be used for the conductive film. The conductive film can be formed by a plating method, a sputtering method, a CVD method, an MBE method, a PLD method, an ALD method, or the like. In this embodiment, a tungsten film is formed as the conductive film.

Then, CMP treatment is performed to remove parts of the conductive film to be the conductor 205a and the conductive film to be the conductor 205b, so that the insulator 216 is exposed (see FIG. 17A to FIG. 17D). As a result, the conductor 205a and the conductor 205b remain only in the opening portion. In this way, the conductor 205 with a flat top surface can be formed. Note that the insulator 216 is partly removed by the CMP treatment in some cases.

Next, the insulator 222 is formed over the insulator 216 and the conductor 205 (see FIG. 18A to FIG. 18D). An insulator containing an oxide of one or both of aluminum and hafnium is preferably formed as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be formed by a sputtering method, a CVD method, an MBE method, a PLD method, an ALD method, or the like. In this embodiment, for the insulator 222, hafnium oxide is deposited by an ALD method.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the insulator 222 and the like as much as possible.

In this embodiment, as the heat treatment, treatment at 400° C. for one hour is performed with a flow rate ratio of a nitrogen gas to an oxygen gas of 4 slm:1 slm after the formation of the insulator 222. By the heat treatment, impurities such as water and hydrogen contained in the insulator 222 can be removed, for example. In the case where an oxide containing hafnium is used for the insulator 222, the insulator 222 is partly crystallized by the heat treatment in some cases. The heat treatment can also be performed after the formation of the insulator 224, for example.

Then, an insulating film 224A is formed over the insulator 222 (see FIG. 18A to FIG. 18D). The insulating film 224A can be formed by a sputtering method, a CVD method, an MBE method, a PLD method, an ALD method, or the like. In this embodiment, as the insulating film 224A, a silicon oxide film is formed by a sputtering method. Since hydrogen is not used as a film formation gas in the sputtering method, the hydrogen concentration in the insulating film 224A can be reduced. The hydrogen concentration in the insulating film 224A is preferably reduced because the insulating film 224A is in contact with the oxide 230a in a later step.

Next, an oxide film 230A and an oxide film 230B are formed in this order over the insulating film 224A (see FIG. 18A to FIG. 18D). Note that it is preferable to form the oxide film 230A and the oxide film 230B successively without exposure to the air. By the film formation without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be formed by a sputtering method, a CVD method, an MOCVD method, an MBE method, a PLD method, an ALD method, or the like.

For example, in the case where the oxide film 230A and the oxide film 230B are formed by a sputtering method, oxygen or a mixed gas of oxygen and a rare gas is used as a sputtering gas. Increasing the proportion of oxygen contained in the sputtering gas can increase the amount of excess oxygen in the formed oxide films. In the case where the oxide films are formed by a sputtering method, the above In-M-Zn oxide target or the like can be used.

Note that at the time of forming the oxide film 230A, part of oxygen contained in the sputtering gas is supplied to the insulating film 224A in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for film formation is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for film formation is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the film formation is performed while the substrate is being heated, the crystallinity of the oxide film can be improved.

In this embodiment, the oxide film 230A is formed by a sputtering method using an oxide target with In:Ga:Zn=1:3:4 [atomic ratio]. In addition, the oxide film 230B is formed by a sputtering method using an oxide target with In:Ga:Zn=1:1:1 [atomic ratio]. Alternatively, an oxide target with In:Ga:Zn=4:2:4.1 [atomic ratio] may be used for the oxide film 230B. Note that each of the oxide films is preferably formed to have characteristics required for the oxide 230a and the oxide 230b by selecting the film formation conditions and the atomic ratios as appropriate.

Note that the insulating film 224A, the oxide film 230A, and the oxide film 230B are preferably formed by a sputtering method without exposure to the air. For example, a multi-chamber film formation apparatus is used. As a result, the amounts of hydrogen in the formed insulating film 224A, oxide film 230A, and oxide film 230B can be reduced, and furthermore, entry of hydrogen into the films in intervals between film formation steps can be inhibited.

Next, heat treatment is preferably performed. The heat treatment is performed in a temperature range where the oxide film 230A and the oxide film 230B do not become polycrystals, i.e., at a temperature higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the oxide film 230A, the oxide film 230B, and the like as much as possible.

In this embodiment, as the heat treatment, treatment at 450° C. for one hour is performed with a flow rate ratio of a nitrogen gas to an oxygen gas of 4 slm:1 slm. By such heat treatment including an oxygen gas, impurities such as carbon, water, and hydrogen in the oxide film 230A and the oxide film 230B can be reduced, for example. Impurities in the films are reduced in the above manner, whereby the crystallinity of the oxide film 230B can be improved and a dense structure can be obtained. Accordingly, the crystal regions in the oxide film 230A and the oxide film 230B can be increased, and in-plane variations in the crystal regions in the oxide film 230A and the oxide film 230B can be reduced. Therefore, in-plane variations in electrical characteristics of the transistor 200 can be reduced.

Next, a conductive film 242A is formed over the oxide film 230B (see FIG. 18A to FIG. 18D). The conductive film 242A can be formed by a sputtering method, a CVD method, an MBE method, a PLD method, an ALD method, or the like. For example, as the conductive film 242A, a tantalum nitride film is formed by a sputtering method. Note that heat treatment may be performed before the formation of the conductive film 242A. This heat treatment may be performed under reduced pressure, and the conductive film 242A may be successively formed without exposure to the air. The treatment can remove moisture and hydrogen adsorbed onto the surface of the oxide film 230B and the like, and further can reduce the moisture concentration and the hydrogen concentration in the oxide film 230A, the oxide film 230B, and the oxide film 230B. The heat treatment is preferably performed at a temperature higher than or equal to 100° C. and lower than or equal to 400° C. In this embodiment, the heat treatment is performed at 200° C.

Next, an insulating film 271A is formed over the conductive film 242A (see FIG. 18A to FIG. 18D). The insulating film 271A can be formed by a sputtering method, a CVD method, an MBE method, a PLD method, an ALD method, or the like. As the insulating film 271A, an insulating film having a function of inhibiting passage of oxygen is preferably used. For example, as the insulating film 271A, an aluminum oxide film is formed by a sputtering method.

Note that the conductive film 242A and the insulating film 271A are preferably formed by a sputtering method without exposure to the air. For example, a multi-chamber film formation apparatus is used. As a result, the amounts of hydrogen in the formed conductive film 242A and insulating film 271A can be reduced, and furthermore, entry of hydrogen in the films in intervals between film formation steps can be inhibited. In the case where a hard mask is provided over the insulating film 271A, a film to be the hard mask is preferably successively formed without exposure to the air.

Next, the insulating film 224A, the oxide film 230A, the oxide film 230B, the conductive film 242A, and the insulating film 271A are processed into island shapes by a lithography method to form the insulator 224, the oxide 230a, the oxide 230b, a conductive layer 242B, and an insulating layer 271B (see FIG. 19A to FIG. 19D). Here, the insulator 224, the oxide 230a, the oxide 230b, the conductive layer 242B, and the insulating layer 271B are formed to at least partly overlap with the conductor 205. A dry etching method or a wet etching method can be used for the processing. A dry etching method is suitable for microfabrication. The insulating film 224A, the oxide film 230A, the oxide film 230B, the conductive film 242A, and the insulating film 271A may be processed under different conditions.

Note that in the lithography method, first, a resist is exposed to light through a mask. Next, a region exposed to light is removed or left using a developing solution, so that a resist mask is formed. Then, etching process through the resist mask is conducted, whereby a conductor, a semiconductor, an insulator, or the like can be processed into a desired shape. The resist mask is formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching process such as ashing, wet etching process, wet etching process after dry etching process, or dry etching process after wet etching process.

In addition, a hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps. In this embodiment, the insulating layer 271B is used as a hard mask.

Figure 19A:
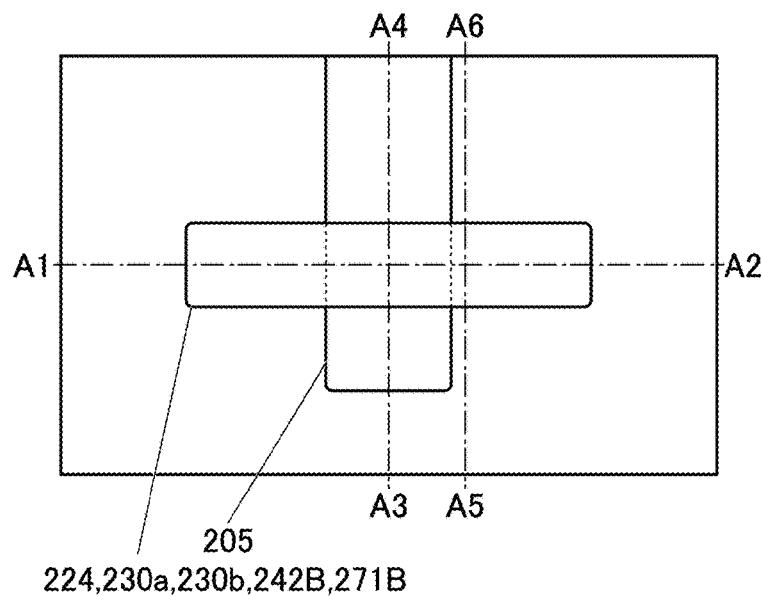
FIG. 19A is a top view illustrating a method for manufacturing a semiconductor device of one embodiment of the present invention.
Figure 19C:
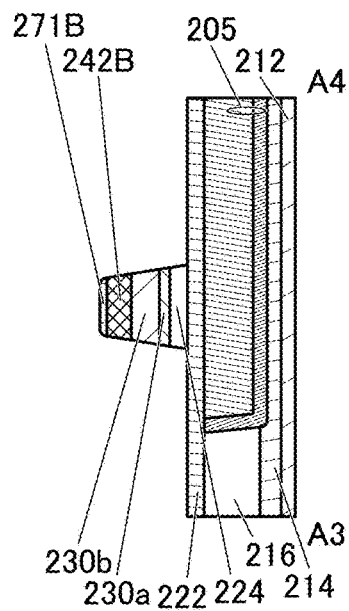
FIG. 19B to FIG. 19D are cross-sectional views illustrating a method for manufacturing a semiconductor device of one embodiment of the present invention.
Figure 19B:
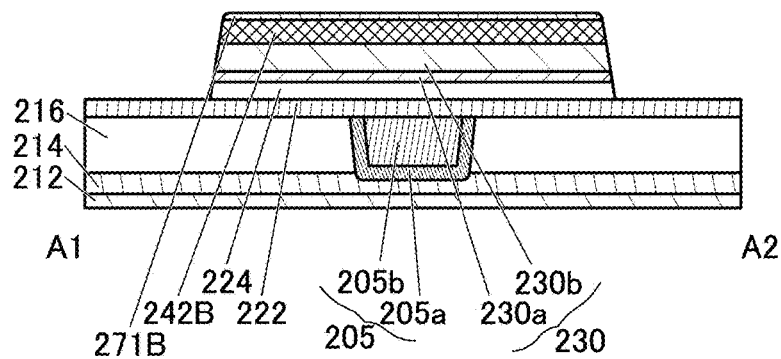
Figure 19D:
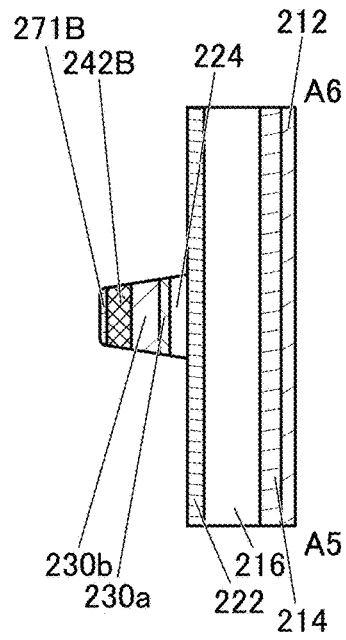
Figure 20A:
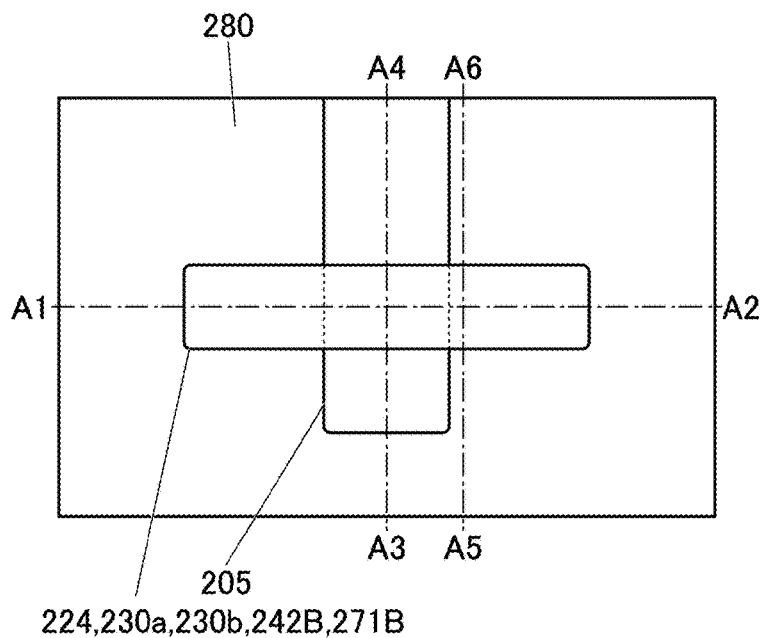
FIG. 20A is a top view illustrating a method for manufacturing a semiconductor device of one embodiment of the present invention.
Figure 20C:
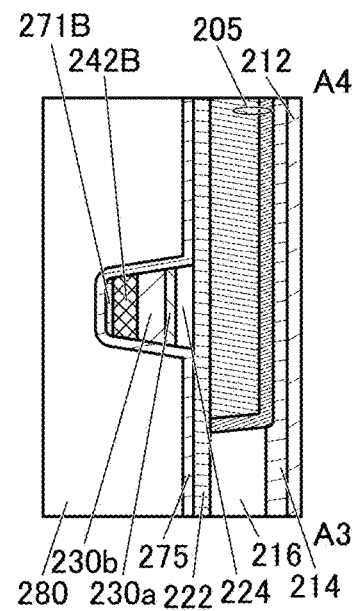
FIG. 20B to FIG. 20D are cross-sectional views illustrating a method for manufacturing a semiconductor device of one embodiment of the present invention.
Figure 20B:
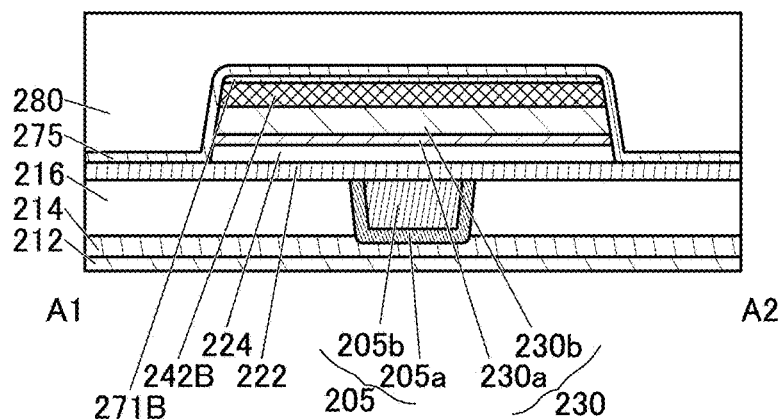
Figure 20D:
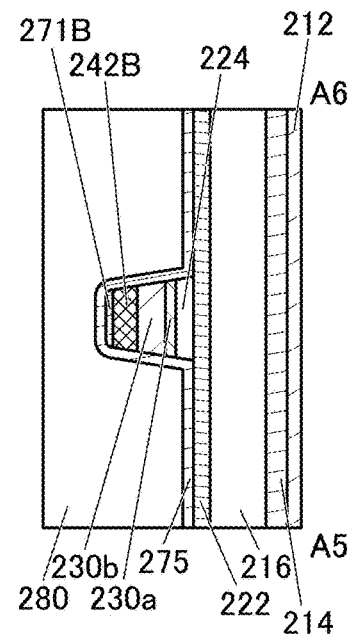

Here, the insulating layer 271B functions as a mask for the conductive layer 242B; thus, as illustrated in FIG. 19B to FIG. 19D, the conductive layer 242B does not have a curved surface between the side surface and the top surface. Thus, end portions at the intersections of the side surfaces and the top surfaces of the conductor 242a and the conductor 242b illustrated in FIG. 15B and FIG. 15D are angular. The cross-sectional area of the conductor 242 is larger in the case where the end portion at the intersection of the side surface and the top surface of the conductor 242 is angular than in the case where the end portion is rounded. Accordingly, the resistance of the conductor 242 is reduced, so that the on-state current of the transistor 200 can be increased.

Furthermore, as illustrated in FIG. 19B to FIG. 19D, the cross sections of the insulator 224, the oxide 230a, the oxide 230b, the conductive layer 242B, and the insulating layer 271B may have tapered shapes. In this specification and the like, a tapered shape indicates a shape in which at least part of a side surface of a structure is inclined with respect to a substrate surface. For example, the angle formed between an inclined side surface and the substrate surface (hereinafter, sometimes referred to as a taper angle) is preferably less than 90°. The insulator 224, the oxide 230a, the oxide 230b, the conductive layer 242B, and the insulating layer 271B may each have a taper angle greater than or equal to 60° and less than 90°, for example. When the cross sections have tapered shapes as described above, the coverage with the insulator 275 and the like can be improved in the subsequent steps, so that defects such as voids can be reduced.

Not being limited to the above, the insulator 224, the oxide 230a, the oxide 230b, the conductive layer 242B, and the insulating layer 271B may have side surfaces substantially perpendicular to the top surface of the insulator 222. With such a structure, a plurality of transistors 200 can be provided with high density in a small area.

A by-product generated in the etching process is sometimes formed in a layered manner on the side surfaces of the insulator 224, the oxide 230a, the oxide 230b, the conductive layer 242B, and the insulating layer 271B. In that case, the layered by-product is formed between the insulator 275 and the insulator 224, the oxide 230a, the oxide 230b, the conductive layer 242B, and the insulating layer 271B. Hence, the layered by-product is preferably removed.

Next, the insulator 275 is formed to cover the insulator 224, the insulating layer 271B, and the like (see FIG. 20A to FIG. 20D). Here, it is preferable that the insulator 275 be in close contact with the top surface of the insulator 222 and the side surface of the insulator 224. The insulator 275 can be formed by a sputtering method, a CVD method, an MBE method, a PLD method, an ALD method, or the like. As the insulator 275, an insulating film having a function of inhibiting passage of oxygen is preferably used. For example, as the insulator 275, aluminum oxide is deposited by a sputtering method, and silicon nitride is deposited thereover by a PEALD method. When the insulator 275 has such a multilayer structure, the function of inhibiting diffusion of impurities such as water and hydrogen and oxygen is improved in some cases.

In this manner, the insulator 224, the oxide 230a, the oxide 230b, and the conductive layer 242B can be covered with the insulator 275 and the insulating layer 271B, which have a function of inhibiting diffusion of oxygen. This can inhibit direct diffusion of oxygen from the insulator 280 and the like into the insulator 224, the oxide 230a, the oxide 230b, and the conductive layer 242B in a later step.

Next, an insulating film to be the insulator 280 is formed over the insulator 275. The insulating film can be formed by a sputtering method, a CVD method, an MBE method, a PLD method, an ALD method, or the like. A silicon oxide film is formed by a sputtering method as the insulating film, for example. When the insulating film is formed by a sputtering method in an atmosphere containing oxygen, the insulator 280 containing excess oxygen can be formed. Since hydrogen is not used as a film formation gas in the sputtering method, the concentration of hydrogen in the insulator 280 can be reduced. Note that heat treatment may be performed before the insulating film is formed. The heat treatment may be performed under reduced pressure, and the insulating film may be successively formed without exposure to the air. The treatment can remove moisture and hydrogen adsorbed onto the surface of the insulator 275 and the like, and further can reduce the moisture concentration and the hydrogen concentration in the oxide 230a, the oxide 230b, and the insulator 224. For the heat treatment, the above heat treatment conditions can be used.

Next, the insulating film to be the insulator 280 is subjected to CMP treatment, so that the insulator 280 with a flat top surface is formed (see FIG. 20A to FIG. 20D). Note that, for example, silicon nitride may be deposited over the insulator 280 by a sputtering method and CMP treatment may be performed on the silicon nitride until the insulator 280 is exposed.

Then, part of the insulator 280, part of the insulator 275, part of the insulating layer 271B, and part of the conductive layer 242B are processed to form an opening reaching the oxide 230b. The opening is preferably formed to overlap with the conductor 205. The insulator 271a, the insulator 271b, the conductor 242a, and the conductor 242b are formed through the formation of the opening (see FIG. 21A to FIG. 21D).

Figure 21A:
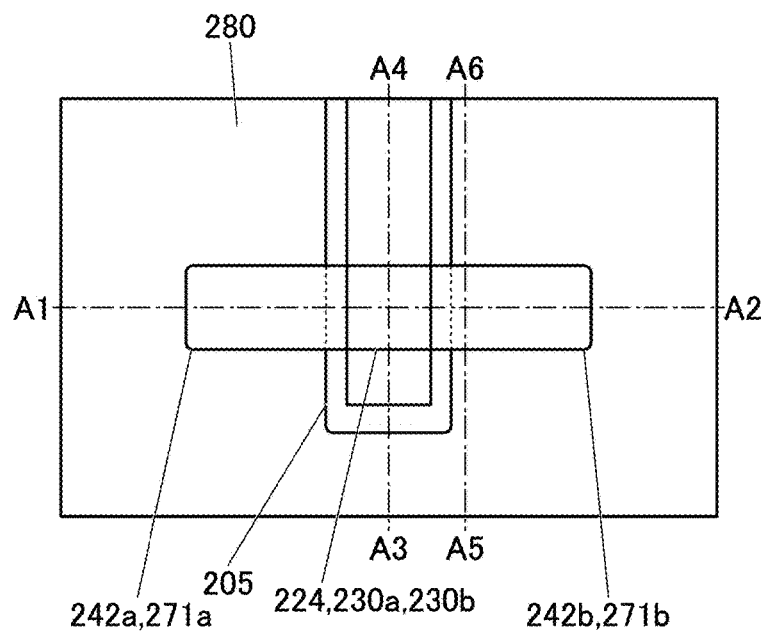
FIG. 21A is a top view illustrating a method for manufacturing a semiconductor device of one embodiment of the present invention.
Figure 21C:
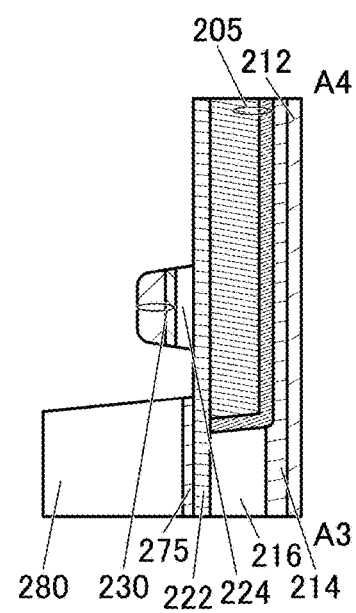
FIG. 21B to FIG. 21D are cross-sectional views illustrating a method for manufacturing a semiconductor device of one embodiment of the present invention.
Figure 21B:
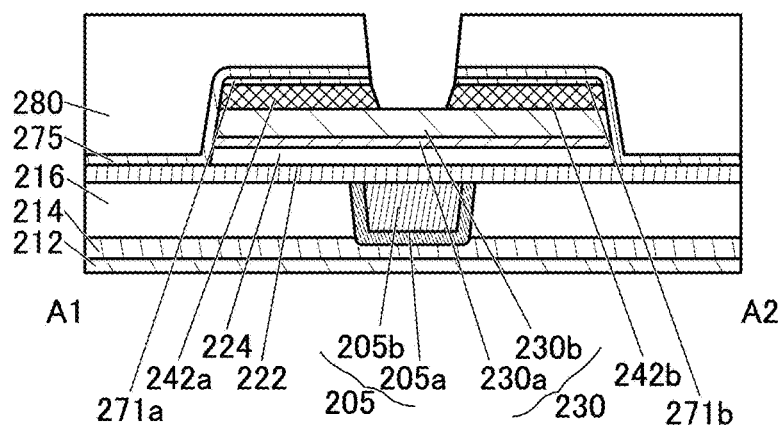
Figure 21D:
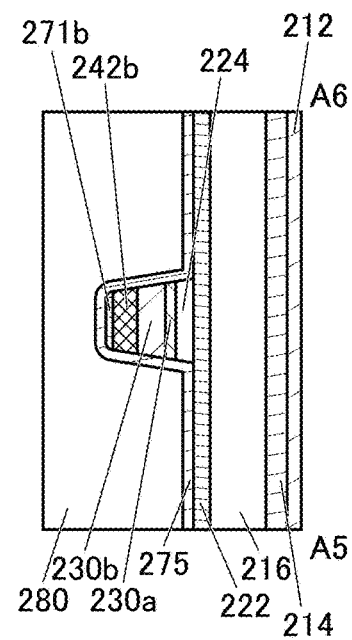

Here, as illustrated in FIG. 21B and FIG. 21C, the side surfaces of the insulator 280, the insulator 275, the insulator 271, and the conductor 242 may have tapered shapes. The taper angle of the insulator 280 is larger than the taper angle of the conductor 242 in some cases. Although not illustrated in FIG. 21A to FIG. 21C, the upper portion of the oxide 230b is removed in some cases when the opening is formed.

The part of the insulator 280, the part of the insulator 275, the part of the insulating layer 271B, and the part of the conductive layer 242B can be processed by a dry etching method or a wet etching method. Processing by a dry etching method is suitable for microfabrication. The processing may be performed under different conditions. For example, the part of the insulator 280 may be processed by a dry etching method, the part of the insulator 275 and the part of the insulating layer 271B may be processed by a wet etching method, and the part of the conductive layer 242B may be processed by a dry etching method.

Here, in some cases, impurities are attached to a side surface of the oxide 230a, the top surface and a side surface of the oxide 230b, a side surface of the conductor 242, a side surface of the insulator 280, and the like or diffuse therein. A step of removing the impurities may be performed. A damaged region is formed on a surface of the oxide 230b by the dry etching in some cases. Such a damaged region may be removed. The impurities come from components contained in the insulator 280, the insulator 275, part of the insulating layer 271B, and the conductive layer 242B; components contained in a member of an apparatus used to form the opening; and components contained in a gas or liquid used for etching, for instance. Examples of the impurities include hafnium, aluminum, silicon, tantalum, fluorine, and chlorine.

In particular, impurities such as aluminum and silicon block the oxide 230b from becoming a CAAC. It is thus preferable to reduce or remove impurity elements such as aluminum and silicon, which block the oxide from becoming a CAAC. For example, the concentration of aluminum atoms in the oxide 230b and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, yet further preferably lower than 0.3 atomic %.

Note that in a metal oxide, a region that is hindered from becoming a CAAC by impurities such as aluminum and silicon and has an a-like structure is referred to as a non-CAAC region in some cases. In the non-CAAC region, the density of the crystal structure is reduced to increase $V_OH$; thus, the transistor is likely to be normally on. Hence, the non-CAAC region in the oxide 230b is preferably reduced or removed.

By contrast, the oxide 230b preferably has a CAAC structure. In particular, the CAAC structure preferably reaches a lower edge portion of a drain in the oxide 230b. Here, in the transistor 200, the conductor 242a or the conductor 242b, and its vicinity function as a drain. In other words, the oxide 230b in the vicinity of the lower edge portion of the conductor 242a (conductor 242b) preferably has a CAAC structure. In this manner, the damaged region of the oxide 230b is removed and the CAAC structure is formed in the edge portion of the drain, which significantly affects the drain withstand voltage, so that variation of the electrical characteristics of the transistor 200 can be further suppressed. The reliability of the transistor 200 can be improved.

In order to remove the impurities and the like attached to the surface of the oxide 230b in the etching step, cleaning treatment is performed. Examples of the cleaning method include wet cleaning using a cleaning solution or the like (also referred to as wet etching treatment), plasma treatment using plasma, and cleaning by heat treatment, and any of these cleanings may be performed in appropriate combination. The cleaning treatment sometimes makes the groove portion deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

In this embodiment, as the cleaning treatment, wet cleaning is performed using diluted ammonia water. The cleaning treatment can remove impurities that are attached onto the surfaces of the oxide 230a, the oxide 230b, and the like or that are diffused into the oxide 230a, the oxide 230b, and the like.

After the etching or the cleaning treatment, heat treatment may be performed. The heat treatment is performed at a temperature higher than or equal to 100° C. and lower than or equal to 500° C., preferably higher than or equal to 300° C. and lower than or equal to 500° C., further preferably higher than or equal to 350° C. and lower than or equal to 400° C. Note that the heat treatment is performed in an atmosphere of a nitrogen gas, an inert gas, or an oxidizing gas. Alternatively, the heat treatment is performed in an atmosphere in which an oxidizing gas is added to a nitrogen gas or an inert gas at 10 ppm or more, 1% or more, or 10% or more. For example, the heat treatment is preferably performed in a mixed atmosphere of an oxygen gas and a nitrogen gas. Accordingly, oxygen can be supplied to the oxide 230a and the oxide 230b to reduce oxygen vacancies. This heat treatment can improve the crystallinity of the oxide 230b. The heat treatment may be performed under reduced pressure. Alternatively, the heat treatment may be performed in a nitrogen atmosphere without exposure to the air successively after heat treatment is performed in an oxygen atmosphere. In the case where the heat treatment is performed in a nitrogen atmosphere without exposure to the air successively after heat treatment is performed in an oxygen atmosphere, the heat treatment in an oxygen atmosphere may be performed for a longer time than the heat treatment in a nitrogen atmosphere.

Next, an insulating film 250A is formed (see FIG. 22A to FIG. 22D). Heat treatment may be performed before the formation of the insulating film 250A; the heat treatment may be performed under reduced pressure, and the insulating film 250A may be successively formed without exposure to the air. The heat treatment is preferably performed in an atmosphere containing oxygen. Such treatment can remove moisture and hydrogen adsorbed onto the surface of the oxide 230b and the like, and further can reduce the moisture concentration and the hydrogen concentration in the oxide 230a and the oxide 230b. The heat treatment is preferably performed at a temperature higher than or equal to 100° C. and lower than or equal to 400° C.

The insulating film 250A can be formed by a sputtering method, a CVD method, a PECVD method, an MBE method, a PLD method, an ALD method, or the like. The insulating film 250A is preferably formed by a film formation method using a gas in which hydrogen atoms are reduced or removed. This can reduce the hydrogen concentration in the insulating film 250A. The hydrogen concentration in the insulating film 250A is preferably reduced because the insulating film 250A becomes the insulator 250a that is in contact with the oxide 230b in a later step.

Figure 22A:
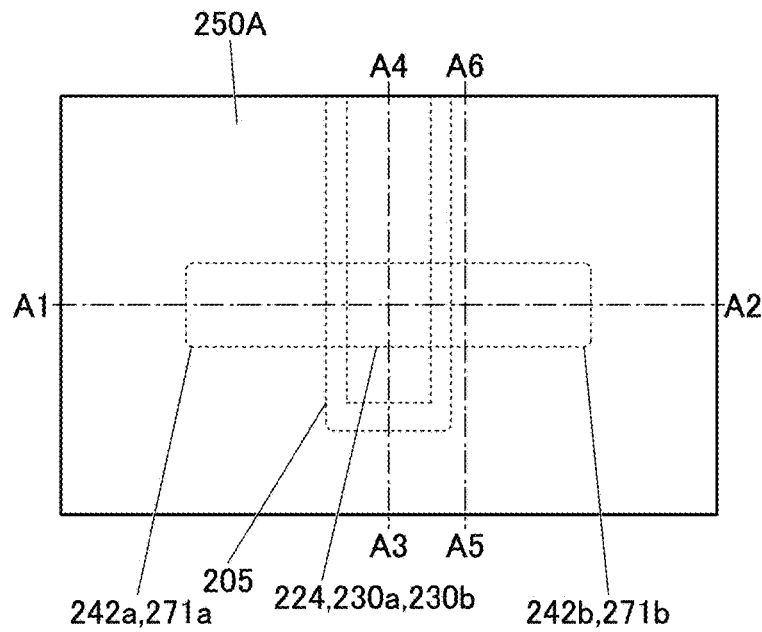
FIG. 22A is a top view illustrating a method for manufacturing a semiconductor device of one embodiment of the present invention.
Figure 22C:
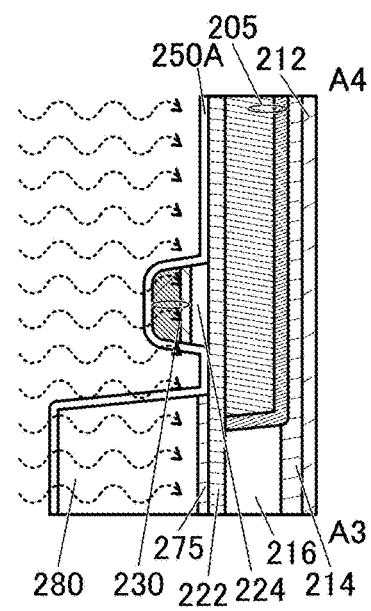
FIG. 22B to FIG. 22D are cross-sectional views illustrating a method for manufacturing a semiconductor device of one embodiment of the present invention.
Figure 22B:
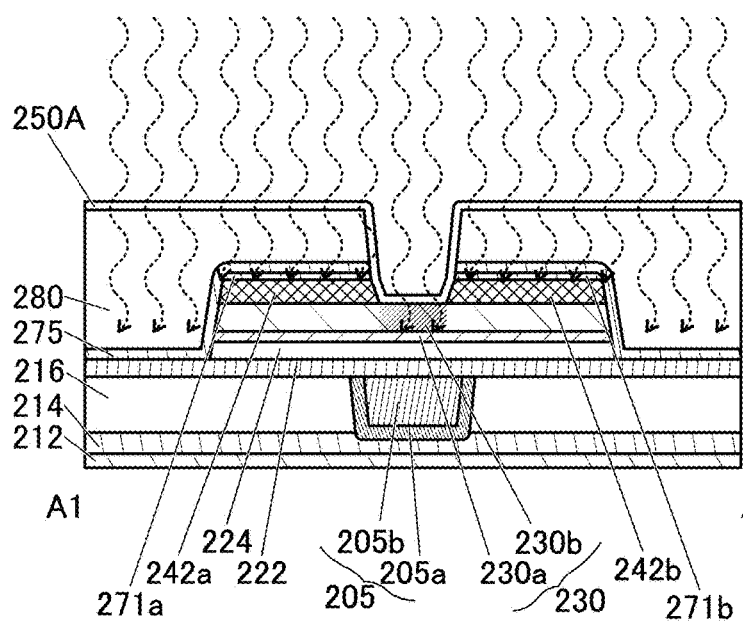

The insulating film 250A is preferably formed by an ALD method. The thickness of the insulator 250, which functions as a gate insulating film of the miniaturized transistor 200, needs to be extremely small (e.g., approximately 5 nm to 30 nm) and have a small variation. By contrast, an ALD method is a film formation method in which a precursor and a reactant (e.g., oxidizer) are alternately introduced, and the film thickness can be adjusted with the number of repetition times of the sequence of the gas introduction; thus, accurate control of the film thickness is possible. Thus, the accuracy of the thickness of the gate insulating film required by the miniaturized transistor 200 can be achieved. Furthermore, as illustrated in FIG. 22B and FIG. 22C, the insulating film 250A needs to be formed on the bottom surface and the side surface of the opening formed in the insulator 280 and the like so as to have good coverage. One atomic layer can be deposited at a time on the bottom surface and the side surface of the opening, whereby the insulating film 250A can be formed in the opening with good coverage.

For example, in the case where the insulating film 250A is formed by a PECVD method using a film formation gas containing hydrogen, such as $SiH_4$ (or $Si_2H_6$), the film formation gas containing hydrogen is decomposed in plasma to generate a large amount of hydrogen radicals. Oxygen in the oxide 230b is extracted by reduction reaction of hydrogen radicals to form $V_OH$, so that the hydrogen concentration in the oxide 230b increases. By contrast, when the insulating film 250A is formed by an ALD method, the generation of hydrogen radicals can be inhibited at the introduction of a precursor and the introduction of a reactant. Thus, the use of the ALD method for forming the insulating film 250A can prevent an increase in the hydrogen concentration in the oxide 230b.

In this embodiment, as the insulating film 250A, a silicon oxide film is formed by a PEALD method.

When the impurities described above are not removed before the formation of the insulating film 250A, the impurities sometimes remain between the insulator 250a and the oxide 230a, the oxide 230b, the conductor 242, the insulator 280, and the like.

Next, microwave treatment is preferably performed in an atmosphere containing oxygen (see FIG. 22A to FIG. 22D). Here, the microwave treatment refers to, for example, treatment using an apparatus including a power source that generates high-density plasma with the use of a microwave. Note that in this specification and the like, a microwave refers to an electromagnetic wave having a frequency of 300 MHz to 300 GHz.

Figure 22D:
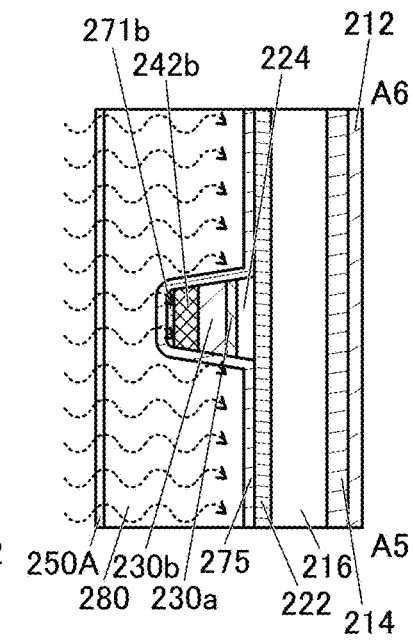
Figure 23A:
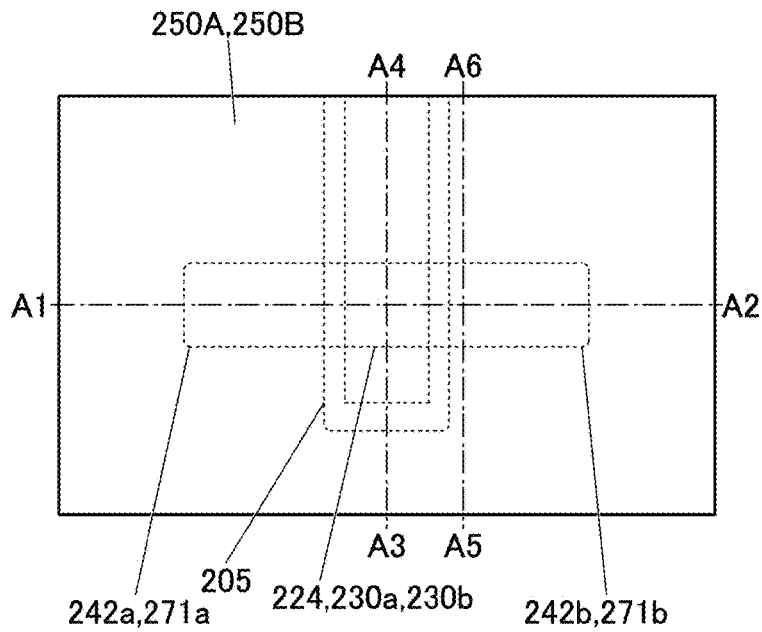
FIG. 23A is a top view illustrating a method for manufacturing a semiconductor device of one embodiment of the present invention.
Figure 23B:
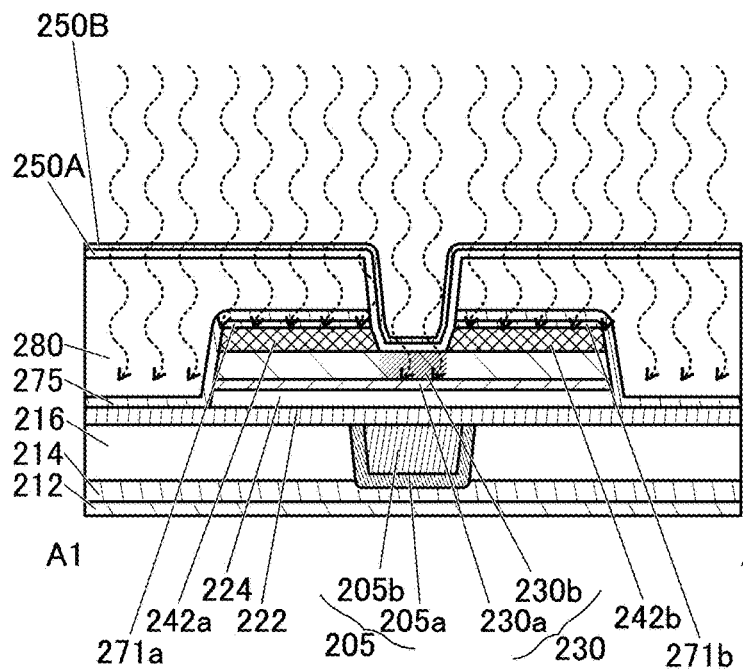
FIG. 23B to FIG. 23D are cross-sectional views illustrating a method for manufacturing a semiconductor device of one embodiment of the present invention.
Figure 23C:
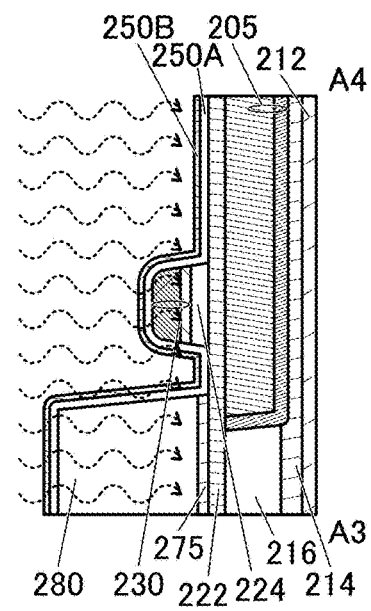
Figure 23D:
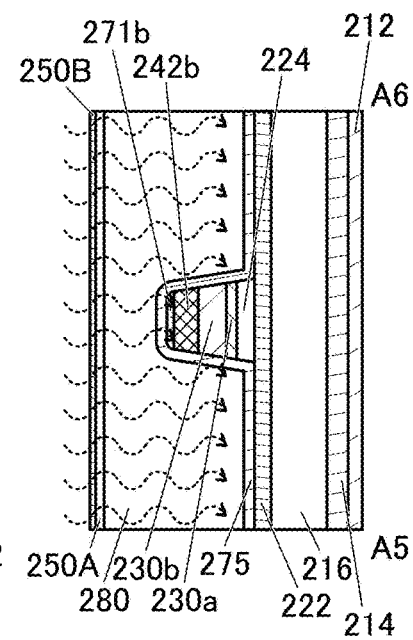
Figure 24A:
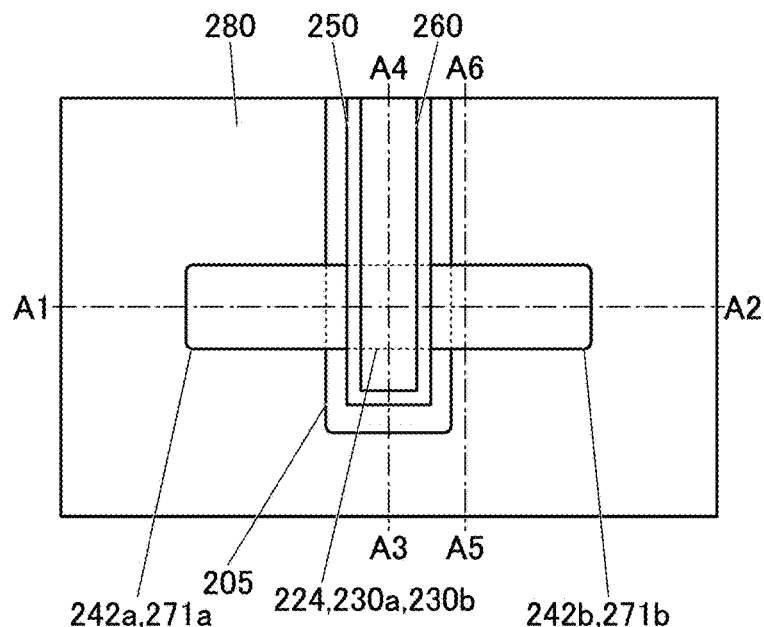
FIG. 24A is a top view illustrating a method for manufacturing a semiconductor device of one embodiment of the present invention.
Figure 24C:
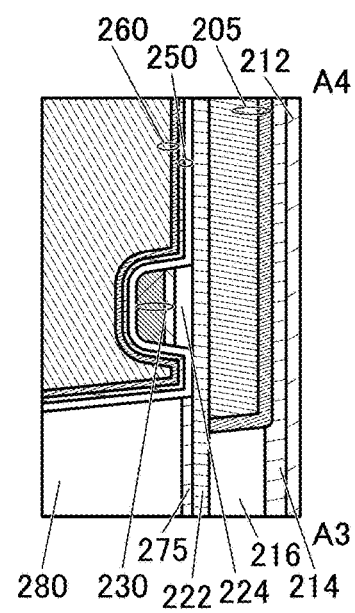
FIG. 24B to FIG. 24D are cross-sectional views illustrating a method for manufacturing a semiconductor device of one embodiment of the present invention.
Figure 24B:
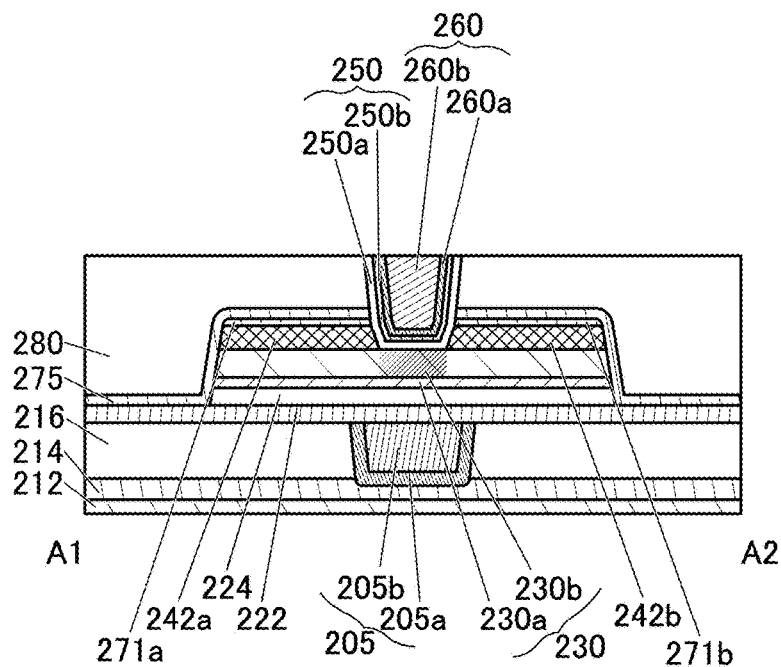
Figure 24D:
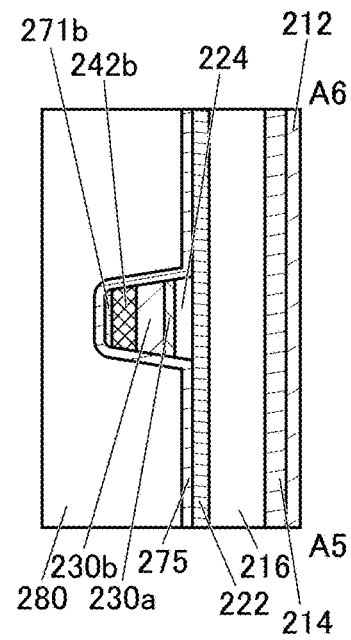
Figure 25A:
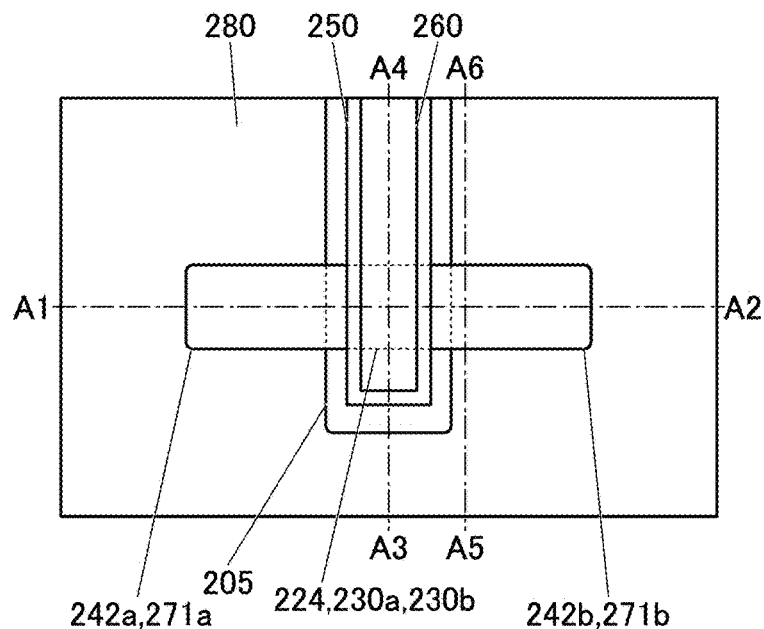
FIG. 25A is a top view illustrating a method for manufacturing a semiconductor device of one embodiment of the present invention.
Figure 25C:
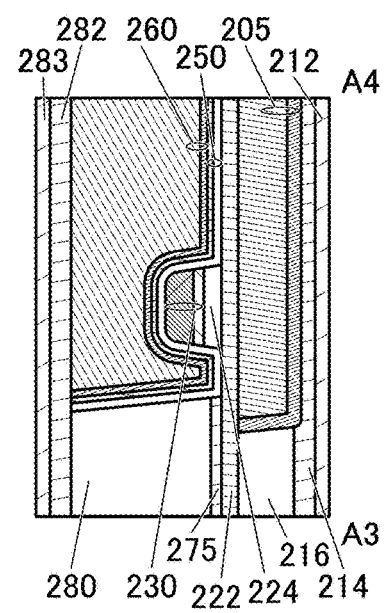
FIG. 25B to FIG. 25D are cross-sectional views illustrating a method for manufacturing a semiconductor device of one embodiment of the present invention.
Figure 25B:
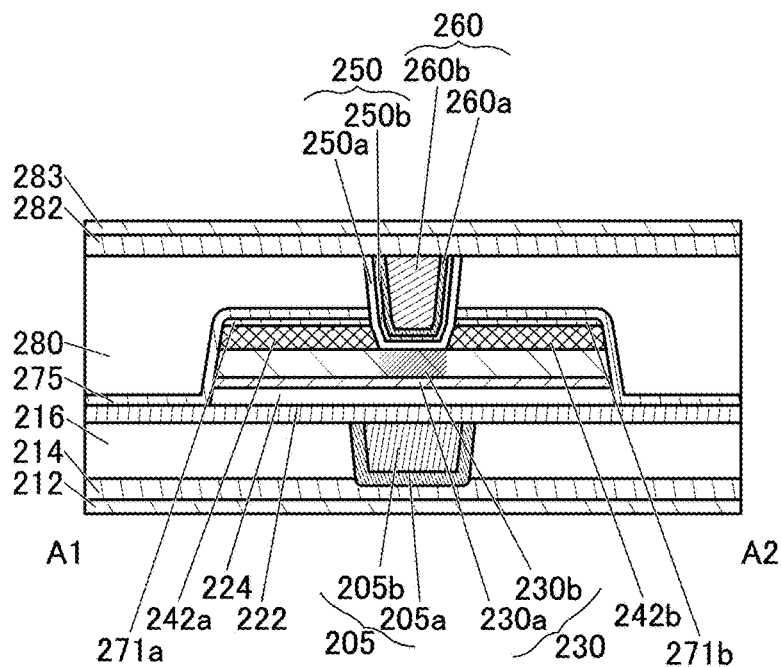
Figure 25D:
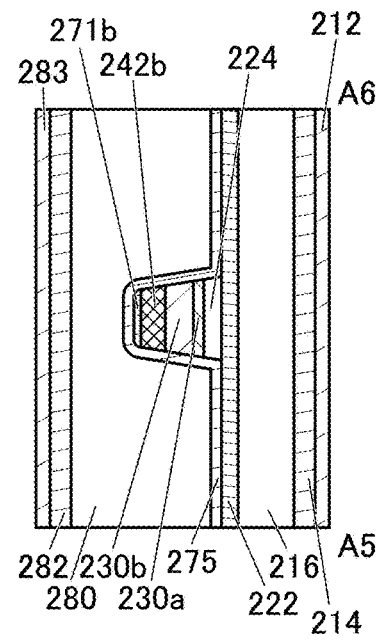
Figure 26A:
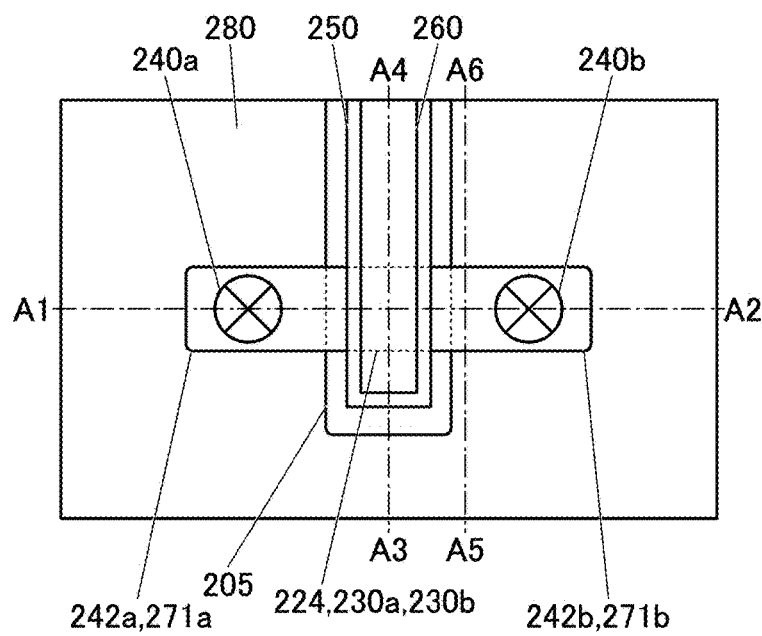
FIG. 26A is a top view illustrating a method for manufacturing a semiconductor device of one embodiment of the present invention.
Figure 26C:
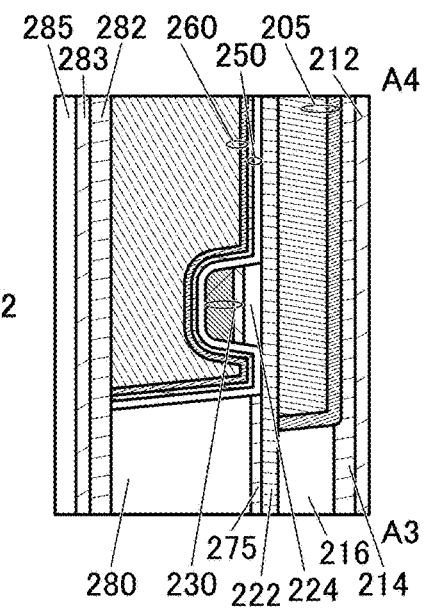
FIG. 26B to FIG. 26D are cross-sectional views illustrating a method for manufacturing a semiconductor device of one embodiment of the present invention.
Figure 26B:
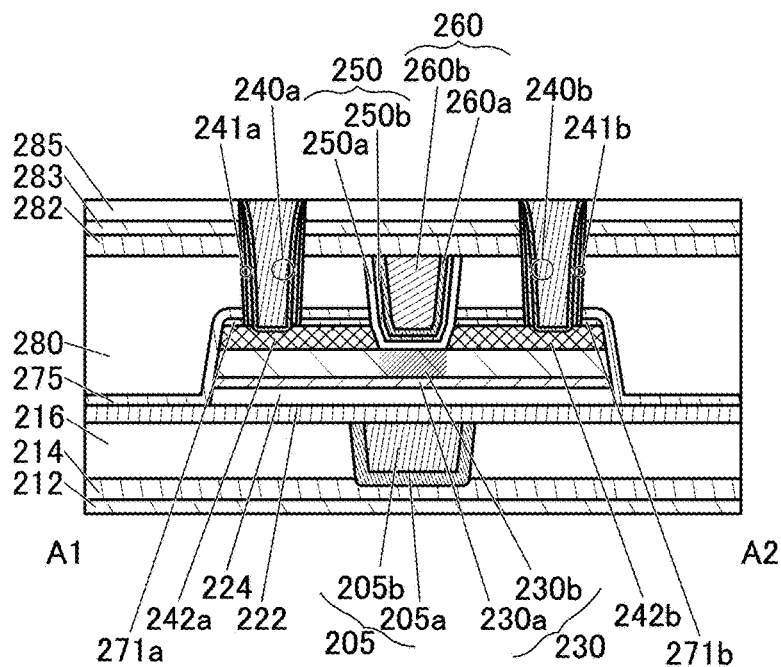
Figure 26D:
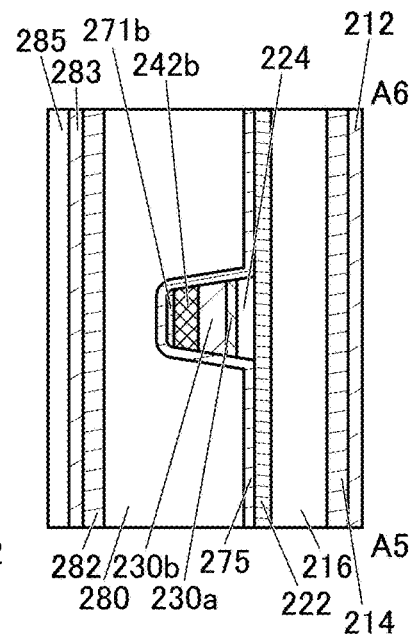

Here, dotted lines in FIG. 22B to FIG. 22D indicate high-frequency waves such as microwaves or RF, oxygen plasma, oxygen radicals, or the like. For the microwave treatment, a microwave treatment apparatus including a power source for generating high-density plasma using a microwave is preferably used, for example. Here, the frequency of the microwave treatment apparatus is set to greater than or equal to 300 MHz and less than or equal to 300 GHz, preferably greater than or equal to 2.4 GHz and less than or equal to 2.5 GHz, for example, 2.45 GHz. The electric power of the power source that applies microwaves of the microwave treatment apparatus is set to higher than or equal to 1000 W and lower than or equal to 10000 W, preferably higher than or equal to 2000 W and lower than or equal to 5000 W. The microwave treatment apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the oxide 230b.

The microwave treatment is preferably performed under reduced pressure, and the pressure is set to 60 Pa or higher, preferably 133 Pa or higher, further preferably 200 Pa or higher, still further preferably 400 Pa or higher. For example, the pressure is set to higher than or equal to 10 Pa and lower than or equal to 1000 Pa, preferably higher than or equal to 300 Pa and lower than or equal to 700 Pa. The treatment temperature is lower than or equal to 750° C., preferably lower than or equal to 500° C., and is approximately 400° C., for example. Heat treatment may be successively performed without exposure to the air after the oxygen plasma treatment. For example, the heat treatment is performed at higher than or equal to 100° C. and lower than or equal to 750° C., preferably higher than or equal to 300° C. and lower than or equal to 500° C.

Furthermore, the microwave treatment is performed using an oxygen gas and an argon gas, for example. Here, the oxygen flow rate ratio ($O_2/(O_2+Ar)$) is greater than 0% and less than or equal to 100%. The oxygen flow rate ratio ($O_2/(O_2+Ar)$) is preferably greater than 0% and less than or equal to 50%. The oxygen flow rate ratio ($O_2/(O_2+Ar)$) is further preferably greater than or equal to 10% and less than or equal to 40%. The oxygen flow rate ratio ($O_2/(O_2+Ar)$) is still further preferably greater than or equal to 10% and less than or equal to 30%. The carrier concentration in the region 230bc can be reduced by thus performing the microwave treatment in an atmosphere containing oxygen. In addition, the carrier concentrations in the region 230ba and the region 230bb can be prevented from being excessively reduced by preventing an excessive amount of oxygen from being introduced into the chamber in the microwave treatment.

As illustrated in FIG. 22B to FIG. 22D, the microwave treatment in an atmosphere containing oxygen can convert an oxygen gas into plasma using a high-frequency wave such as a microwave or RF, and apply the oxygen plasma to a region of the oxide 230b that is between the conductor 242a and the conductor 242b. At this time, the region 230bc can also be irradiated with the high-frequency wave such as a microwave or RF. In other words, the high-frequency wave such as a microwave or RF, the oxygen plasma, or the like can be applied to the region 230bc illustrated in FIG. 16A. The effect of the plasma, the microwave, or the like enables $V_OH$ in the region 230bc to be cut, and hydrogen H to be removed from the region 230bc. That is, the reaction "$V_OH \rightarrow H+V_O$" occurs in the region 230bc, so that $V_OH$ contained in the region 230bc can be reduced. As a result, oxygen vacancies and $V_OH$ in the region 230bc can be reduced to lower the carrier concentration. In addition, oxygen radicals generated by the oxygen plasma or oxygen contained in the insulator 250 can be supplied to oxygen vacancies formed in the region 230bc, thereby further reducing oxygen vacancies and lowering the carrier concentration in the region 230bc.

Meanwhile, the conductor 242a and the conductor 242b are provided over the region 230ba and the region 230bb illustrated in FIG. 16A. Here, the conductor 242 preferably functions as a film blocking the effect caused by the high-frequency wave such as a microwave or RF, the oxygen plasma, or the like in the microwave treatment in an atmosphere containing oxygen. Therefore, the conductor 242 preferably has a function of blocking an electromagnetic wave of greater than or equal to 300 MHz and less than or equal to 300 GHz, for example, greater than or equal to 2.4 GHz and less than or equal to 2.5 GHz.

As illustrated in FIG. 22B to FIG. 22D, the effect of the high-frequency wave such as a microwave or RF, the oxygen plasma, or the like is blocked by the conductor 242a and the conductor 242b, and thus does not reach the region 230ba and the region 230bb. Hence, a reduction in $V_OH$ and supply of an excessive amount of oxygen due to the microwave treatment do not occur in the region 230ba and the region 230bb, preventing a decrease in carrier concentration.

In the above manner, oxygen vacancies and $V_OH$ can be selectively removed from the region 230bc in the oxide semiconductor, whereby the region 230bc can be an i-type or substantially i-type region. Furthermore, supply of an excessive amount of oxygen to the region 230ba and the region 230bb functioning as the source region and the drain region can be inhibited and the n-type regions can be maintained. As a result, change in the electrical characteristics of the transistor 200 can be inhibited, and thus variation in the electrical characteristics of the transistors 200 in the substrate plane can be inhibited.

During the microwave treatment, thermal energy might be directly transmitted to the oxide 230b owing to electromagnetic interaction between the microwave and the molecules in the oxide 230b. The oxide 230b might be heated by this thermal energy. Such heat treatment is sometimes referred to as microwave annealing. When microwave treatment is performed in an atmosphere containing oxygen, an effect equivalent to that of oxygen annealing might be obtained. In the case where hydrogen is contained in the oxide 230b, it is probable that the thermal energy is transmitted to the hydrogen in the oxide 230b and the hydrogen activated by the energy is released from the oxide 230b.

Next, an insulating film 250B is formed (see FIG. 23A to FIG. 23D). The insulating film 250B can be formed by a sputtering method, a CVD method, an MBE method, a PLD method, an ALD method, or the like. The insulating film 250B is preferably formed using an insulator having a function of inhibiting diffusion of oxygen. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, the insulating film 250A can be formed using the above-described material that can be used for the insulator 250a, and the insulating film 250B can be formed using a material similar to that for the insulator 222.

Specifically, for the insulating film 250B, a metal oxide containing one kind or two or more kinds selected from hafnium, aluminum, gallium, yttrium, zirconium, tungsten, titanium, tantalum, nickel, germanium, magnesium, and the like or a metal oxide that can be used as the oxide 230 can be used. In particular, an insulator containing an oxide of one or both of aluminum and hafnium is preferably used.

In this embodiment, a hafnium oxide film is formed as the insulating film 250B by a thermal ALD method.

After the insulating film 250B is formed, microwave treatment may be performed (see FIG. 23A to FIG. 23D). For the microwave treatment, the conditions for the microwave treatment performed after the formation of the insulating film 250A may be used. Alternatively, microwave treatment may be performed after the formation of the insulating film 250B, with no microwave treatment performed after the formation of the insulating film 250A.

After each of microwave treatment after the formation of the insulating film 250A and microwave treatment after the formation of the insulating film 250B, heat treatment may be performed with the reduced pressure being maintained. Such treatment enables hydrogen in the insulating film 250A, the insulating film 250B, the oxide 230b, and the oxide 230a to be removed efficiently. Part of hydrogen is gettered by the conductor 242 (the conductor 242a and the conductor 242b) in some cases. Alternatively, the step of performing microwave treatment and then performing heat treatment with the reduced pressure being maintained may be repeated a plurality of cycles. The repetition of the heat treatment enables hydrogen in the insulating film 250A, the oxide 230b, and the oxide 230a to be removed more efficiently. Note that the temperature of the heat treatment is preferably higher than or equal to 300° C. and lower than or equal to 500° C. The microwave treatment, i.e., the microwave annealing may also serve as the heat treatment. The heat treatment is not necessarily performed in the case where the oxide 230b and the like are sufficiently heated by the microwave annealing.

Furthermore, the microwave treatment improves the film quality of the insulating film 250A and the insulating film 250B, thereby inhibiting diffusion of hydrogen, water, impurities, and the like. Accordingly, hydrogen, water, impurities, and the like can be inhibited from diffusing into the oxide 230b, the oxide 230a, and the like through the insulator 250 in a later step such as formation of a conductive film to be the conductor 260 or later treatment such as heat treatment.

Next, a conductive film to be the conductor 260a and a conductive film to be the conductor 260b are formed in this order. The conductive film to be the conductor 260a and the conductive film to be the conductor 260b can be formed by a sputtering method, a CVD method, an MBE method, a PLD method, an ALD method, or the like. In this embodiment, the conductive film to be the conductor 260a is formed by an ALD method, and the conductive film to be the conductor 260b is formed by a CVD method.

Then, the insulating film 250A, the insulating film 250B, the conductive film to be the conductor 260a, and the conductive film to be the conductor 260b are polished by CMP treatment until the insulator 280 is exposed, whereby the insulator 250a, the insulator 250b, the conductor 260a, and the conductor 260b are formed (see FIG. 24A to FIG. 24D). Accordingly, the insulator 250 is positioned to cover the inner wall (the sidewall and the bottom surface) of the opening reaching the oxide 230b. The conductor 260 is positioned to fill the opening with the insulator 250 therebetween.

Then, heat treatment may be performed under conditions similar to those for the above heat treatment. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively formed without exposure to the air.

Next, the insulator 282 is formed over the insulator 250, the conductor 260, and the insulator 280 (see FIG. 25A to FIG. 25D). The insulator 282 can be formed by a sputtering method, a CVD method, an MBE method, a PLD method, an ALD method, or the like. The insulator 282 is preferably formed by a sputtering method. Since hydrogen is not used as a film formation gas in the sputtering method, the hydrogen concentration in the insulator 282 can be reduced. The insulator 282 is formed by a sputtering method in an oxygen-containing atmosphere, whereby oxygen can be added to the insulator 280 during the film formation. Thus, excess oxygen can be contained in the insulator 280. At this time, the insulator 282 is preferably formed while the substrate is being heated.

In this embodiment, for the insulator 282, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality.

Next, heat treatment is preferably performed. The heat treatment can be performed under conditions similar to those for the above heat treatment. In this embodiment, the treatment is performed at 400° C. in a nitrogen atmosphere for one hour. By the heat treatment, oxygen added by the formation of the insulator 282 can be diffused into the insulator 280 and the insulator 250a and then can be supplied selectively to the channel formation region of the oxide 230. Thus, a semiconductor device having favorable electrical characteristics can be provided. A semiconductor device having high reliability can also be provided.

Note that the heat treatment is not necessarily performed after the formation of the insulator 282 and may be performed after the formation of the insulator 283, for example.

Next, the insulator 283 is formed over the insulator 282 (see FIG. 25A to FIG. 25D). The insulator 283 can be formed by a sputtering method, a CVD method, an MBE method, a PLD method, an ALD method, or the like. The insulator 283 is preferably formed by a sputtering method. Since hydrogen is not used as a film formation gas in the sputtering method, the hydrogen concentration in the insulator 283 can be reduced. The insulator 283 may be a multilayer. For example, silicon nitride may be deposited by a sputtering method and silicon nitride may be deposited by a CVD method over the silicon nitride.

Next, the insulator 285 is formed over the insulator 283. The insulator 285 can be formed by a sputtering method, a CVD method, an MBE method, a PLD method, an ALD method, or the like. Silicon oxide is deposited by a CVD method as the insulator 285, for example.

Subsequently, openings reaching the conductor 242 are formed in the insulator 271, the insulator 275, the insulator 280, the insulator 282, the insulator 283, and the insulator 285 (see FIG. 26A to FIG. 26D). The openings are formed by a lithography method. Note that the openings in the top view in FIG. 26A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Next, an insulating film to be the insulator 241a and the insulator 241b is formed and the insulating film is subjected to anisotropic etching, so that the insulator 241a and the insulator 241b are formed (see FIG. 26A to FIG. 26D). The insulating film can be formed by a sputtering method, a CVD method, an MBE method, a PLD method, an ALD method, or the like. As the insulating film, an insulating film having a function of inhibiting passage of oxygen is preferably used. For example, it is preferable that an aluminum oxide film be formed by an ALD method and a silicon nitride film be formed thereover by a PEALD method. Silicon nitride is preferable because it has a high blocking property against hydrogen.

As an anisotropic etching for the insulating film to be the insulator 241a and the insulator 241b, a dry etching method may be performed, for example. When the insulator 241 is provided on the sidewall portions of the openings, passage of oxygen from the outside can be inhibited and oxidation of the conductor 240 to be formed next can be prevented. Furthermore, impurities such as water and hydrogen contained in the insulator 280 and the like can be prevented from diffusing into the conductor 240a and the conductor 240b.

Next, a conductive film to be the conductor 240a and the conductor 240b is formed. The conductive film desirably has a stacked-layer structure which includes a conductor having a function of inhibiting passage of impurities such as water and hydrogen. For example, a stacked layer of tantalum nitride, titanium nitride, or the like and tungsten, molybdenum, copper, or the like can be employed. The conductive film can be formed by a sputtering method, a CVD method, an MBE method, a PLD method, an ALD method, or the like.

Then, part of the conductive film to be the conductor 240a and the conductor 240b is removed by CMP treatment to expose the top surface of the insulator 285. As a result, the conductive film remains only in the openings, so that the conductor 240a and the conductor 240b having flat top surfaces can be formed (see FIG. 26A to FIG. 26D. see). Note that the top surface of the insulator 285 is partly removed by the CMP treatment in some cases.

Next, a conductive film to be the conductor 246 is formed. The conductive film can be formed by a sputtering method, a CVD method, an MBE method, a PLD method, an ALD method, or the like.

Then, the conductive film to be the conductor 246 is processed by a lithography method, thereby forming the conductor 246a in contact with the top surface of the conductor 240a and the conductor 246b in contact with the top surface of the conductor 240b. At this time, part of the insulator 285 in a region where the conductor 246a and the conductor 246b do not overlap with the insulator 285 is sometimes removed.

Through the above process, the semiconductor device including the transistor 200 illustrated in FIG. 15A to FIG. 15D can be manufactured. As illustrated in FIG. 17 to FIG. 26, the transistor 200 can be manufactured with the use of the method for manufacturing the semiconductor device described in this embodiment.

<Modification Example of Semiconductor Device>

An example of the semiconductor device of one embodiment of the present invention will be described below with reference to FIG. 27.

Figure 27A:
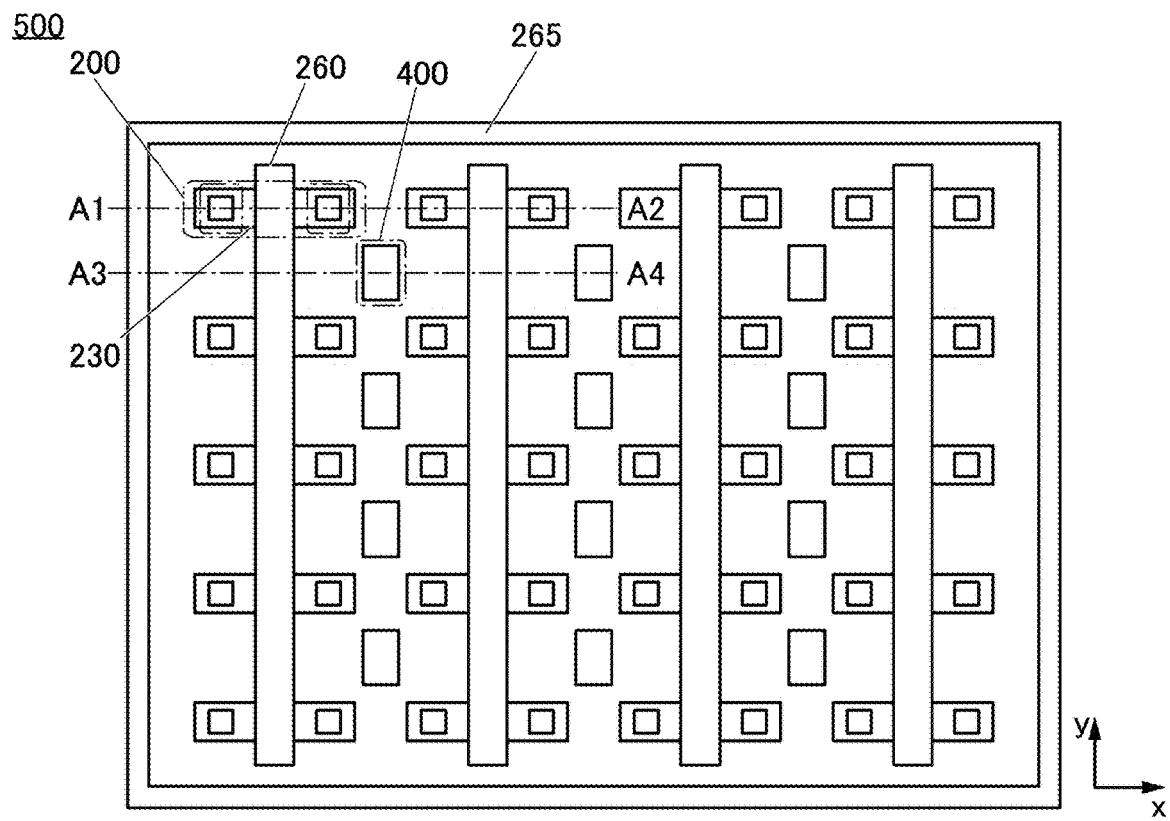
FIG. 27A is a top view of a semiconductor device of one embodiment of the present invention.
Figure 27B:
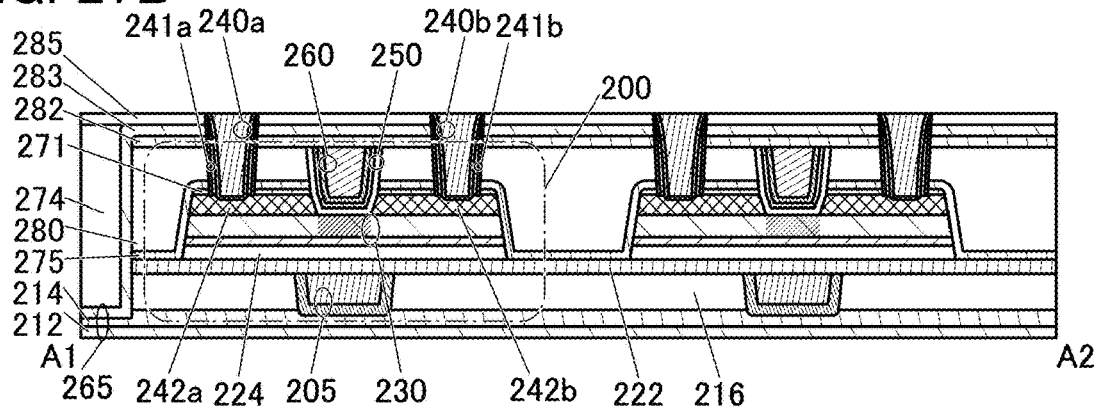
FIG. 27B and FIG. 27C are cross-sectional views of a semiconductor device of one embodiment of the present invention.
Figure 27C:
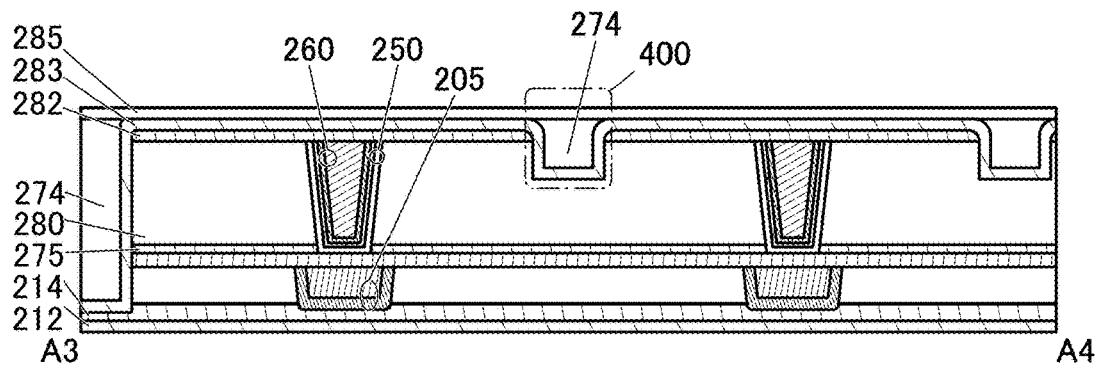

FIG. 27A is a top view of a semiconductor device 500. In FIG. 27A, the x-axis is parallel to the channel length direction of the transistor 200, and the y-axis is perpendicular to the x-axis. FIG. 27B is a cross-sectional view corresponding to a portion indicated by the dashed-dotted line A1-A2 in FIG. 27A, and is also a cross-sectional view of the transistor 200 in the channel length direction. FIG. 27C is a cross-sectional view corresponding to a portion indicated by the dashed-dotted line A3-A4 in FIG. 27A, and is also a cross-sectional view of an opening region 400 and its vicinity. Note that for clarity of the drawing, some components are omitted in the top view in FIG. 27A.

Note that in the semiconductor device illustrated in FIG. 27A to FIG. 27C, components having the same functions as the components included in the semiconductor device described in <Structure example of semiconductor device> are denoted by the same reference numerals. Note that the materials described in detail in <Structure example of semiconductor device> can be used as constituent materials of the semiconductor devices also in this section.

The semiconductor device 500 illustrated in FIG. 27A to FIG. 27C is a modification example of the semiconductor device illustrated in FIG. 15A to FIG. 15D. The semiconductor device 500 illustrated in FIG. 27A to FIG. 27C is different from the semiconductor device illustrated in FIG. 15A to FIG. 15D in that the opening region 400 is formed in the insulator 282 and the insulator 280. Moreover, the semiconductor device 500 is different from the semiconductor device illustrated in FIG. 15A to FIG. 15D in that a sealing portion 265 is formed to surround a plurality of transistors 200.

The semiconductor device 500 includes a plurality of transistors 200 and a plurality of opening regions 400, which are arranged in a matrix. In addition, a plurality of conductors 260 functioning as gate electrodes of the transistors 200 are provided to extend in the y-axis direction. The opening regions 400 are formed in regions not overlapping with the oxide 230 nor the conductor 260. The sealing portion 265 is formed to surround the plurality of transistors 200, the plurality of conductors 260, and the plurality of opening regions 400. Note that the numbers, the positions, and the sizes of the transistors 200, the conductors 260, and the opening regions 400 are not limited to those illustrated in FIG. 27A and may be set as appropriate in accordance with the design of the semiconductor device 500.

As illustrated in FIG. 27B and FIG. 27C, the sealing portion 265 is provided to surround the plurality of transistors 200, the insulator 216, the insulator 222, the insulator 275, the insulator 280, and the insulator 282. In other words, the insulator 283 is provided to cover the insulator 216, the insulator 222, the insulator 275, the insulator 280, and the insulator 282. In the sealing portion 265, the insulator 283 is in contact with a top surface of the insulator 214. In the sealing portion 265, an insulator 274 is provided between the insulator 283 and the insulator 285. A top surface of the insulator 274 is substantially level with the uppermost surface of the insulator 283. As the insulator 274, an insulator similar to the insulator 280 can be used.

With such a structure, the plurality of transistors 200 can be surrounded by the insulator 283, the insulator 214, and the insulator 212. One or more of the insulators 283, 214, and 212 preferably function as a barrier insulating film against hydrogen. Accordingly, entry of hydrogen contained in the region outside the sealing portion 265 into a region in the sealing portion 265 can be inhibited.

As illustrated in FIG. 27C, the insulator 282 has an opening portion in the opening region 400. In the opening region 400, the insulator 280 may have a groove portion overlapping with the opening portion of the insulator 282. The depth of the groove portion of the insulator 280 is less than or equal to the depth at which a top surface of the insulator 275 is exposed and is, for example, approximately greater than or equal to ¼ and less than or equal to ½ of the maximum thickness of the insulator 280.

As illustrated in FIG. 27C, the insulator 283 is in contact with a side surface of the insulator 282, the side surface of the insulator 280, and the top surface of the insulator 280 inside the opening region 400. Furthermore, part of the insulator 274 is sometimes formed to be embedded in a depression portion formed in the insulator 283 in the opening region 400. At this time, the top surface of the insulator 274 formed in the opening region 400 is substantially level with the uppermost surface of the insulator 283, in some cases.

When heat treatment is performed in such a state that the opening region 400 is formed and the insulator 280 is exposed in the opening portion of the insulator 282, part of oxygen contained in the insulator 280 can be made to outwardly diffuse from the opening region 400 while oxygen is supplied to the oxide 230. This enables oxygen to be sufficiently supplied to the region serving as the channel formation region and its vicinity in the oxide semiconductor layer from the insulator 280 containing oxygen released by heating, and also prevents an excessive amount of oxygen from being supplied thereto.

At this time, hydrogen contained in the insulator 280 can be bonded to oxygen and released to the outside through the opening region 400. The hydrogen bonded to oxygen is released as water. Thus, the amount of hydrogen contained in the insulator 280 can be reduced, and the hydrogen contained in the insulator 280 can be inhibited from entering the oxide 230.

In FIG. 27A, the shape of the opening region 400 in the top view is substantially rectangular; however, one embodiment of the present invention is not limited thereto. For example, the shape of the opening region 400 in the top view may be a rectangular shape, an elliptical shape, a circular shape, a rhombus shape, or a shape obtained by combining these. The area and placement interval of the opening regions 400 can be set as appropriate in accordance with the design of the semiconductor device including the transistor 200. For example, in the region where the density of the transistors 200 is low, the area of the opening region 400 may be increased or the placement interval of the opening regions 400 may be narrowed. For example, in the region where the density of the transistors 200 is high, the area of the opening region 400 may be decreased, or the placement interval of the opening regions may be increased.

With one embodiment of the present invention, a semiconductor device with a high on-state current can be provided. With one embodiment of the present invention, a semiconductor device with a high field-effect mobility can be provided. With one embodiment of the present invention, a semiconductor device having favorable frequency characteristics can be provided. With one embodiment of the present invention, a semiconductor device with favorable electrical characteristics can be provided. With one embodiment of the present invention, a semiconductor device with high reliability can be provided. With one embodiment of the present invention, a semiconductor device with low power consumption can be provided. With one embodiment of the present invention, a semiconductor device with a small variation in transistor characteristics can be provided. With one embodiment of the present invention, a semiconductor device that can be miniaturized or highly integrated can be provided.

The structure, method, and the like described in this embodiment can be used in an appropriate combination with structures, methods, and the like described in the other embodiments.

Embodiment 3

In this embodiment, one embodiment of a semiconductor device will be described with reference to FIG. 28 to FIG. 32.

[Memory Device 1]

Figure 28:
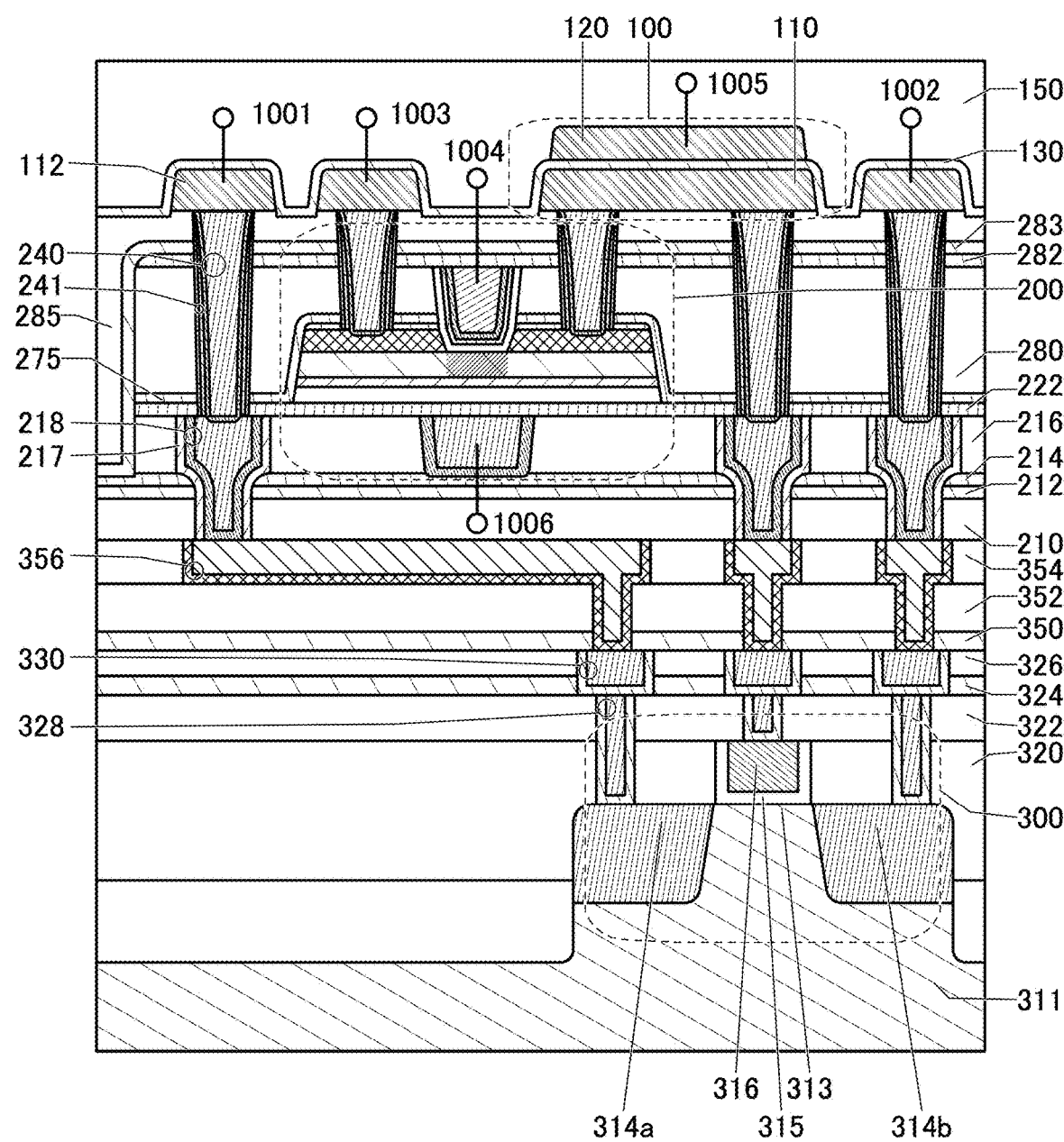
FIG. 28 is a cross-sectional view of a structure of a memory device of one embodiment of the present invention.

FIG. 28 illustrates an example of a semiconductor device (a memory device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor in which a channel is formed in a semiconductor layer containing an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device.

In the semiconductor device illustrated in FIG. 28, a wiring 1001 is electrically connected to a source of the transistor 300, and a wiring 1002 is electrically connected to a drain of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The memory devices illustrated in FIG. 28 can form a memory cell array when arranged in a matrix.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 28, the semiconductor region 313 (part of the substrate 311) in which a channel is formed has a protruding shape. In addition, the conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 illustrated in FIG. 28 is an example and the structure is not limited thereto; an appropriate transistor is used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

Here, as the insulator 130, the insulator that can be used as the insulator 275 described in the above embodiment is preferably used.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 28, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

Examples of a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of a material with high dielectric strength (a material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to increase planarity.

A wiring layer may be provided over the insulator 326 and the conductor 330. For example, in FIG. 28, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in an insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with a side surface of the conductor 218 functioning as a plug. The insulator 217 is provided in contact with the inner wall of an opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

For the insulator 217, an insulator such as silicon nitride, aluminum oxide, or silicon nitride oxide may be used. Since the insulator 217 is provided in contact with the insulator 210, the insulator 212, the insulator 214, and the insulator 222, the entry of impurities such as water and hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride is deposited by a PEALD method and an opening reaching the conductor 356 is formed by anisotropic etching.

As an insulator that can be used for an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, parasitic capacitance generated between wirings can be reduced. Thus, a material is preferably selected depending on the function of an insulator.

For example, the insulator 150, the insulator 210, the insulator 352, the insulator 354, and the like preferably include an insulator having a low relative permittivity. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide.

When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having a high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the conductor 240 and the insulator 285 and the insulator 280 that contain excess oxygen or an impurity in FIG. 28. Since the insulator 241 is provided in contact with the insulator 222, the insulator 275, the insulator 282, and the insulator 283, the insulator 224 and the transistor 200 can be sealed with the insulators having a barrier property.

That is, the insulator 241 can inhibit excess oxygen contained in the insulator 280 from being absorbed by the conductor 240. In addition, diffusion of hydrogen, which is an impurity, into the transistor 200 through the conductor 240 can be inhibited when the insulator 241 is provided.

The insulator 241 is preferably formed using an insulating material having a function of inhibiting diffusion of impurities such as water and hydrogen and oxygen. For example, silicon nitride, silicon nitride oxide, aluminum oxide, hafnium oxide, or the like is preferably used. In particular, silicon nitride is preferable because of its high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As described in the above embodiment, the transistor 200 may be sealed with the insulator 212, the insulator 214, the insulator 282, and the insulator 283. Such a structure can inhibit entry of hydrogen contained in the insulator 285, the insulator 150, or the like into the insulator 280 or the like.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 285 or the like can be inhibited from entering from the outside.

<Dicing Line>

A dicing line (sometimes referred to as a scribe line, a dividing line, or a cutting line) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 28, a region in which the insulator 283 and the insulator 214 are in contact with each other is preferably designed to overlap with the dicing line. That is, an opening is provided in the insulator 282, the insulator 280, the insulator 275, the insulator 222, and the insulator 216 in the vicinity of a region to be the dicing line that is provided on an outer edge of the memory cell including the plurality of transistors 200.

That is, in the opening provided in the insulator 282, the insulator 280, the insulator 275, the insulator 222, and the insulator 216, the insulator 214 is in contact with the insulator 283. For example, the insulator 214 and the insulator 283 may be formed using the same material and the same method. When the insulator 214 and the insulator 283 are formed using the same material and the same method, the adhesion therebetween can be increased.

With such a structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen and water from the direction of the side surface of the divided substrate into the transistor 200 can be prevented.

With the structure, excess oxygen in the insulator 280 can be prevented from diffusing to the outside. Accordingly, excess oxygen in the insulator 280 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 29:
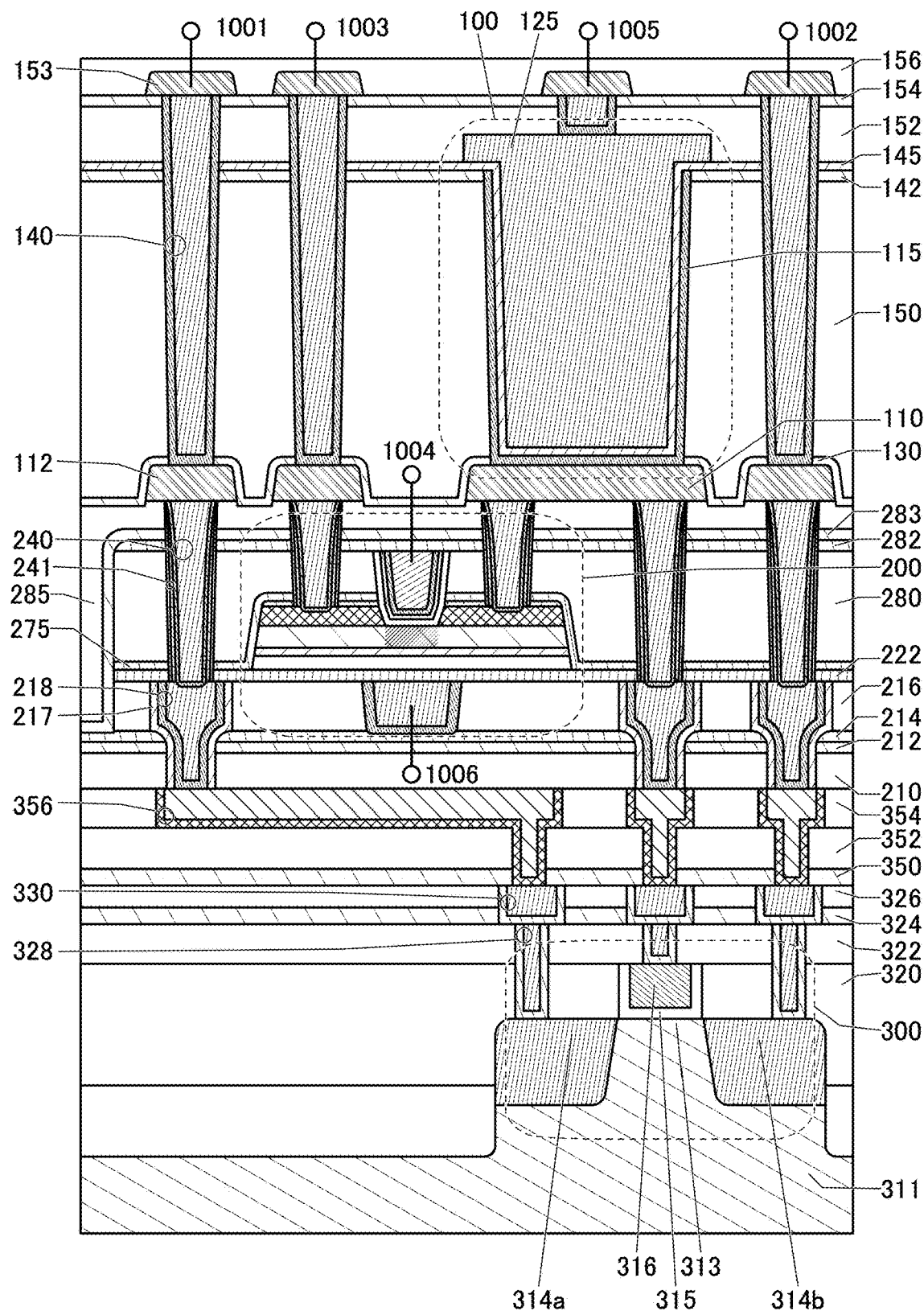
FIG. 29 is a cross-sectional view of a structure of a memory device of one embodiment of the present invention.

Note that although the capacitor 100 of the memory device illustrated in FIG. 28 has a planar shape, the memory device described in this embodiment is not limited thereto. For example, the capacitor 100 may have a cylindrical shape as illustrated in FIG. 29. Note that the structure below and including the insulator 150 of a memory device illustrated in FIG. 29 is similar to that of the semiconductor device illustrated in FIG. 28.

In the memory device illustrated in FIG. 29, the insulator 150 is provided over the insulator 130, and an insulator 142 is provided over the insulator 150. An opening is formed in the insulator 150 and the insulator 142.

The capacitor 100 illustrated in FIG. 29 includes a conductor 115, an insulator 145 over the conductor 115 and the insulator 142, and a conductor 125 over the insulator 145. Here, at least parts of the conductor 115, the insulator 145, and the conductor 125 are positioned in the opening formed in the insulator 150 and the insulator 142.

An insulator 152 is provided over the conductor 125 and the insulator 145, an insulator 154 is provided over the insulator 152, and a conductor 153 and an insulator 156 are provided over the insulator 154. Here, a conductor 140 is provided in an opening formed in the insulator 130, the insulator 150, the insulator 142, the insulator 145, the insulator 152, and the insulator 154.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric sandwiched therebetween on a side surface as well as a bottom surface of the opening in the insulator 150 and the insulator 142; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used as the insulator 280 can be used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 115 is positioned in contact with the opening formed in the insulator 142 and the insulator 150. The top surface of the conductor 115 is preferably substantially level with a top surface of the insulator 142. Furthermore, a bottom surface of the conductor 115 is in contact with the conductor 110 through an opening in the insulator 130. The conductor 115 is preferably formed by an ALD method, a CVD method, or the like; for example, a conductor that can be used as the conductor 205 is used.

The insulator 145 is positioned to cover the conductor 115 and the insulator 142. The insulator 145 is preferably formed by an ALD method or a CVD method, for example. The insulator 145 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with high dielectric strength, such as silicon oxynitride, or a high permittivity (high-k) material is preferably used. Alternatively, a stacked-layer structure using a material with high dielectric strength and a high permittivity (high-k) material may be employed.

Examples of a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can ensure sufficient capacitance of the capacitor 100 even when the insulator 145 has a large thickness. When the insulator 145 has a large thickness, leakage current generated between the conductor 115 and the conductor 125 can be inhibited.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride deposited by an ALD method, silicon oxide deposited by a PEALD method, and silicon nitride deposited by an ALD method are stacked in this order. The use of such an insulator with high dielectric strength can increase the dielectric strength and inhibit electrostatic breakdown of the capacitor 100.

The conductor 125 is positioned to fill the opening formed in the insulator 142 and the insulator 150. The conductor 125 is electrically connected to the wiring 1005 through the conductor 140 and the conductor 153. The conductor 125 is preferably formed by an ALD method, a CVD method, or the like and is formed using a conductor that can be used as the conductor 205, for example.

The conductor 153 is provided over the insulator 154 and is covered with the insulator 156. The conductor 153 is formed using a conductor that can be used as the conductor 112, and the insulator 156 is formed using an insulator that can be used as the insulator 152. Here, the conductor 153 is in contact with a top surface of the conductor 140 and functions as a terminal of the capacitor 100, the transistor 200, or the transistor 300.

[Memory Device 2]

Figure 30:
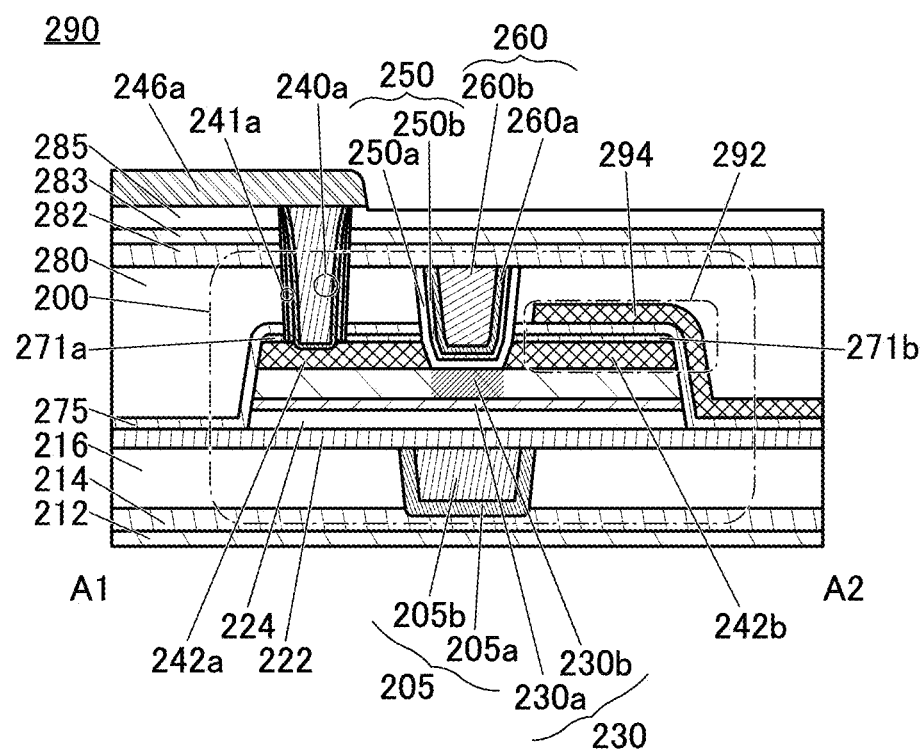
FIG. 30 is a cross-sectional view of a semiconductor device of one embodiment of the present invention.

FIG. 30 illustrates an example of a semiconductor device (a memory device) of one embodiment of the present invention.

<Structure Example of Memory Device>

FIG. 30 is a cross-sectional view of a semiconductor device including a memory device 290. The memory device 290 illustrated in FIG. 30 includes a capacitor device 292 besides the transistor 200 illustrated in FIG. 15A to FIG. 15D. FIG. 30 corresponds to a cross-sectional view of the transistor 200 in the channel length direction.

The capacitor device 292 includes the conductor 242b, the insulator 271b provided over the conductor 242b, the insulator 275 provided to cover the conductor 242b and the insulator 271b, and a conductor 294 over the insulator 275. In other words, the capacitor device 292 forms a MIM (Metal-Insulator-Metal) capacitor. Note that one of a pair of electrodes included in the capacitor device 292, i.e., the conductor 242b, can also serve as the source electrode of the transistor. The dielectric layer included in the capacitor device 292 can also serve as a protective layer provided in the transistor, i.e., the insulator 271 and the insulator 275. Thus, the manufacturing process of the capacitor device 292 can also serve as part of the manufacturing process of the transistor; therefore, the productivity of the semiconductor device can be improved. Furthermore, one of the pair of electrodes included in the capacitor device 292, that is, the conductor 242b, also serves as the source electrode of the transistor; therefore, the area in which the transistor and the capacitor device are positioned can be reduced.

Note that the conductor 294 can be formed using, for example, a material that can be used for the conductor 242.

<Modification Example of Memory Device>

Examples of a semiconductor device of one embodiment of the present invention including the transistor 200 and the capacitor device 292, which are different from the one described above in <Structure example of memory device>, will be described below with reference to FIG. 31A, FIG. 31B, and FIG. 32. Note that in the semiconductor devices illustrated in FIG. 31A, FIG. 31B, and FIG. 32, structures having the same function as those included in the semiconductor devices described in the above embodiment and <Structure example of memory device> (see FIG. 30) are denoted by the same reference numerals. Note that the materials described in detail in the above embodiment and <Structure example of memory device> can be used as constituent materials of the transistor 200 and the capacitor device 292 in this section.

<<Modification Example 1 of Memory Device>>

An example of a semiconductor device 600 of one embodiment of the present invention including a transistor 200a, a transistor 200b, a capacitor device 292a, and a capacitor device 292b will be described below with reference to FIG. 31A.

Figure 31A:
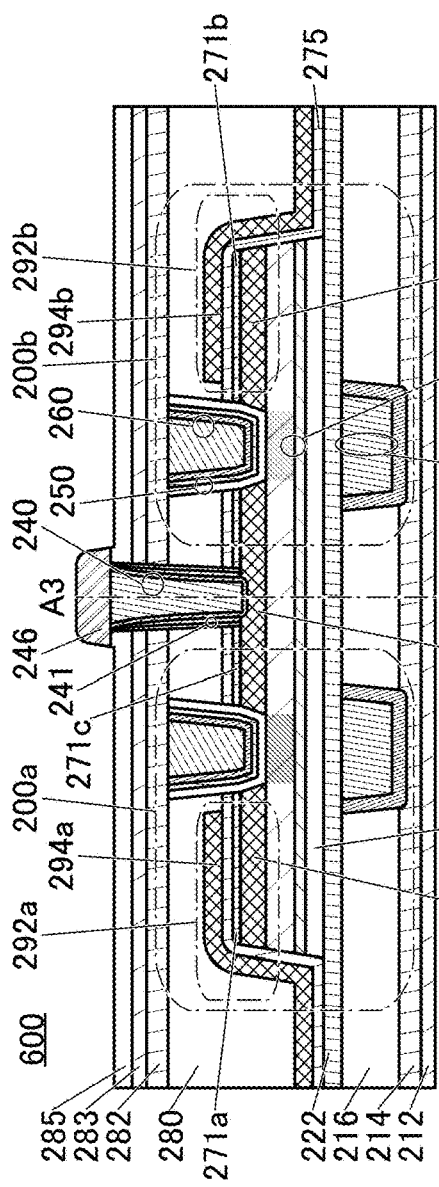
FIG. 31A and FIG. 31B are cross-sectional views of a semiconductor device of one embodiment of the present invention.
Figure 32:
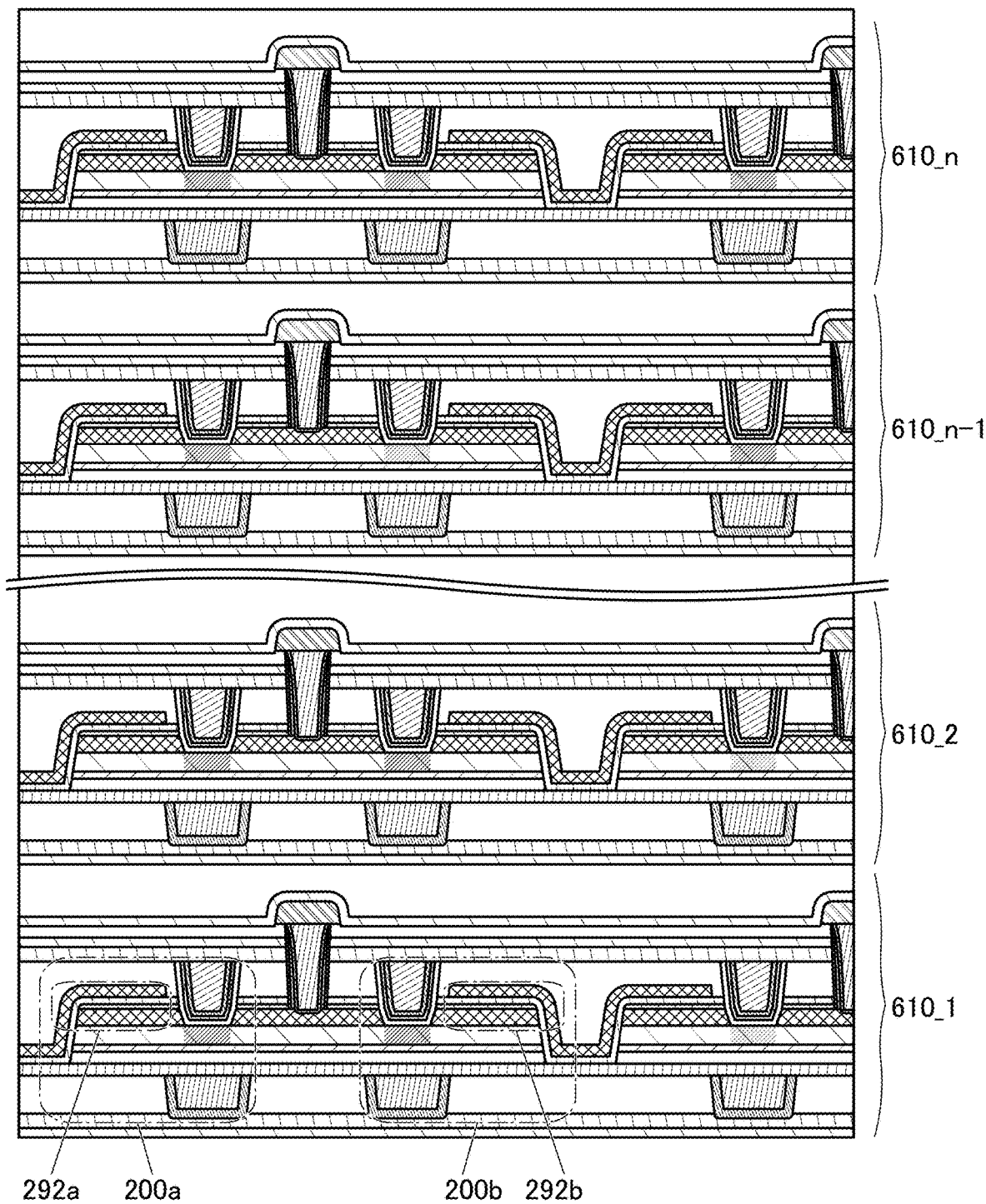
FIG. 32 is a cross-sectional view of a semiconductor device of one embodiment of the present invention.

FIG. 31A is a cross-sectional view of the semiconductor device 600 including the transistor 200a, the transistor 200b, the capacitor device 292a, and the capacitor device 292b in the channel length direction. Here, the capacitor device 292a includes the conductor 242a, the insulator 271a provided over the conductor 242a, the insulator 275 provided to cover the conductor 242a and the insulator 271a, and a conductor 294a provided over the insulator 275. The capacitor device 292b includes the conductor 242b, the insulator 271b provided over the conductor 242b, the insulator 275 provided to cover the conductor 242b and the insulator 271b, and a conductor 294b provided over the insulator 275.

The semiconductor device 600 has a line-symmetric structure with respect to the dashed-dotted line A3-A4 as illustrated in FIG. 31A. A conductor 242c serves as one of a source electrode and a drain electrode of the transistor 200a and one of a source electrode and a drain electrode of the transistor 200b. An insulator 271c is provided over the conductor 242c. The conductor 240 functioning as a plug connects the conductor 246 functioning as a wiring and the transistor 200a to each other, and also connects the conductor 246 functioning as a wiring and the transistor 200b to each other. Accordingly, when the connection of the two transistors, the two capacitor devices, the wiring, and the plug has the above-described structure, a semiconductor device that can be miniaturized or highly integrated can be provided.

The structure examples of the semiconductor device in FIG. 15A to FIG. 15D and FIG. 30 can be referred to for the structures and the effects of the transistor 200a, the transistor 200b, the capacitor device 292a, and the capacitor device 292b.

<<Modification Example 2 of Memory Device>>

In the above description, the semiconductor device including the transistor 200a, the transistor 200b, the capacitor device 292a, and the capacitor device 292b is given as a structure example; however, the semiconductor device of this embodiment is not limited thereto. For example, as illustrated in FIG. 31B, a structure in which the semiconductor device 600 and a semiconductor device having a structure similar to that of the semiconductor device 600 are connected through a capacitor portion may be employed. In this specification, the semiconductor device including the transistor 200a, the transistor 200b, the capacitor device 292a, and the capacitor device 292b is referred to as a cell. For the structures of the transistor 200a, the transistor 200b, the capacitor device 292a, and the capacitor device 292b, the above description of the transistor 200a, the transistor 200b, the capacitor device 292a, and the capacitor device 292b can be referred to.

Figure 31B:
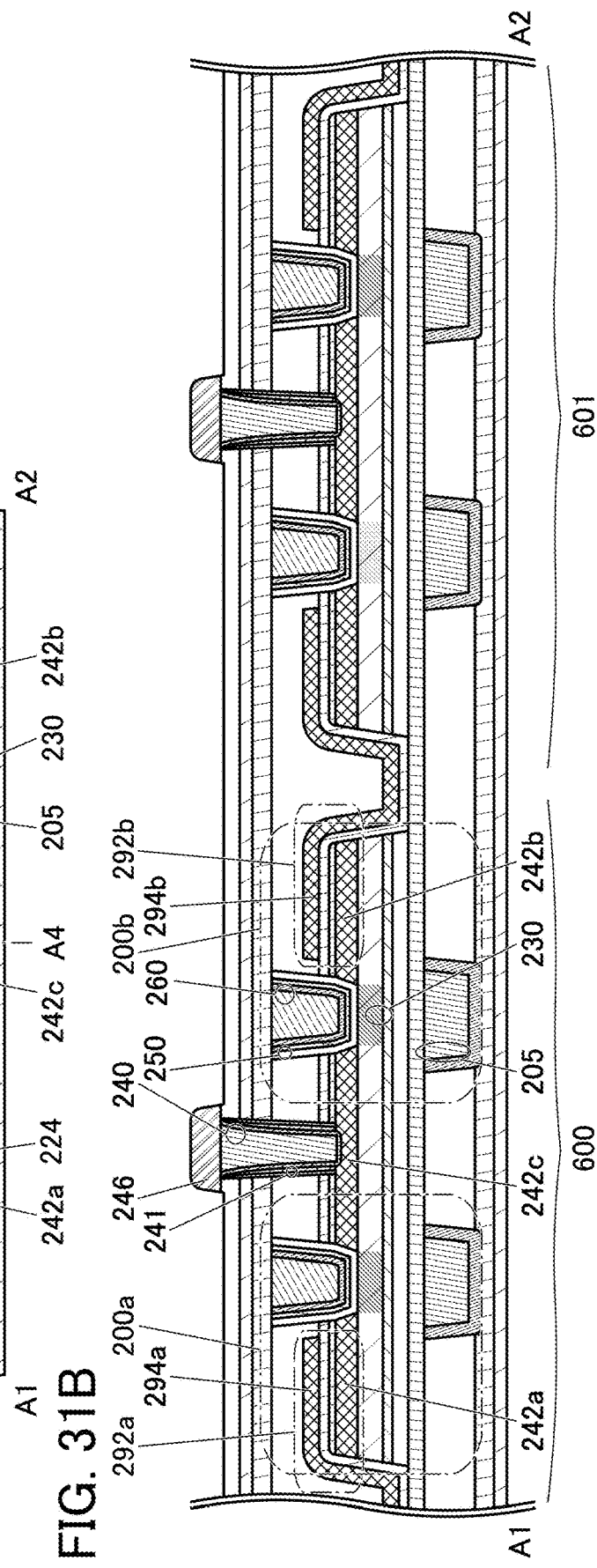

FIG. 31B is a cross-sectional view in which the semiconductor device 600 including the transistor 200a, the transistor 200b, the capacitor device 292a, and the capacitor device 292b, and a cell having a structure similar to that of the semiconductor device 600 are connected through a capacitor portion.

As illustrated in FIG. 31B, the conductor 294b functioning as one electrode of the capacitor device 292b included in the semiconductor device 600 also serves as one electrode of a capacitor device included in a semiconductor device 601 having a structure similar to that of the semiconductor device 600. Although not illustrated, the conductor 294a functioning as one electrode of the capacitor device 292a included in the semiconductor device 600 also serves as one electrode of a capacitor device included in a semiconductor device on the left side of the semiconductor device 600, that is, a semiconductor device adjacent to the semiconductor device 600 in the A1 direction in FIG. 31B. The cell on the right side of the semiconductor device 601, that is, the cell in the A2 direction in FIG. 31B, has a similar structure. That is, a cell array (also referred to as a memory device layer) can be formed. With this structure of the cell array, the space between the adjacent cells can be reduced; thus, the projected area of the cell array can be reduced and high integration can be achieved. When the cells illustrated in FIG. 31B are arranged in a matrix, a matrix-shape cell array can be formed.

When the transistor 200a, the transistor 200b, the capacitor device 292a, and the capacitor device 292b are formed to have the structures described in this embodiment as described above, the area of the cell can be reduced and the semiconductor device including a cell array can be miniaturized or highly integrated.

Furthermore, the cell array may have a stacked-layer structure instead of a single-layer structure. FIG. 32 illustrates a cross-sectional view of n layers of cell arrays 610 that are stacked. When a plurality of cell arrays (a cell array 610_1 to a cell array 610_n) are stacked as illustrated in FIG. 32, cells can be integrally placed without increasing the area occupied by the cell arrays. In other words, a 3D cell array can be formed.

The structure, method, and the like described in this embodiment can be used in an appropriate combination with other structures, configurations, methods, and the like described in the other embodiments.

Embodiment 4

In this embodiment, a memory device of one embodiment of the present invention including a transistor in which an oxide is used as a semiconductor (hereinafter, referred to as an OS transistor in some cases) and a capacitor (hereinafter, referred to as an OS memory device in some cases), will be described with reference to FIG. 33A, FIG. 33B, and FIG. 34A to FIG. 34H. The OS memory device is a memory device including at least a capacitor and the OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 33A:
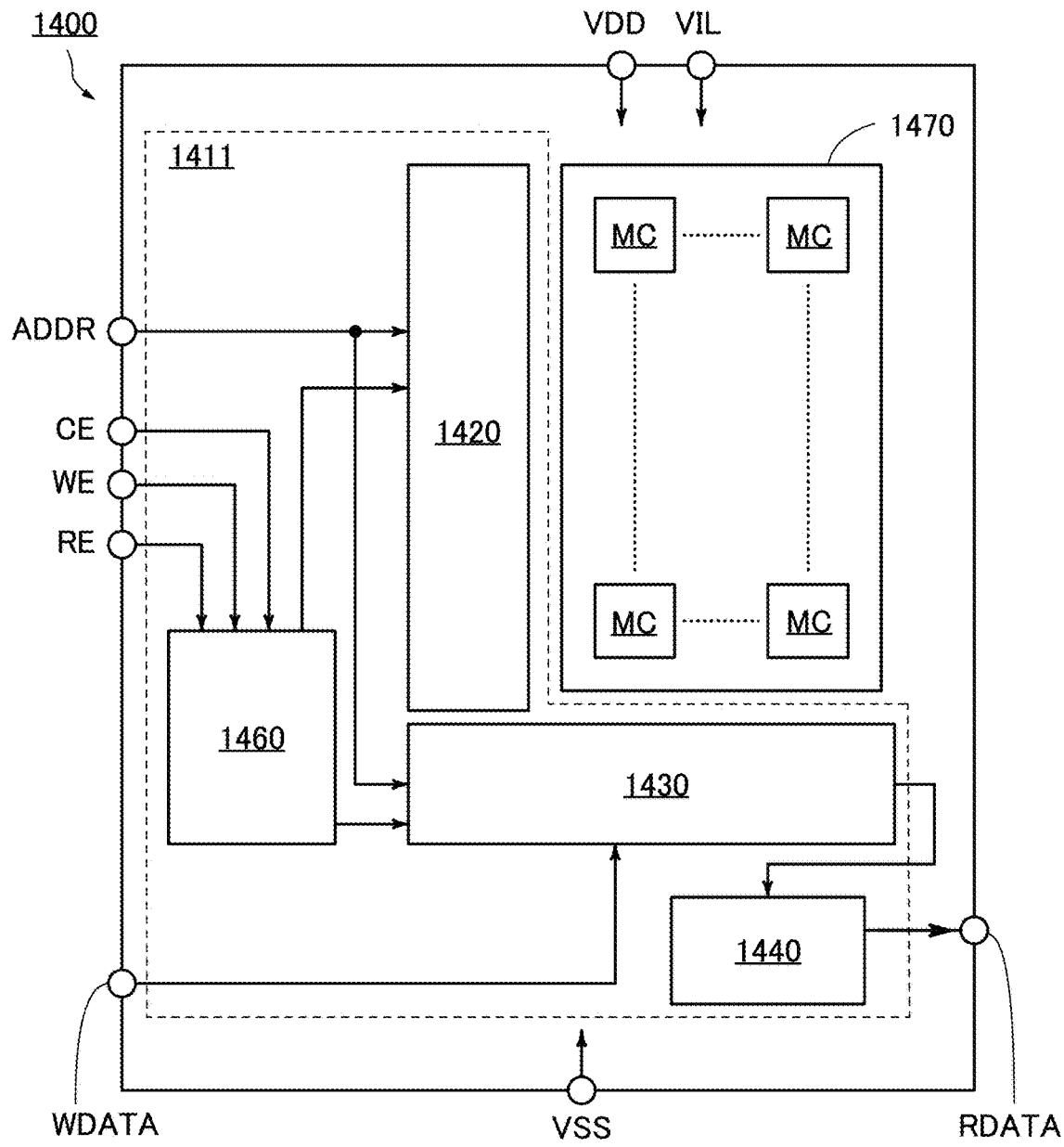
FIG. 33A is a block diagram illustrating a structure example of a memory device of one embodiment of the present invention.

FIG. 33A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 33B:
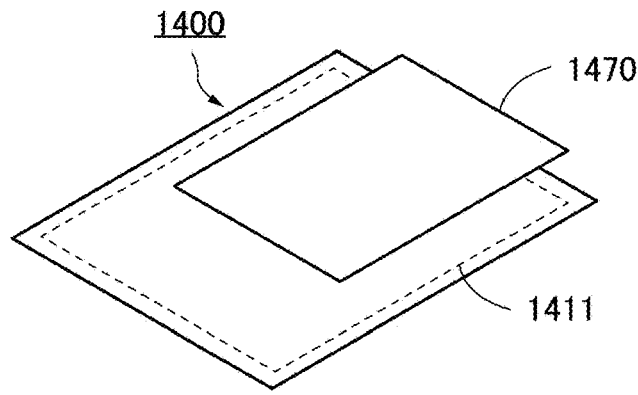
FIG. 33B is a schematic diagram of a structure example of a memory device of one embodiment of the present invention.

Note that FIG. 33A illustrates an example in which the peripheral circuit 1411 and the memory cell array 1470 are formed on the same plane; however, this embodiment is not limited thereto. For example, as illustrated in FIG. 33B, the memory cell array 1470 may be provided to overlap with part of the peripheral circuit 1411. For example, the sense amplifier may be provided below the memory cell array 1470 so that they overlap with each other.

FIG. 34A to FIG. 34H illustrate structure examples of a memory cell that can be used as the memory cell MC.

[DOSRAM]

Figure 34A:
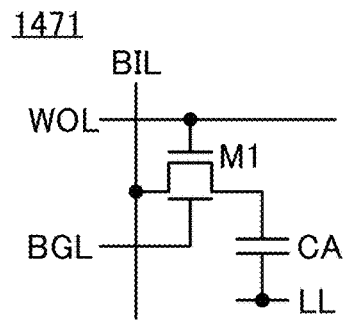
FIG. 34A to FIG. 34H are circuit diagrams illustrating structure examples of memory devices of one embodiment of the present invention.
Figure 34B:
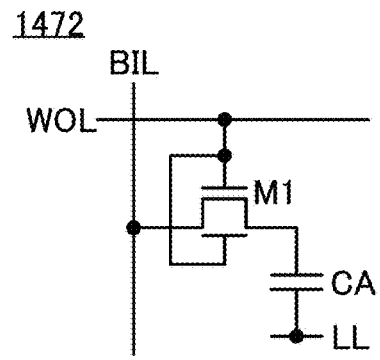
Figure 34C:
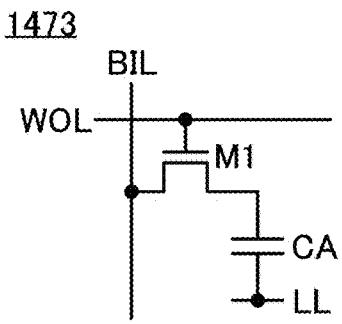

FIG. 34A to FIG. 34C illustrate circuit structure examples of a memory cell of a DRAM. In this specification and the like, a DRAM using a memory cell including one OS transistor and one capacitor is referred to as a DOSRAM (registered trademark, Dynamic Oxide Semiconductor Random Access Memory) in some cases. A memory cell 1471 illustrated in FIG. 34A includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring LL.

The wiring BIL functions as a bit line, and the wiring WOL functions as a word line. The wiring LL functions as a wiring for applying a predetermined potential to the second terminal of the capacitor CA. At the time of data writing and data reading, the wiring LL may be at a ground potential or a low-level potential. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 34A corresponds to the memory device illustrated in FIG. 30. That is, the transistor M1 and the capacitor CA correspond to the transistor 200 and the capacitor device 292, respectively.

The memory cell MC is not limited to the memory cell 1471, and the circuit structure can be changed. For example, as in a memory cell 1472 illustrated in FIG. 34B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 34C.

In the case where the semiconductor device described in the above embodiment is used in the memory cell 1471 or the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long period of time, and thus the frequency of the refresh operation for the memory cell can be decreased. Alternatively, refresh operation for the memory cell can be omitted. In addition, since the transistor M1 has an extremely low leakage current, multi-level data or analog data can be retained in the memory cell 1471, the memory cell 1472, and the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIG. 34D to FIG. 34G each illustrate a circuit structure example of a gain-cell memory cell including two transistors and one capacitor. A memory cell 1474 illustrated in FIG. 34D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. At the time of data writing, during data retention, and at the time of data reading, it is preferable that a potential be applied to either the wiring CAL or the wiring SL as appropriate to control the potential difference between the gate and the source of the transistor M3. The wiring BGL functions as a wiring for applying a potential to the back gate of the transistor M2. By applying a given potential to the wiring BGL, the threshold voltage of the transistor M2 can be increased or decreased.

Figure 34D:
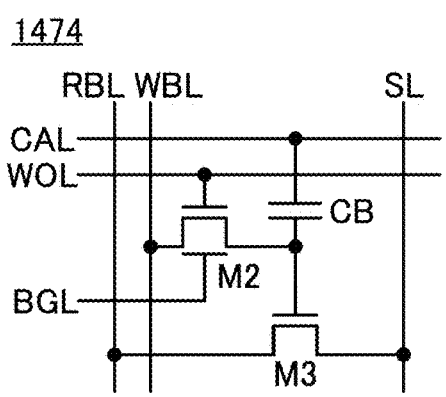
Figure 34E:
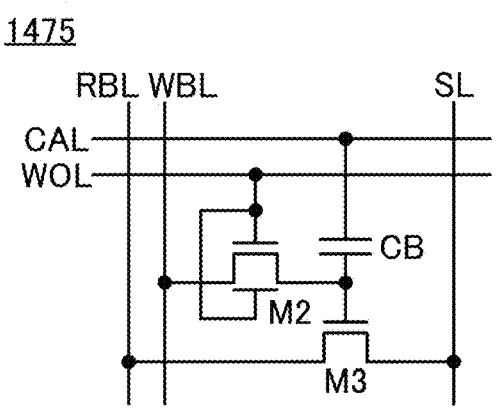
Figure 34F:
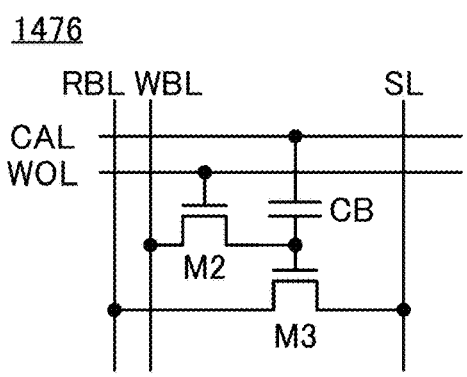
Figure 34G:
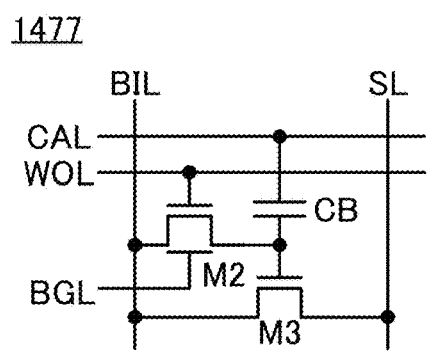

Here, the memory cell 1474 illustrated in FIG. 34D corresponds to the memory device illustrated in FIG. 28. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

In addition, the memory cell MC is not limited to the memory cell 1474, and the circuit structure can be changed as appropriate. For example, as in a memory cell 1475 illustrated in FIG. 34E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 illustrated in FIG. 34F. For example, the memory cell MC may have a structure in which the wiring WBL and the wiring RBL are combined into one wiring BIL as in a memory cell 1477 illustrated in FIG. 34G.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with the use of the transistor M2, written data can be retained for a long period of time, and thus the frequency of the refresh operation for the memory cell can be decreased. Alternatively, refresh operation for the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter, referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistor M2 and the transistor M3, the circuit of the memory cell array 1470 can be formed using only n-channel transistors.

Figure 34H:
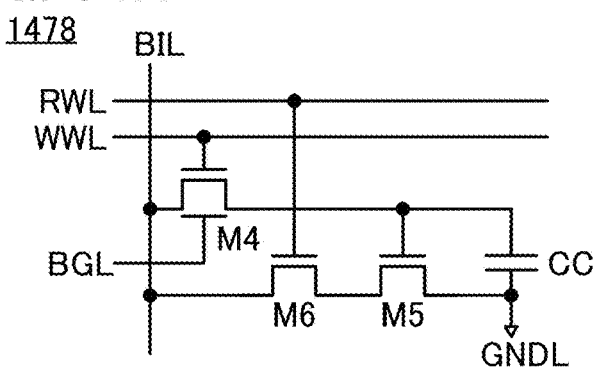

FIG. 34H illustrates an example of a gain-cell memory cell including three transistors and one capacitor. A memory cell 1478 illustrated in FIG. 34H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

In the case where the semiconductor device described in the above embodiment is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

In general, a variety of memory devices (memories) are used in semiconductor devices such as a computer in accordance with the intended use. The semiconductor device of one embodiment of the present invention can be suitably used for a memory included as a register in an arithmetic processing device such as a CPU, an SRAM (Static Random Access Memory), a DRAM (Dynamic Random Access Memory), and a 3D NAND memory, for example.

A memory included as a register in an arithmetic processing device such as a CPU is used for temporary storage of arithmetic operation results, for example, and thus is very frequently accessed by the arithmetic processing device. Accordingly, rapid operation is more important than the memory capacity. The register also has a function of retaining setting information of the arithmetic processing device, for example.

An SRAM is used for a cache, for example. The cache has a function of retaining a copy of part of data retained in a main memory. By copying data which is frequently used and holding the copy of the data in the cache, the access speed to the data can be increased.

A DRAM is used for the main memory, for example. The main memory has a function of retaining a program or data which is read from a storage. The record density of a DRAM is approximately 0.1 to 0.3 Gbit/mm$^2$.

A 3D NAND memory is used for a storage, for example. The storage has a function of retaining data that needs to be retained for a long time and programs used in an arithmetic processing device, for example. Therefore, the storage needs to have a high memory capacity and a high record density rather than operating speed. The record density of a memory device used for a storage is approximately 0.6 to 6.0 Gbit/mm$^2$.

The memory device of one embodiment of the present invention operates fast and can retain data for a long time. The memory device of one embodiment of the present invention can be suitably used as a memory device in a boundary region including both the level in which a cache is placed and the level in which a main memory is placed. Alternatively, the memory device of one embodiment of the present invention can be suitably used as a memory device in a boundary region including both the level in which a main memory is placed and the level in which a storage is placed.

The structure described in this embodiment can be used in an appropriate combination with the structures described in the other embodiments and the like.

Embodiment 5

In this embodiment, an example of a chip 1200 on which the semiconductor device of the present invention is mounted will be described with reference to FIG. 35A and FIG. 35B. A plurality of circuits (systems) are mounted on the chip 1200. A technique for integrating a plurality of circuits (systems) into one chip is referred to as system on chip (SoC) in some cases.

Figure 35A:
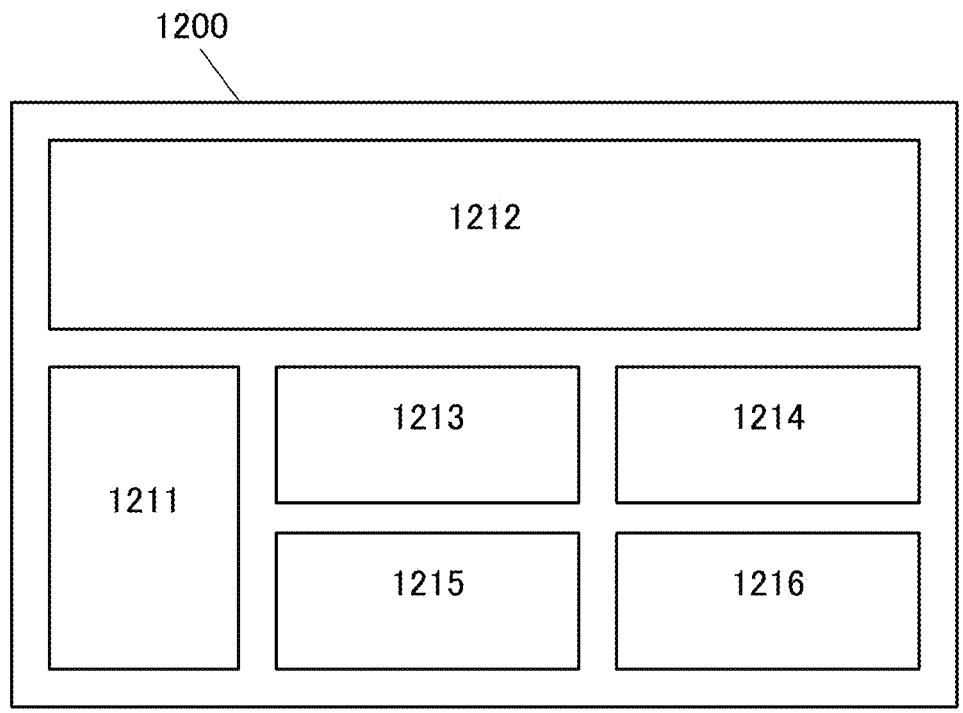
FIG. 35A and FIG. 35B are schematic diagrams of a semiconductor device of one embodiment of the present invention.

As illustrated in FIG. 35A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 35B:
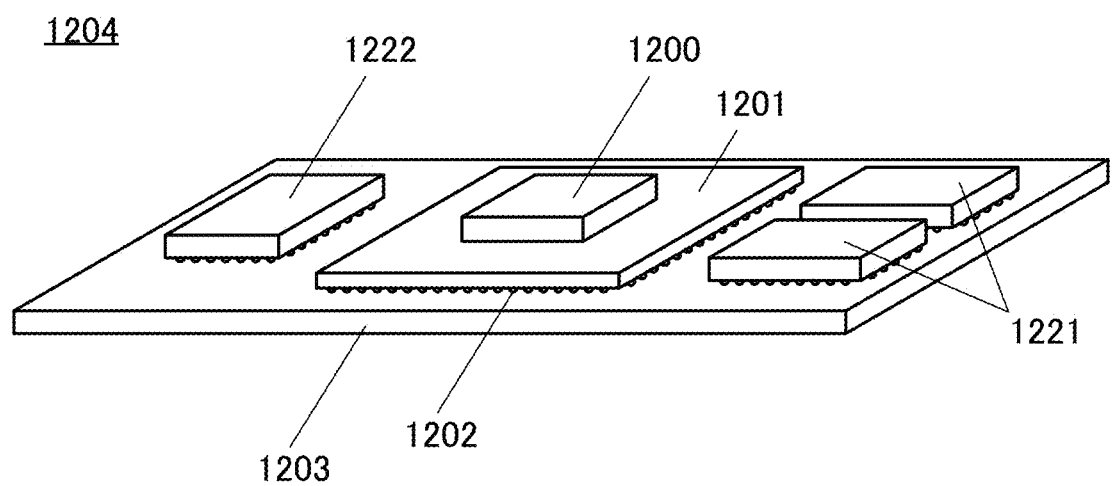

A bump (not illustrated) is provided on the chip 1200, and as illustrated in FIG. 35B, the chip 1200 is connected to a first surface of a printed circuit board (PCB) 1201. In addition, a plurality of bumps 1202 are provided on the rear side of the first surface of the PCB 1201, and the PCB 1201 is connected to a motherboard 1203.

Memory devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 has a function of controlling connection to a LAN (Local Area Network) or the like. The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 6

In this embodiment, examples of electronic components and electronic devices in which the memory device or the like described in the above embodiment is incorporated will be described.

<Electronic Component>

Figure 36A:
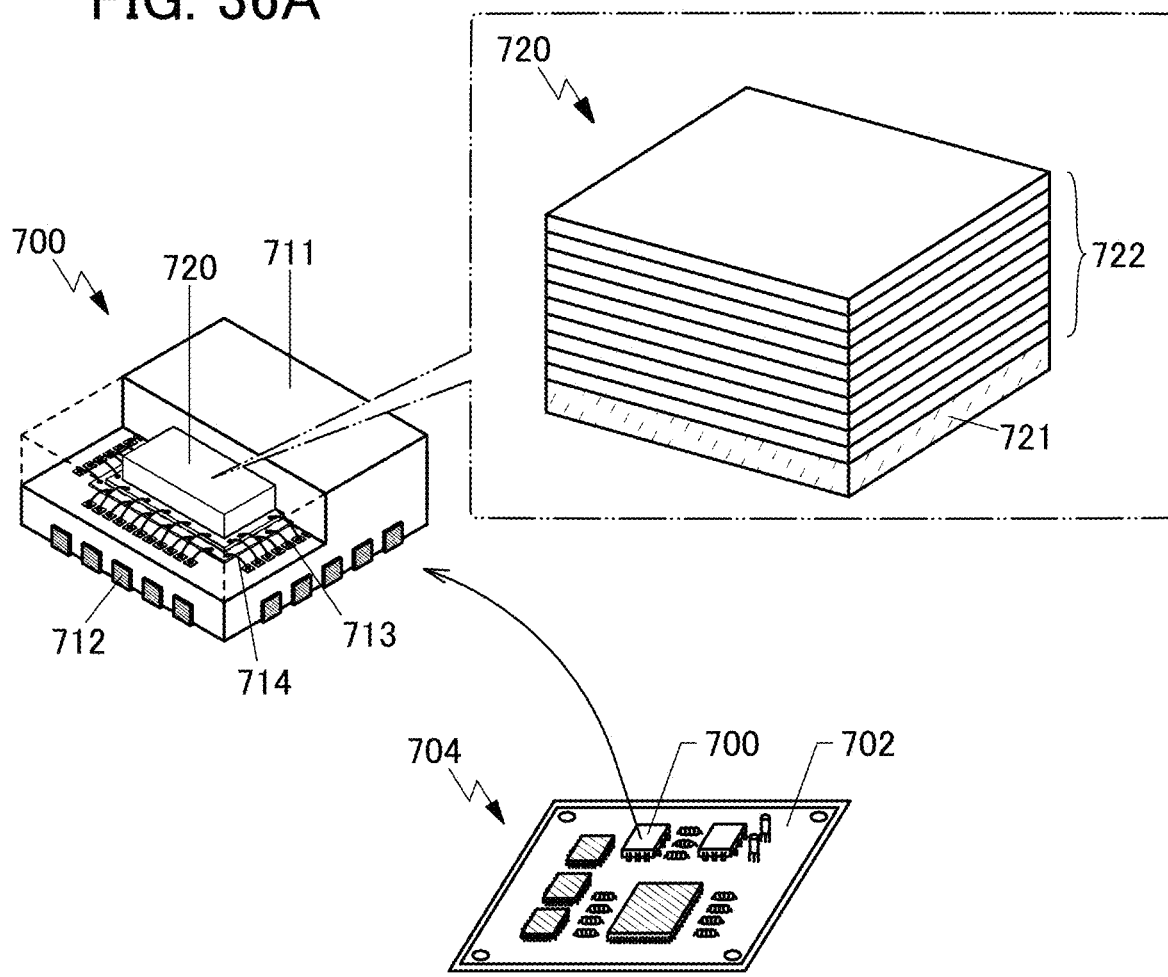
FIG. 36A and FIG. 36B are diagrams illustrating examples of electronic components.
Figure 36B:
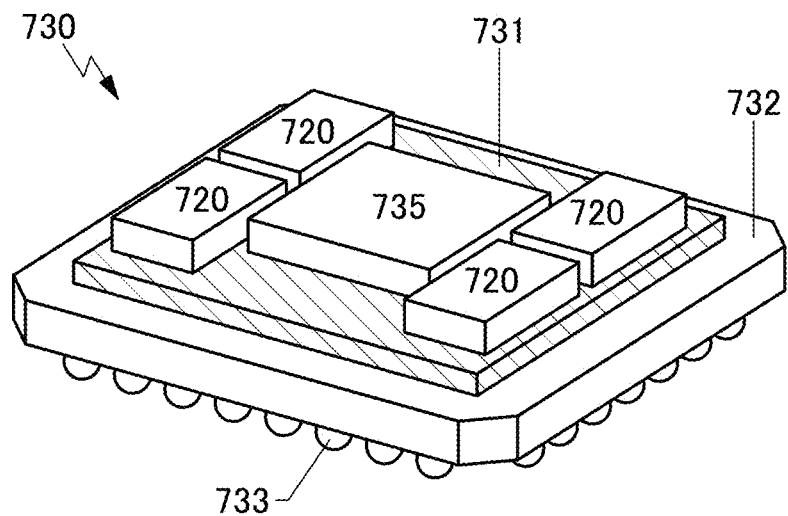

First, FIG. 36A and FIG. 36B illustrate examples of an electronic component including a memory device 720.

FIG. 36A is a perspective view of an electronic component 700 and a substrate (circuit board 704) on which the electronic component 700 is mounted. The electronic component 700 illustrated in FIG. 36A includes the memory device 720 in a mold 711. FIG. 36A omits part of the electronic component to show the inside of the electronic component 700. The electronic component 700 includes a land 712 outside the mold 711. The land 712 is electrically connected to an electrode pad 713, and the electrode pad 713 is electrically connected to the memory device 720 via a wire 714. The electronic component 700 is mounted on a printed circuit board 702, for example. A plurality of such electronic components are combined and electrically connected to each other on the printed circuit board 702, thereby forming the circuit board 704.

The memory device 720 includes a driver circuit layer 721 and a memory circuit layer 722.

FIG. 36B is a perspective view of an electronic component 730. The electronic component 730 is an example of a SiP (System in package) or an MCM (Multi Chip Module). In the electronic component 730, an interposer 731 is provided over a package substrate 732 (printed circuit board) and a semiconductor device 735 and a plurality of memory devices 720 are provided over the interposer 731.

The electronic component 730 using the memory device 720 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 to be used for electrically connecting the integrated circuit and the package substrate 732. In the case of using a silicon interposer, a TSV (Through Silicon Via) can also be used as the through electrode.

A silicon interposer is preferably used as the interposer 731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon is less likely to occur. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In the case of providing a heat sink, the heights of integrated circuits provided on the interposer 731 are preferably equal to each other. In the electronic component 730 of this embodiment, the heights of the memory device 720 and the semiconductor device 735 are preferably equal to each other, for example.

An electrode 733 may be provided on the bottom portion of the package substrate 732 to mount the electronic component 730 on another substrate. FIG. 36B illustrates an example in which the electrode 733 is formed of a solder ball. Solder balls are provided in a matrix on the bottom portion of the package substrate 732, whereby a BGA (Ball Grid Array) can be achieved. Alternatively, the electrode 733 may be formed of a conductive pin. When conductive pins are provided in a matrix on the bottom portion of the package substrate 732, a PGA (Pin Grid Array) can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in combination with any of the structures described in the other embodiments and the like, as appropriate.

Embodiment 7

In this embodiment, application examples of the memory device using the semiconductor device described in the above embodiment will be described. The semiconductor device described in the above embodiment can be used for, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is used for a variety of removable memory devices such as memory cards (e.g., SD cards), USB memories, and SSDs (solid state drives). FIG. 37A to FIG. 37E schematically illustrate some structure examples of removable memory devices. The semiconductor device described in the above embodiment is processed into a packaged memory chip and used in a variety of storage devices and removable memories, for example.

FIG. 37A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

FIG. 37B is a schematic external view of an SD card, and FIG. 37C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

FIG. 37D is a schematic external view of an SSD, and FIG. 37E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in combination with any of the structures described in the other embodiments and the like, as appropriate.

Embodiment 8

The semiconductor device of one embodiment of the present invention can be used as a processor such as a CPU or a GPU or a chip. FIG. 38A to FIG. 38H illustrate specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 38A to FIG. 38H illustrate examples of electronic devices.

[Information Terminal]

Figure 38A:
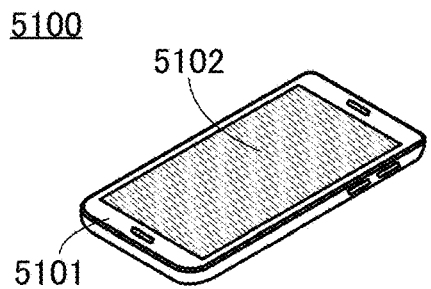
FIG. 38A to FIG. 38H are diagrams illustrating electronic devices of one embodiment of the present invention.

FIG. 38A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is used in the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 38B:
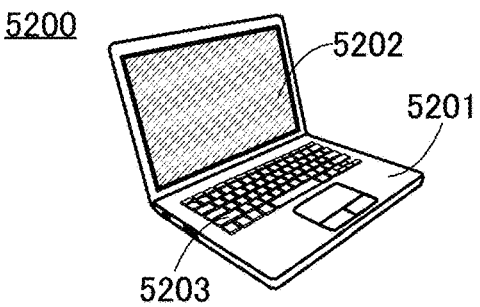

FIG. 38B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is used in the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 38A and FIG. 38B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machine]

Figure 38C:
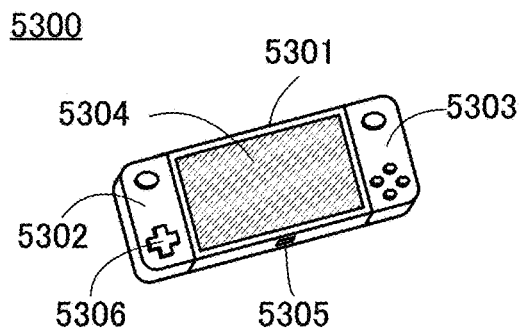

FIG. 38C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302, and the housing 5303, for example.

Figure 38D:
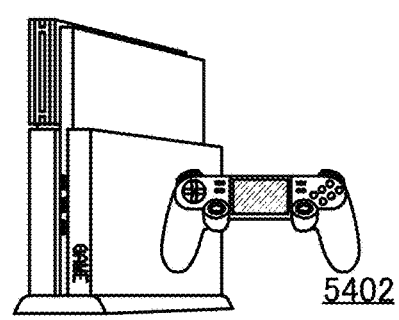

FIG. 38D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is used in the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 38C and FIG. 38D, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 38E:
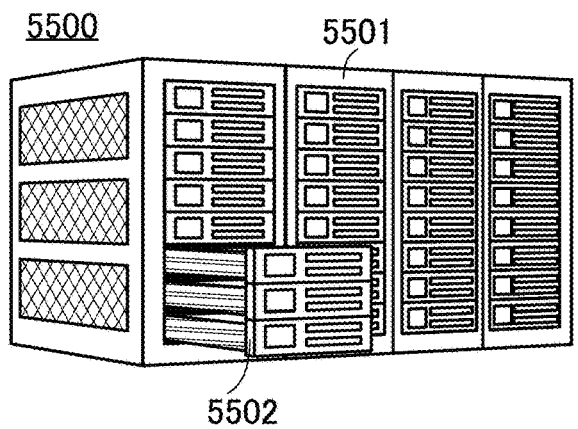
Figure 38F:
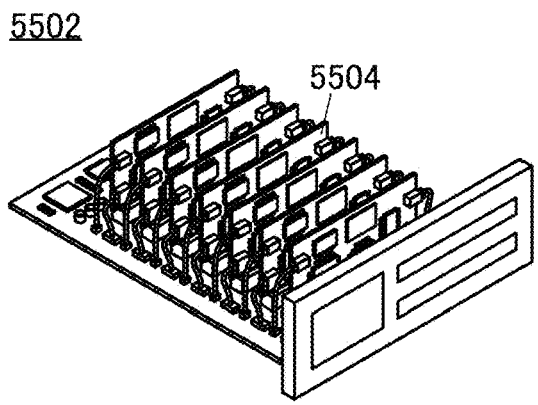

FIG. 38E illustrates a supercomputer 5500 as an example of a large computer. FIG. 38F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is high and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is illustrated as an example of a large computer in FIG. 38E and FIG. 38F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be used in an automobile, which is a moving vehicle, and the periphery of a driver's seat in the automobile.

Figure 38G:
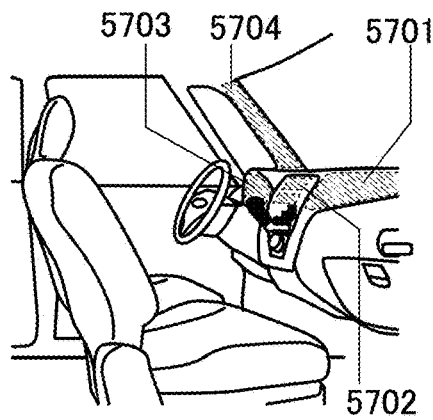

FIG. 38G illustrates an area around a windshield inside an automobile, which is an example of a moving vehicle. FIG. 38G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing a video taken by an imaging device (not illustrated) provided for the automobile. That is, displaying an image taken by the imaging device provided outside the automobile leads to compensation for the blind spot and an increase in safety. In addition, displaying a video to compensate for a portion that cannot be seen makes it possible for the driver to confirm the safety more naturally and comfortably. The display panel 5704 can also be used as a lighting device.

Since the GPU or the chip of one embodiment of the present invention can be used as a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is used in each of these moving vehicles.

[Household Appliance]

Figure 38H:
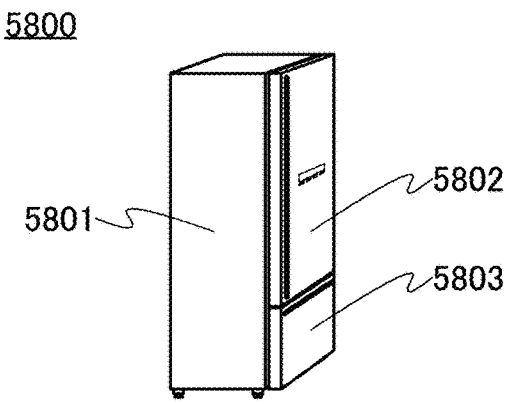

FIG. 38H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in combination with any of the structures described in the other embodiments and the like, as appropriate.

REFERENCE NUMERALS

10: base film, 11: structure body, 20: metal oxide, 21_1: crystal, 21_2: crystal, 22_1: region, 23a: region, 23b: region, 23c: region, 31: layer, 32: layer, 32a: layer, 32b: layer, 33: layer, 51: area, 53: region, 54: region, 61: precursor, 62: reactant, 100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, 200a: transistor, 200b: transistor, 205: conductor, 205a: conductor, 205b: conductor, 210: insulator, 212: insulator, 214: insulator, 216: insulator, 217: insulator, 218: conductor, 222: insulator, 224: insulator, 224A: insulating film, 230: oxide, 230a: oxide, 230A: oxide film, 230b: oxide, 230B: oxide film, 230ba: region, 230bb: region, 230bc: region, 240: conductor, 240a: conductor, 240b: conductor, 241: insulator, 241a: insulator, 241b: insulator, 242: conductor, 242a: conductor, 242A: conductive film, 242b: conductor, 242B: conductive layer, 242c: conductor, 246: conductor, 246a: conductor, 246b: conductor, 250: insulator, 250a: insulator, 250A: insulating film, 250b: insulator, 250B: insulating film, 250c: insulator, 260: conductor, 260a: conductor, 260b: conductor, 265: sealing portion, 271: insulator, 271a: insulator, 271A: insulating film, 271b: insulator, 271B: insulating layer, 271c: insulator, 274: insulator, 275: insulator, 280: insulator, 282: insulator, 283: insulator, 285: insulator, 290: memory device, 292: capacitor device, 292a: capacitor device, 292b: capacitor device, 294: conductor, 294a: conductor, 294b: conductor, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: opening region, 500: semiconductor device, 600: semiconductor device, 601: semiconductor device, 610: cell array, 610_n: cell array, 610_1: cell array, 700: electronic component, 702: printed circuit board, 704: circuit board, 711: mold, 712: land, 713: electrode pad, 714: wire, 720: memory device, 721: driver circuit layer, 722: memory circuit layer, 730: electronic component, 731: interposer, 732: package substrate, 733: electrode, 735: semiconductor device, 901: region, 901_1A: region, 901_1B: region, 901_1C: region, 901_2A: region, 901_2B: region, 901_2C: region, 902: region, 902_1A: region, 902_1B: region, 902_1C: region, 902_2A: region, 902_2B: region, 902_2C: region, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 4000: film formation apparatus, 4002: carrying-in/out chamber, 4004: carrying-in/out chamber, 4006: transfer chamber, 4008: film formation chamber, 4009: film formation chamber, 4010: film formation chamber, 4014: transfer arm, 4020: chamber, 4021: source material supply portion, 4021a: source material supply portion, 4021b: source material supply portion, 4022a: high-speed valve, 4022b: high-speed valve, 4023: source material introduction port, 4023a: source material introduction port, 4023b: source material introduction port, 4024: source material exhaust port, 4025: evacuation unit, 4026: substrate holder, 4027: heater, 4028: plasma generation apparatus, 4029: coil, 4030: substrate, 4031: source material supply portion, 4033: source material introduction port, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device comprising:
a metal oxide comprising a first crystal, a second crystal, and a region positioned between the first crystal and the second crystal,
wherein a c-axis of the first crystal is parallel or substantially parallel to a c-axis of the second crystal,
wherein crystallinity of the region is lower than crystallinity of the first crystal and the second crystal, and
wherein a shortest distance between a side surface of the first crystal that faces the region and a side surface of the second crystal that faces the region is greater than 0 nm and less than 1.5 nm.

2. The semiconductor device according to claim 1, wherein an average of a size of the first crystal in a direction perpendicular to the c-axis of the first crystal and a size of the second crystal in a direction perpendicular to the c-axis of the second crystal is greater than or equal to 5 nm and less than or equal to 10 nm.

3. The semiconductor device according to claim 1, wherein the first crystal and the second crystal each have a layered crystal structure.

4. The semiconductor device according to claim 3, wherein the first crystal and the second crystal each have a $YbFe_2O_4$ type structure or a $Yb_2Fe_3O_7$ type structure.

5. The semiconductor device according to claim 1, wherein the metal oxide comprises indium, an element M, and zinc, and
wherein the element M is any one or more of gallium, aluminum, yttrium, and tin.

6. The semiconductor device according to claim 1, wherein the metal oxide is in a channel formation region.

7. The semiconductor device according to claim 6, wherein a channel length is greater than or equal to 2 nm and less than or equal to 30 nm.

8. A semiconductor device comprising:
a metal oxide comprising a first crystal, a second crystal, and a region positioned between the first crystal and the second crystal,
wherein a c-axis of the first crystal and a c-axis of the second crystal are perpendicular or substantially perpendicular to a top surface of a surface where the metal oxide is formed,
wherein the c-axis of the first crystal is parallel or substantially parallel to the c-axis of the second crystal,
wherein crystallinity of the region is lower than crystallinity of the first crystal and the second crystal, and
wherein a shortest distance between a side surface of the first crystal that faces the region and a side surface of the second crystal that faces the region is greater than 0 nm and less than 1.5 nm.

9. The semiconductor device according to claim 8, wherein an average of a size of the first crystal in a direction perpendicular to the c-axis of the first crystal and a size of the second crystal in a direction perpendicular to the c-axis of the second crystal is greater than or equal to 5 nm and less than or equal to 10 nm.

10. The semiconductor device according to claim 8, wherein the first crystal and the second crystal each have a layered crystal structure.

11. The semiconductor device according to claim 10, wherein the first crystal and the second crystal each have a $YbFe_2O_4$ type structure or a $Yb_2Fe_3O_7$ type structure.

12. The semiconductor device according to claim 8, wherein the metal oxide comprises indium, an element M, and zinc, and
wherein the element M is any one or more of gallium, aluminum, yttrium, and tin.

13. The semiconductor device according to claim 8, wherein the metal oxide is in a channel formation region.

14. The semiconductor device according to claim 13, wherein a channel length is greater than or equal to 2 nm and less than or equal to 30 nm.

15. A semiconductor device comprising:
a metal oxide comprising a crystal,
wherein, in a TEM image of the metal oxide obtained in a plane perpendicular to a surface where the metal oxide is formed, a first region and a second region in each of which an image corresponding to a lattice of the crystal is observed and a third region in which the image corresponding to the lattice of the crystal is not clearly observed are observed, wherein the third region is positioned between the first region and the second region, wherein a layer formed by bright spots observed in the first region is parallel or substantially parallel to a layer formed by bright spots observed in the second region, wherein a width of the third region is greater than 0 nm and less than 1.5 nm, and wherein an average of a width of the layer formed by the bright spots observed in the first region and a width of the layer formed by the bright spots observed in the second region is greater than the width of the third region.

16. The semiconductor device according to claim 15, wherein the metal oxide comprises indium, an element M, and zinc, and wherein the element M is any one or more of gallium, aluminum, yttrium, and tin.

17. The semiconductor device according to claim 15, wherein the metal oxide is in a channel formation region.

18. The semiconductor device according to claim 17, wherein a channel length is greater than or equal to 2 nm and less than or equal to 30 nm.

* * * * *